(12) United States Patent
Van Dal

(10) Patent No.: US 12,288,804 B2
(45) Date of Patent: Apr. 29, 2025

(54) TRANSISTOR AND MANUFACTURING METHOD OF THE SAME

(71) Applicant: Taiwan Semiconductor Manufacturing Company, Ltd., Hsinchu (TW)

(72) Inventor: Marcus Johannes Henricus Van Dal, Linden (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 389 days.

(21) Appl. No.: 17/832,669

(22) Filed: Jun. 5, 2022

(65) Prior Publication Data

US 2023/0395658 A1    Dec. 7, 2023

(51) Int. Cl.
| | | |
|---|---|---|
| H01L 29/06 | (2006.01) | |
| H01L 21/8234 | (2006.01) | |
| H01L 29/423 | (2006.01) | |
| H01L 29/66 | (2006.01) | |
| H01L 29/786 | (2006.01) | |

(52) U.S. Cl.
CPC .. *H01L 29/0665* (2013.01); *H01L 21/823412* (2013.01); *H01L 21/823418* (2013.01); *H01L 21/823468* (2013.01); *H01L 29/42392* (2013.01); *H01L 29/66545* (2013.01); *H01L 29/6656* (2013.01); *H01L 29/66742* (2013.01); *H01L 29/78618* (2013.01); *H01L 29/78696* (2013.01)

(58) Field of Classification Search
CPC .......... H01L 29/41775; H01L 29/7848; H01L 29/0673; H01L 29/41766; H01L 29/42392; H01L 29/66439; H01L 29/775; H01L 29/78642; H01L 29/165; H01L 29/66545; H01L 29/78696; H01L 29/0665; H01L 29/6656; H01L 29/66742; H01L 29/78618; H01L 21/8221; H01L 21/823871; H01L 21/823878; H01L 21/823412; H01L 21/823418; H01L 21/823468; H01L 27/0688; H01L 27/092; B82Y 10/00

See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

*Primary Examiner* — Peter Bradford
*Assistant Examiner* — Ryan T. Fortin
(74) *Attorney, Agent, or Firm* — JCIPRNET

(57) ABSTRACT

A transistor includes a first conductive type channel layer, a second conductive type channel layer, a gate structure, first source/drain regions and second source/drain regions. The first conductive type channel layer includes a plurality of first nanosheets. The second conductive type channel layer includes a plurality of second nanosheets stacked over the first nanosheets. The gate structure wraps around each of the first nanosheets and the second nanosheets. The first source/drain regions are disposed on opposite sides of the first nanosheets. The second source/drain regions are disposed on opposite sides of the second nanosheets and electrically isolated from the first source/drain regions.

20 Claims, 61 Drawing Sheets

(56) References Cited

U.S. PATENT DOCUMENTS

| | | | |
|---|---|---|---|
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,069,684 B1* | 7/2021 | Xie | H01L 21/823871 |
| 2020/0119015 A1* | 4/2020 | Bi | H01L 29/7851 |
| 2020/0294866 A1* | 9/2020 | Cheng | H01L 21/28088 |
| 2022/0278195 A1* | 9/2022 | Ando | H01L 29/401 |
| 2023/0056372 A1* | 2/2023 | Gardner | H01L 29/66439 |
| 2023/0084804 A1* | 3/2023 | Choi | H01L 29/41775 |
| | | | 257/192 |
| 2023/0099156 A1* | 3/2023 | Cheng | H01L 29/78696 |
| | | | 257/369 |
| 2023/0128495 A1* | 4/2023 | Fulford | H01L 29/42392 |
| | | | 257/315 |
| 2023/0178544 A1* | 6/2023 | Frougier | H01L 27/0688 |
| | | | 257/399 |
| 2023/0352529 A1* | 11/2023 | Jo | H01L 27/092 |

\* cited by examiner

TRANSISTOR AND MANUFACTURING METHOD OF THE SAME

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2F-1, FIG. 2G-1, FIG. 2H-1, FIG. 2I-1, FIG. 2J-1, FIG. 2K-1 and FIG. 2L-1 are cross-sectional views taken along cross section line I-I' in FIG. 2F, FIG. 2G, FIG. 2H, FIG. 2I, FIG. 2J, FIG. 2K and FIG. 2L. FIG. 2I-2 and FIG. 2J-2 are cross-sectional views taken along cross section line II-IF in FIG. 2I and FIG. 2J.

FIG. 3A-1, FIG. 3C-1 and FIG. 3D-1 are cross-sectional views taken along cross-sectional line I-I' in FIG. 3A, FIG. 3C and FIG. 3D. FIG. 3B-1 and FIG. 3C-2 are cross-sectional views taken along cross-sectional line II-II' in FIG. 3B and FIG. 3C.

FIG. 4C-1 and FIG. 4E-1 to FIG. 4K-1 are cross-sectional views taken along cross section line I-I' in FIG. 4C and FIG. 4E to FIG. 4K. FIG. 4E-2 to FIG. 4K-2 are cross-sectional views taken along cross section line II-II' in FIG. 4E to FIG. 4K.

DETAILED DESCRIPTION

Figure 1:
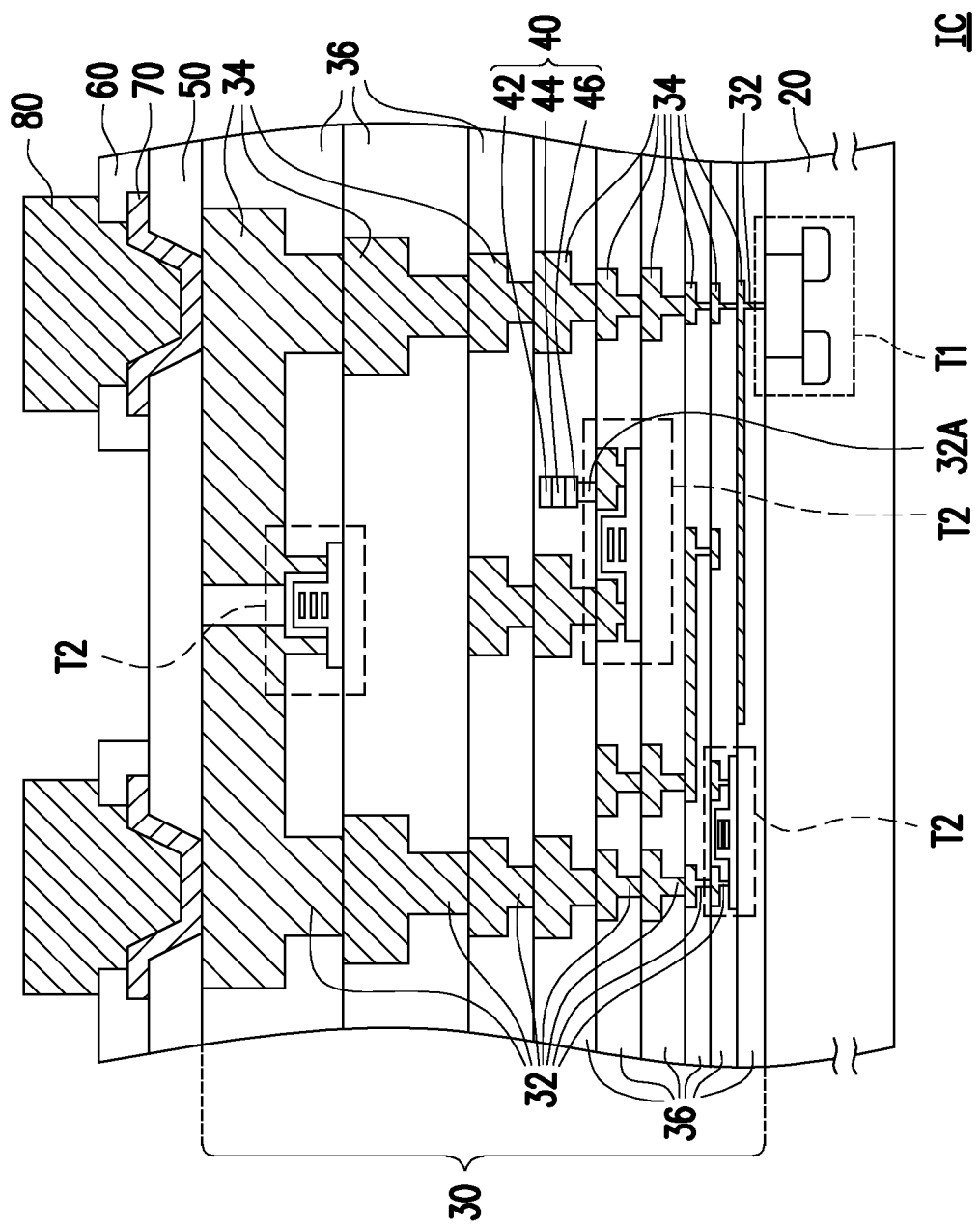
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a schematic cross-sectional view of an integrated circuit IC in accordance with some embodiments of the disclosure. In some embodiments, the integrated circuit IC includes a substrate 20, an interconnection structure 30, a passivation layer 50, a post-passivation layer 60, a plurality of conductive pads 70, and a plurality of conductive terminals 80. In some embodiments, the substrate 20 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 20 may be a bulk silicon substrate, a silicon-on-insulator (SOI) substrate, or a germanium-on-insulator (GOI) substrate.

In some embodiments, the substrate 20 includes various doped regions depending on circuit requirements (e.g., p-type semiconductor substrate or n-type semiconductor substrate). In some embodiments, the doped regions is doped with p-type or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a first transistor T1 embedded in the substrate 20. Source/drain region(s) may refer to a source or a drain, individually or collectively dependent upon the context Depending on the types of the dopants in the doped regions, the first transistor T1 may be referred to as n-type transistor or p-type transistor. In some embodiments, the first transistor T1 further includes a metal gate and a channel under the metal gate. The channel is located between the source region and the drain region to serve as a path for electron to travel when the first transistor T1 is turned on. In some embodiments, the first transistor T1 is formed using suitable Front-end-of-line (FEOL) process. Depending on the circuit requirement, the first transistor T1 may be completely embedded in the substrate 20 or partially embedded in the substrate 20. For simplicity, one first transistor T1 is shown in FIG. 1. However, it should be understood that more than one first transistors T1 may be embedded in the substrate 20 depending on the application of the integrated circuit IC. When multiple first transistors T1 are presented, these first transistors T1 may be separated by shallow trench isolation (STI; not shown) located between two adjacent first transistors T1. That is, in some embodiments, the STI are also embedded in the substrate 20.

As illustrated in FIG. 1, the interconnection structure 30 is disposed on the substrate 20. In some embodiments, the interconnection structure 30 includes a plurality of conductive vias 32, a plurality of conductive patterns 34, a plurality of dielectric layers 36, a memory cell 40, and a plurality of second transistors T2. As illustrated in FIG. 1, the conductive patterns 34 are embedded in the dielectric layers 36. On the other hand, the conductive vias 32 penetrate through the dielectric layers 36. In some embodiments, the conductive patterns 34 located at different level heights are connected to one another through the conductive vias 32. In other words, the conductive patterns 34 are electrically connected to one another through the conductive vias 32. In some embodiments, the bottommost conductive vias 32 are connected to the first transistor T1 embedded in the substrate 20. In other words, the bottommost conductive vias 32 establish electrical connection between the first transistor T1 and the conductive patterns 34 of the interconnection structure 30. As illustrated in FIG. 1, the bottommost conductive via 32 is connected to the metal gate of the first transistor T1. It should be noted that in some alternative cross-sectional views, the bottommost conductive vias 32 are also connected to source/drain regions of the first transistor T1. That is, in some embodiments, the bottommost conductive vias 32 may be referred to as "contact structures" of the first transistor T1.

In some embodiments, a material of the dielectric layers 36 includes polyimide, epoxy resin, acrylic resin, phenol resin, benzocyclobutene (BCB), polybenzooxazole (PBO), or any other suitable polymer-based dielectric material. Alternatively, the dielectric layers 36 may be formed of oxides or nitrides, such as silicon oxide, silicon nitride, or the like. The dielectric layers 36 may be formed by suitable fabrication techniques such as spin-on coating, chemical vapor deposition (CVD), plasma-enhanced chemical vapor deposition (PECVD), or the like.

In some embodiments, a material of the conductive patterns 34 and the conductive vias 32 includes aluminum, titanium, copper, nickel, tungsten, or alloys thereof. The conductive patterns 34 and the conductive vias 32 may be formed by electroplating, deposition, and/or photolithography and etching. In some embodiments, the conductive patterns 34 and the underlying conductive vias 32 are formed simultaneously. It should be noted that the number of the dielectric layers 36, the number of the conductive patterns 34, and the number of the conductive vias 32 illustrated in FIG. 1 are merely for illustrative purposes, and the disclosure is not limited thereto. In some alternative embodiments, fewer or more layers of the dielectric layers 36, the conductive patterns 34, and/or the conductive vias 32 may be formed depending on the circuit design.

As illustrated in FIG. 1, the memory cell 40 is also embedded in the interconnection structure 30. For example, the memory cell 40 is embedded in the dielectric layers 36. In some embodiments, the memory cell 40 includes a top electrode 42, a storage layer 44, and a bottom electrode 46. The storage layer 44 is sandwiched between the top electrode 42 and the bottom electrode 46. In some embodiments, the memory cell 40 is electrically connected to the underlying conductive pattern 34 through a conductive via 32A located therebetween. In some embodiments, the conductive via 32A is similar to the conductive vias 32, so the detailed descriptions thereof are omitted herein.

In some embodiments, materials of the top electrode 42 and the bottom electrode 46 are identical. However, the disclosure is not limited thereto. In some alternative embodiments, the materials of the top electrode 42 may be different from the material of the bottom electrode 46. The material of the top electrode 42 and the bottom electrode 46 includes, for example, gold, platinum, ruthenium, iridium, titanium, aluminum, copper, tantalum, tungsten, an alloy thereof, an oxide thereof, a nitride thereof, a fluoride thereof, a carbide thereof, a boride thereof, a silicide thereof, or the like.

In some embodiments, the storage layer 44 includes a single or composite film of $HfO_2$, $Hr_{1-x}Zr_xO_2$, $ZrO_2$, $TiO_2$, NiO, $TaO_x$, $Cu_2O$, $Nb_2O_5$, $Al_2O_3$, $MoO_x$, CoO, ZnO, $WO_3$, $V_2O_5$, $Fe_3O_4$, $SrZrO_3$, $SrTiO_3$, $Pr_{1-x}Ca_xMnO_3$, $La_{1-x}Ca_xMnO$, or the like. The storage layer 44 may be formed by CVD, PECVD, flowable chemical vapor deposition (FCVD), high-density-plasma chemical vapor deposition (HDP-CVD), sub-atmospheric chemical vapor deposition (SACVD), physical vapor deposition (PVD), or atomic layer deposition (ALD). Since the storage layer 44 has a variable resistance, the storage layer 44 may be utilized to store data.

In some embodiments, the second transistors T2 are also embedded in the interconnection structure 30. For example, the second transistors T2 are embedded in the dielectric layers 36. As illustrated in FIG. 1, the conductive via 32A directly contacting the memory cell 40 is connected to one of the second transistors T2. In other words, the memory cell 40 is electrically connected to at least one of the second transistors T2. The formation method and the structure of the second transistors T2 will be described in detail later. In some embodiments, the second transistor T2 and the memory cell 40 are collectively referred to as a memory device. For example, the second transistor T2 may sever as a selector for the memory device. It should be noted that the memory device illustrated in FIG. 1 may be referred to as Resistive Random Access Memory (RRAM) device. However, the disclosure is not limited thereto. In some alternative embodiments, the memory cell 40 may be replaced with other types of memory cell to render Dynamic Random Access Memory (DRAM) device, Static Random Access Memory (SRAM) device, Magnetoresistive Random Access Memory (MRAM), or the like.

As illustrated in FIG. 1, the passivation layer 50, the conductive pads 70, the post-passivation layer 60, and the conductive terminals 80 are sequentially formed on the interconnection structure 30. In some embodiments, the passivation layer 50 is disposed on the topmost dielectric layer 36 and the topmost conductive patterns 34. In some embodiments, the passivation layer 50 has a plurality of openings partially exposing each topmost conductive pattern 34. In some embodiments, the passivation layer 50 is a silicon oxide layer, a silicon nitride layer, a silicon oxynitride layer, or a dielectric layer formed by other suitable dielectric materials. The passivation layer 50 may be formed by suitable fabrication techniques such as HDP-CVD, PECVD, or the like.

In some embodiments, the conductive pads 70 are formed over the passivation layer 50. In some embodiments, the conductive pads 70 extend into the openings of the passivation layer to be in direct contact with the topmost conductive patterns 34. That is, the conductive pads 70 are electrically connected to the interconnection structure 30. In some embodiments, the conductive pads 70 include aluminum pads, copper pads, titanium pads, nickel pads, tungsten pads, or other suitable metal pads. The conductive pads 70 may be formed by, for example, electroplating, deposition, and/or photolithography and etching. It should be noted that the number and the shape of the conductive pads 70 illustrated in FIG. 1 are merely for illustrative purposes, and the disclosure is not limited thereto. In some alternative embodiments, the number and the shape of the conductive pad 70 may be adjusted based on demand.

In some embodiments, the post-passivation layer 60 is formed over the passivation layer and the conductive pads 70. In some embodiments, the post-passivation layer 60 is formed on the conductive pads 70 to protect the conductive pads 70. In some embodiments, the post-passivation layer 60 has a plurality of contact openings partially exposing each conductive pad 70. The post-passivation layer 60 may be a polyimide layer, a PBO layer, or a dielectric layer formed by other suitable polymers. In some embodiments, the post-passivation layer 60 is formed by suitable fabrication techniques such as HDP-CVD, PECVD, or the like.

As illustrated in FIG. 1, the conductive terminals 80 are formed over the post-passivation layer 60 and the conductive pads 70. In some embodiments, the conductive terminals 80 extend into the contact openings of the post-passivation layer 60 to be in direct contact with the corresponding conductive pad 70. That is, the conductive terminals 80 are electrically connected to the interconnection structure 30 through the conductive pads 70. In some embodiments, the conductive terminals 80 are conductive pillars, conductive posts, conductive balls, conductive bumps, or the like. In some embodiments, a material of the conductive terminals 80 includes a variety of metals, metal alloys, or metals and mixture of other materials. For example, the conductive terminals 80 may be made of aluminum, titanium, copper, nickel, tungsten, tin, and/or alloys thereof. The conductive terminals 80 are formed by, for example, deposition, electroplating, screen printing, or other suitable methods. In some embodiments, the conductive terminals 80 are used to establish electrical connection with other components (not shown) subsequently formed or provided.

As mentioned above, the second transistors T2 are embedded in the interconnection structure 30, and at least one of the second transistors T2 is electrically connected to the memory cell 40. In some embodiments, the second transistors T2 are complementary thin film transistors (TFT). Taking the second transistor T2 located directly underneath the memory cell 40 as an example, the formation method and the structure of this second transistor T2 will be described below in conjunction with FIG. 2A to FIG. 2L.

Figure 2A:
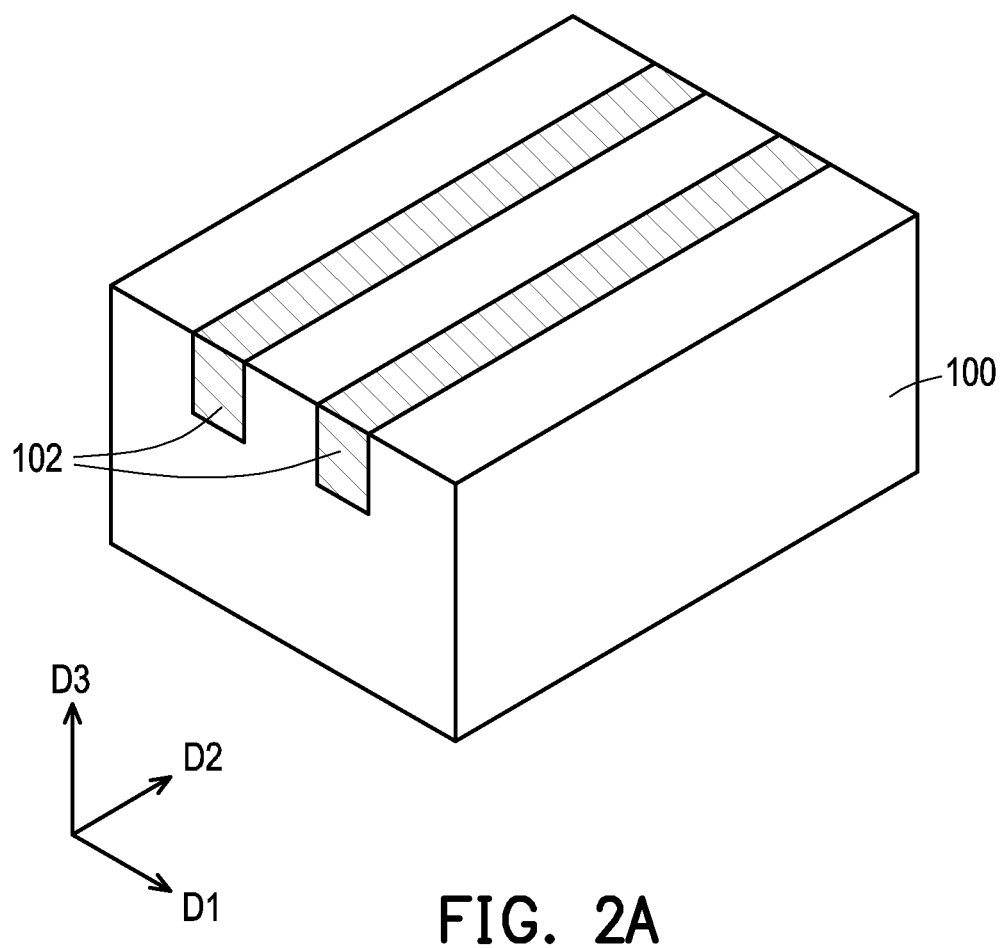
FIG. 2A to FIG. 2L are three dimensional views illustrating various stages of a manufacturing method of a transistor.
Figure 2B:
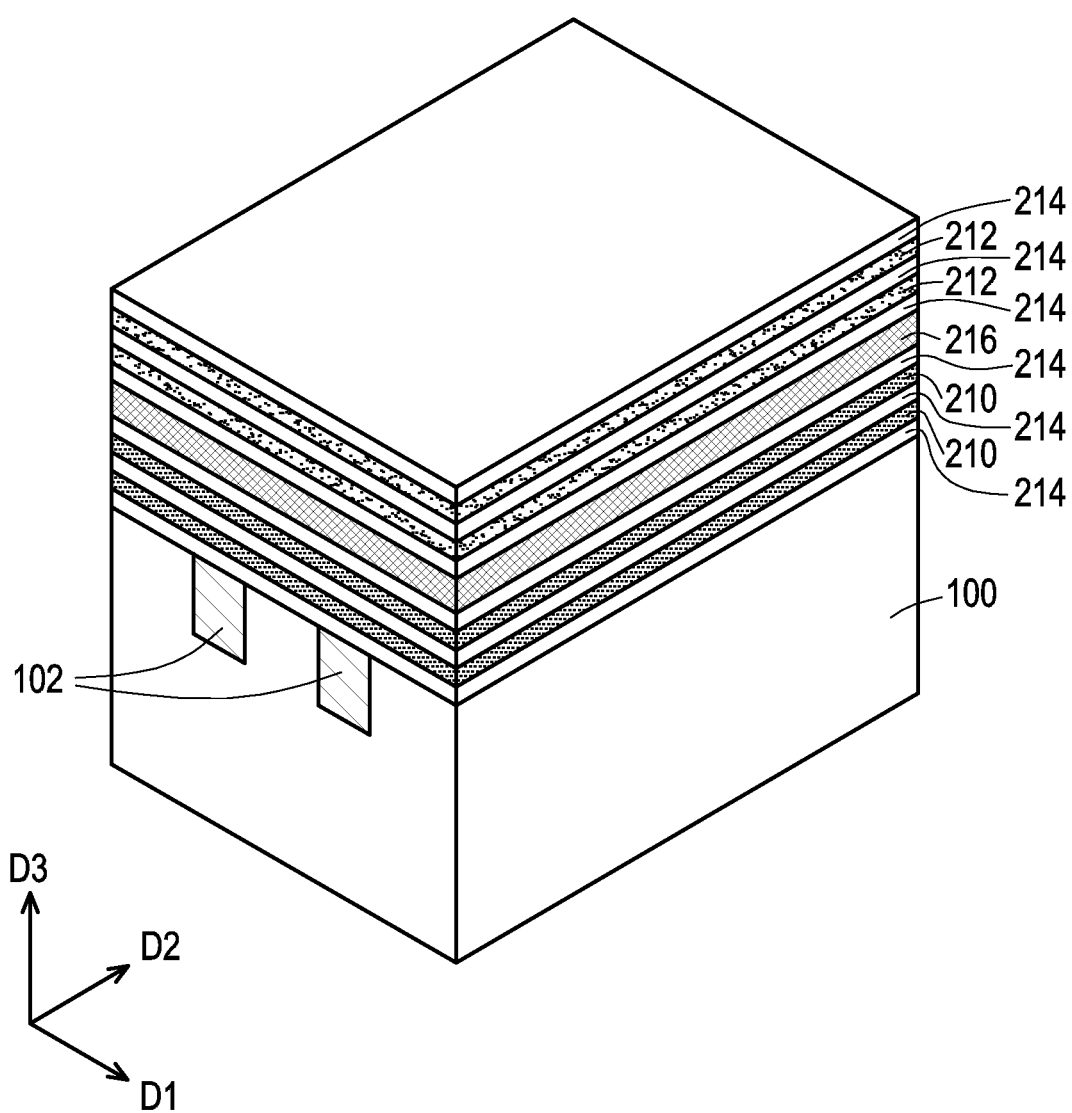
Figure 2C:
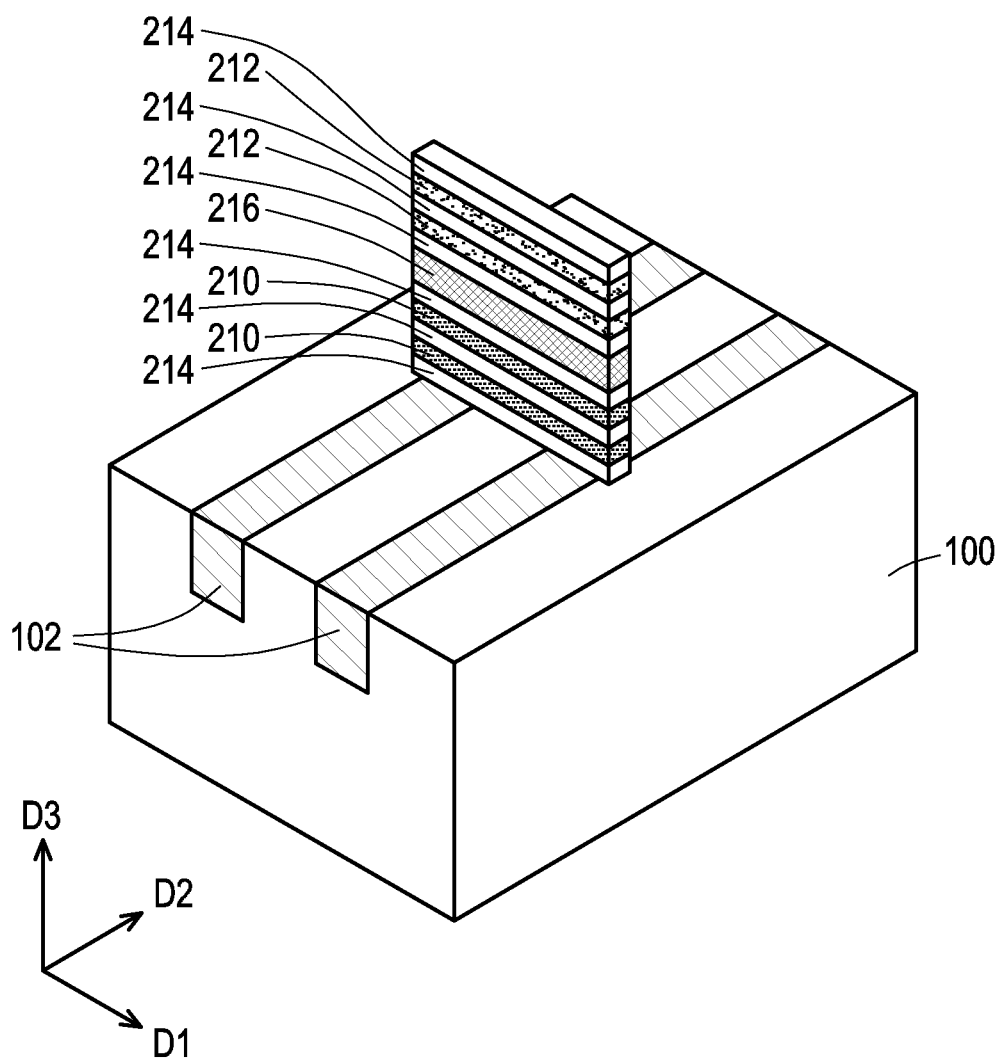
Figure 2D:
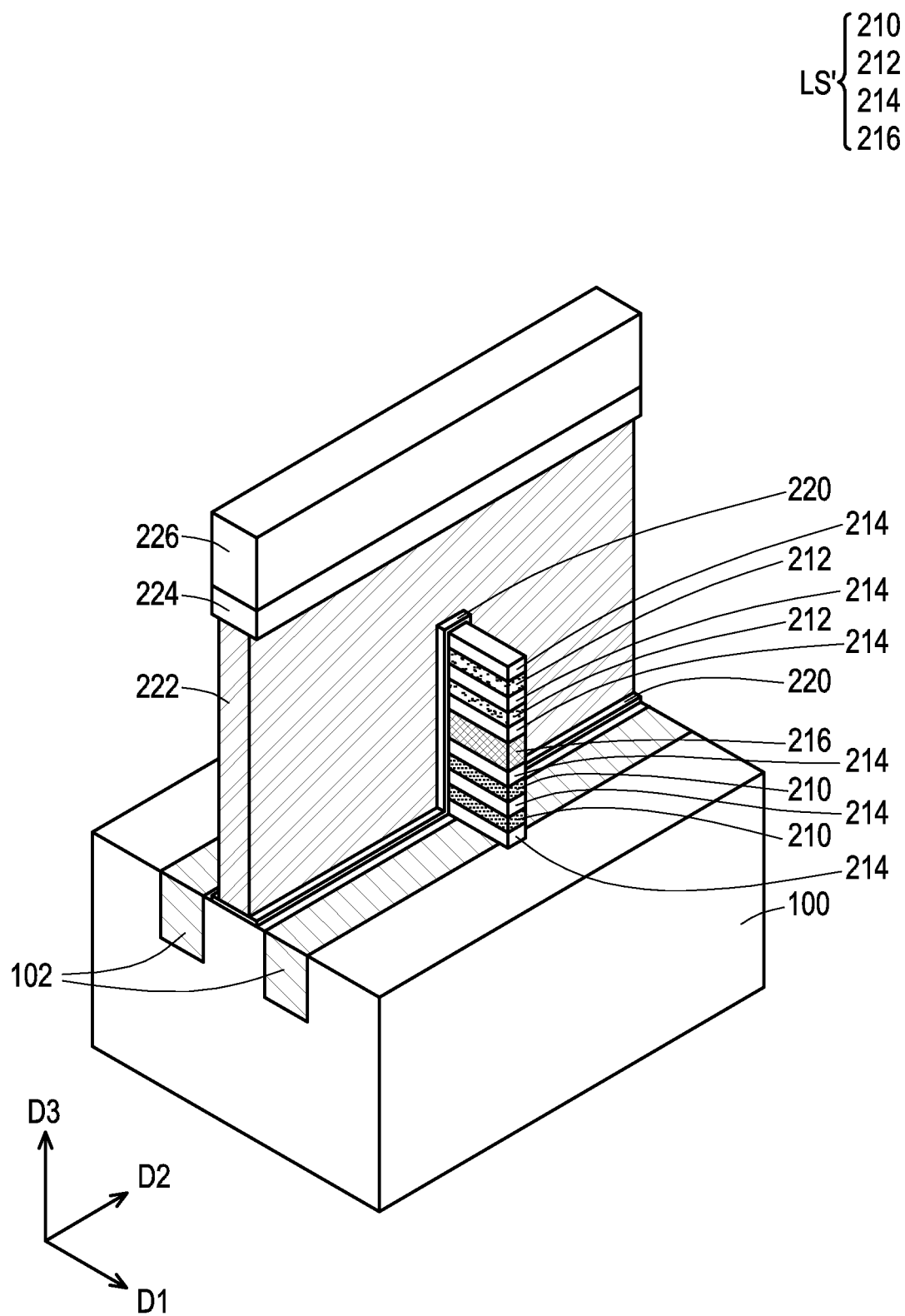
Figure 2E:
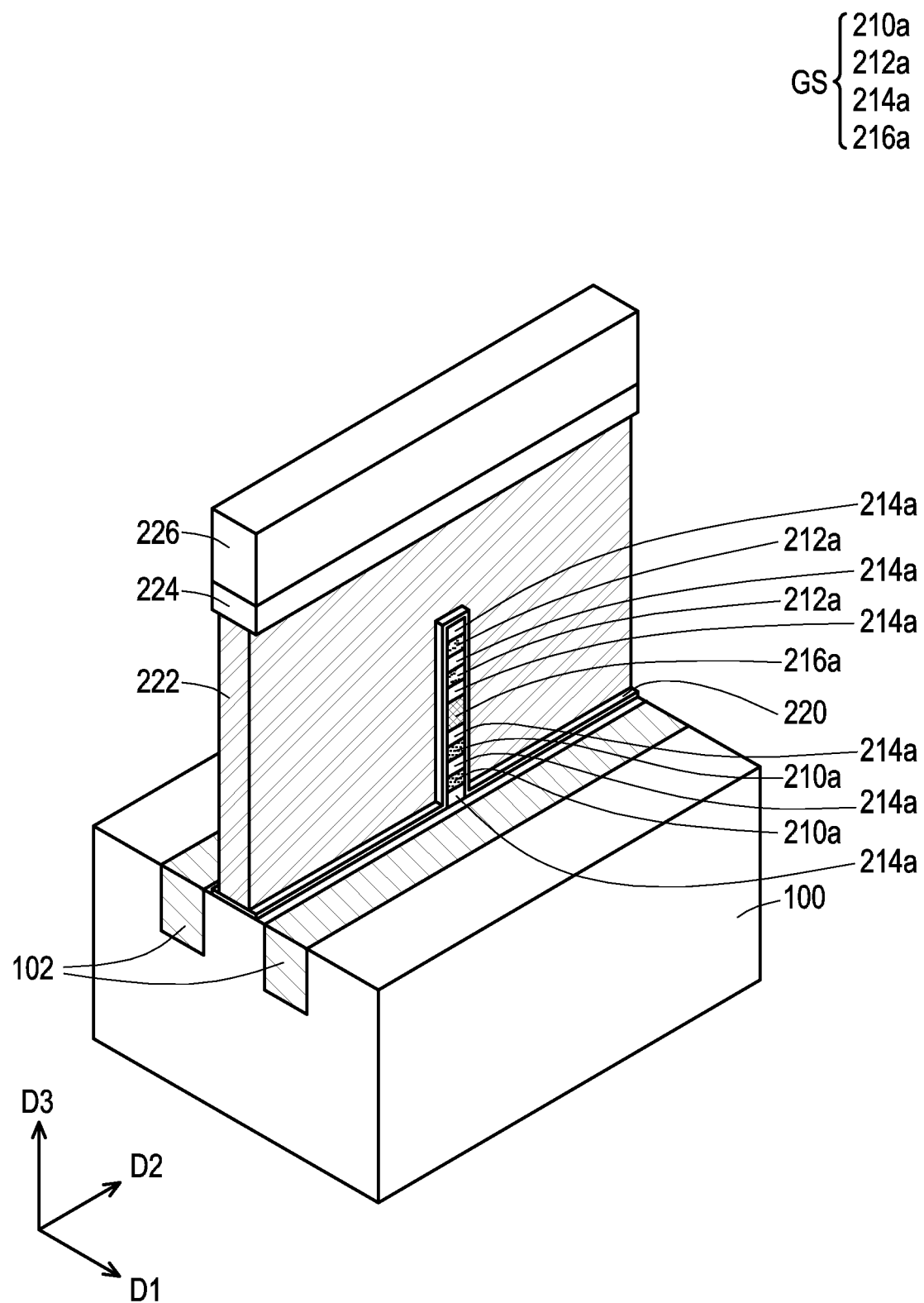
Figure 2F:
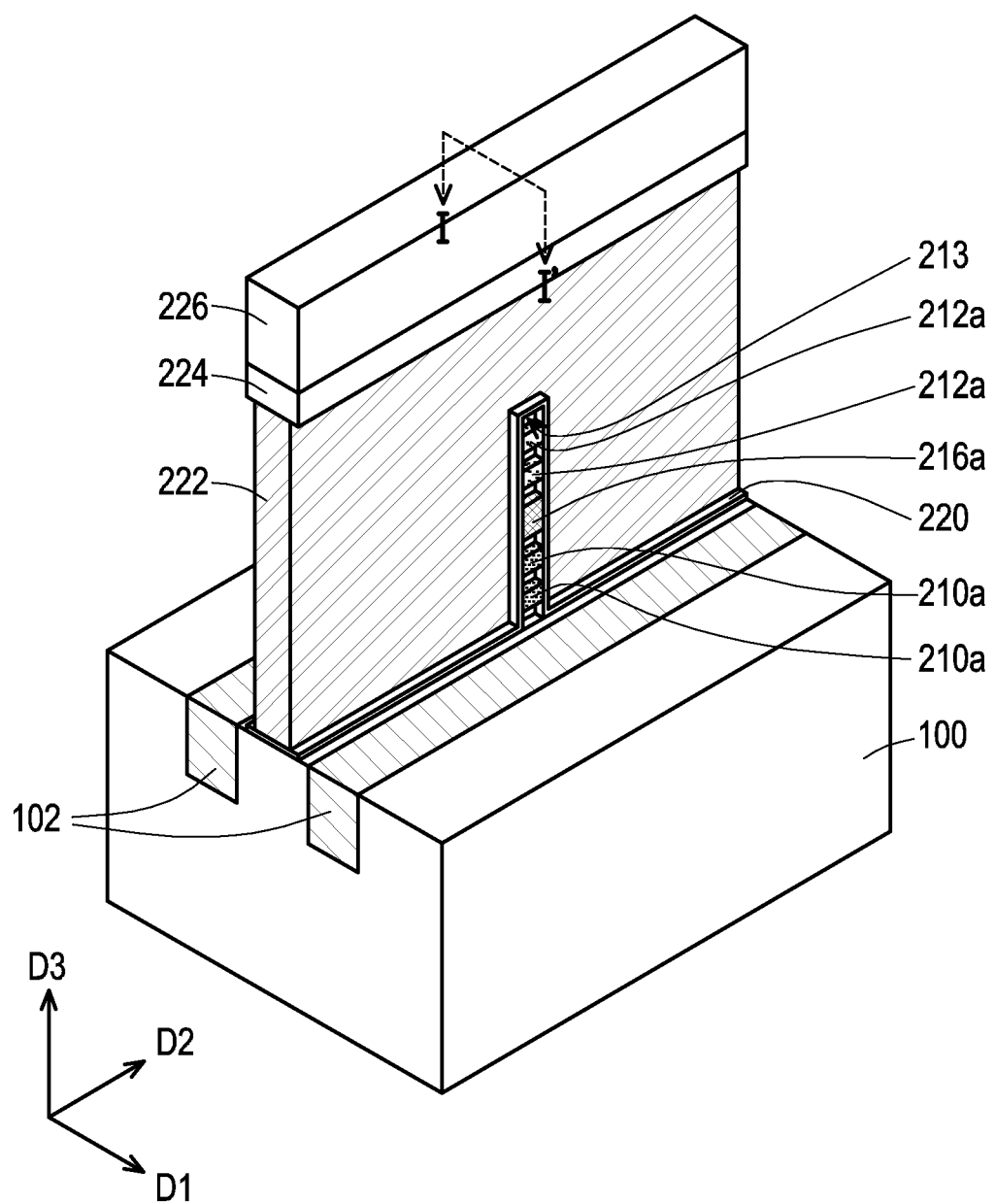
Figures 1, 2F:
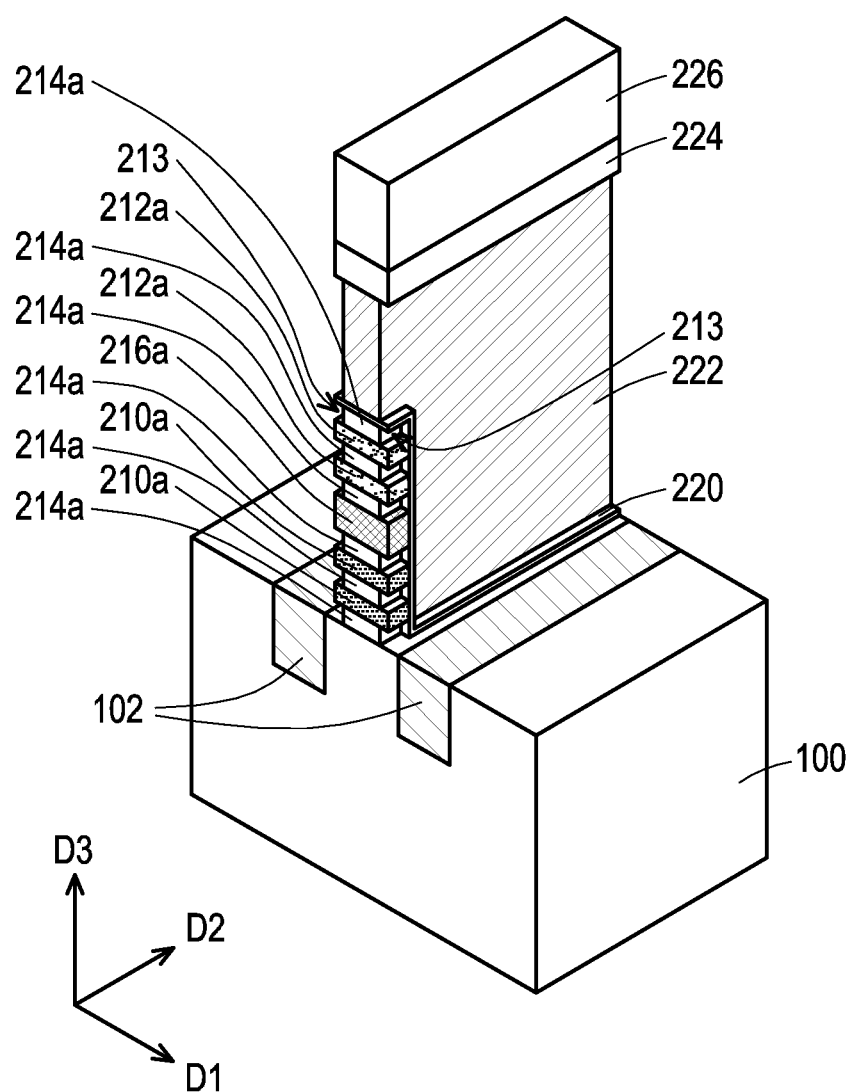
Figure 2G:
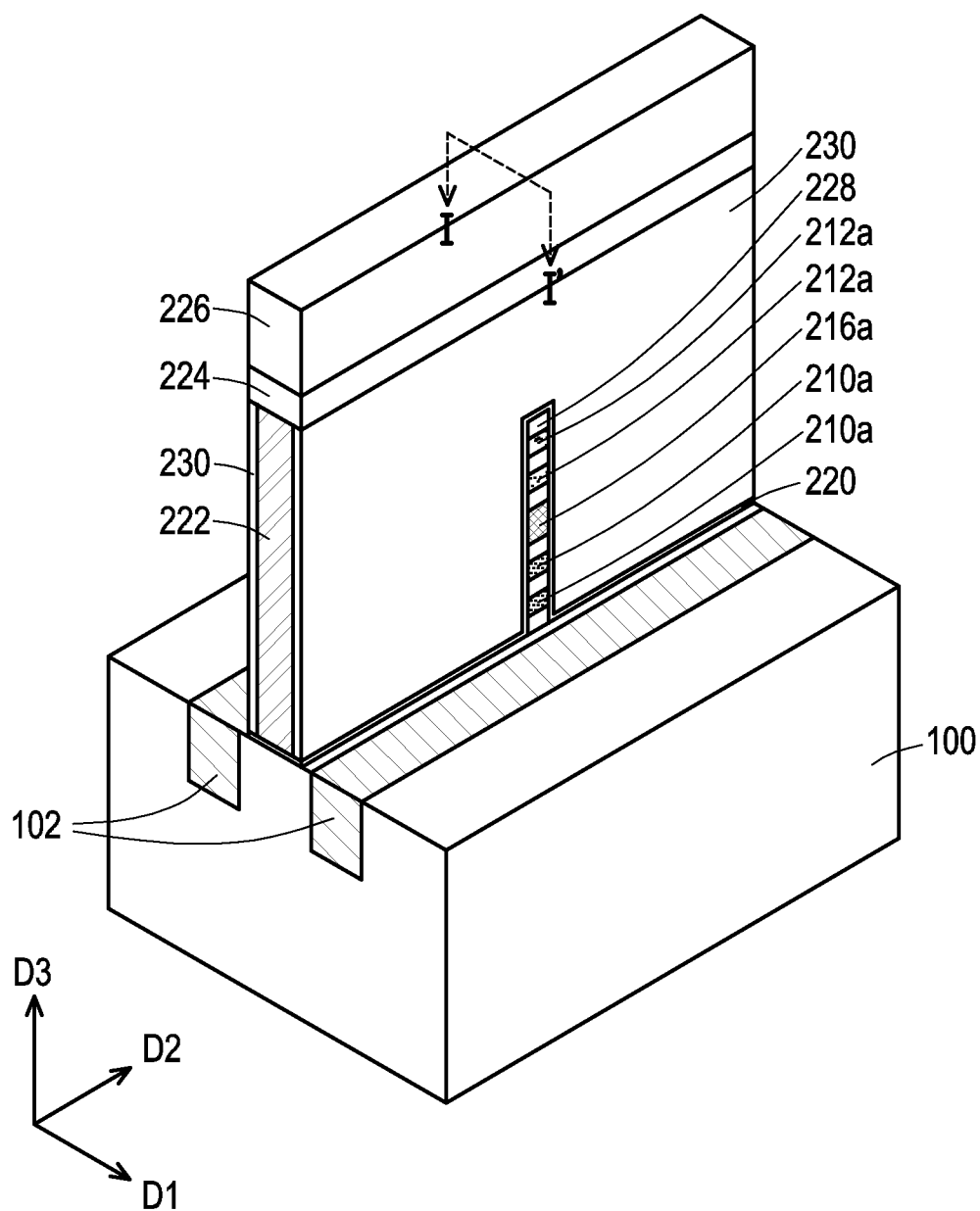
Figures 1, 2G:
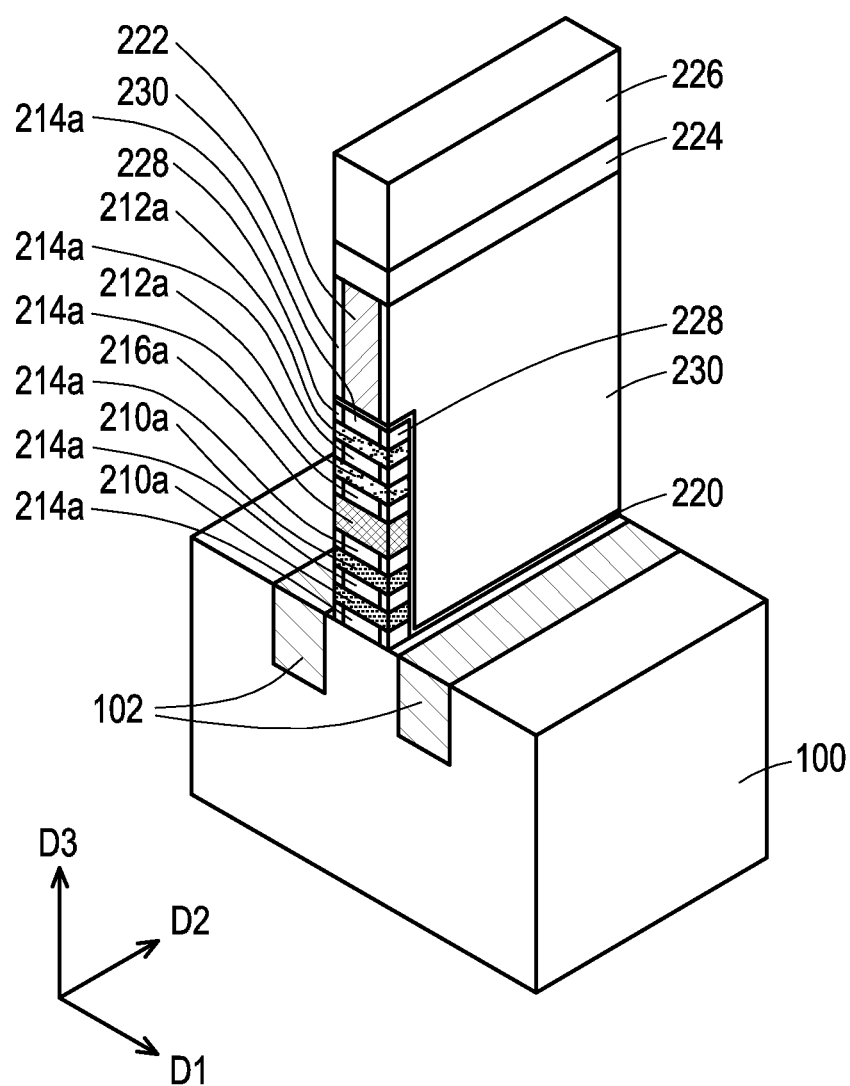
Figure 2H:
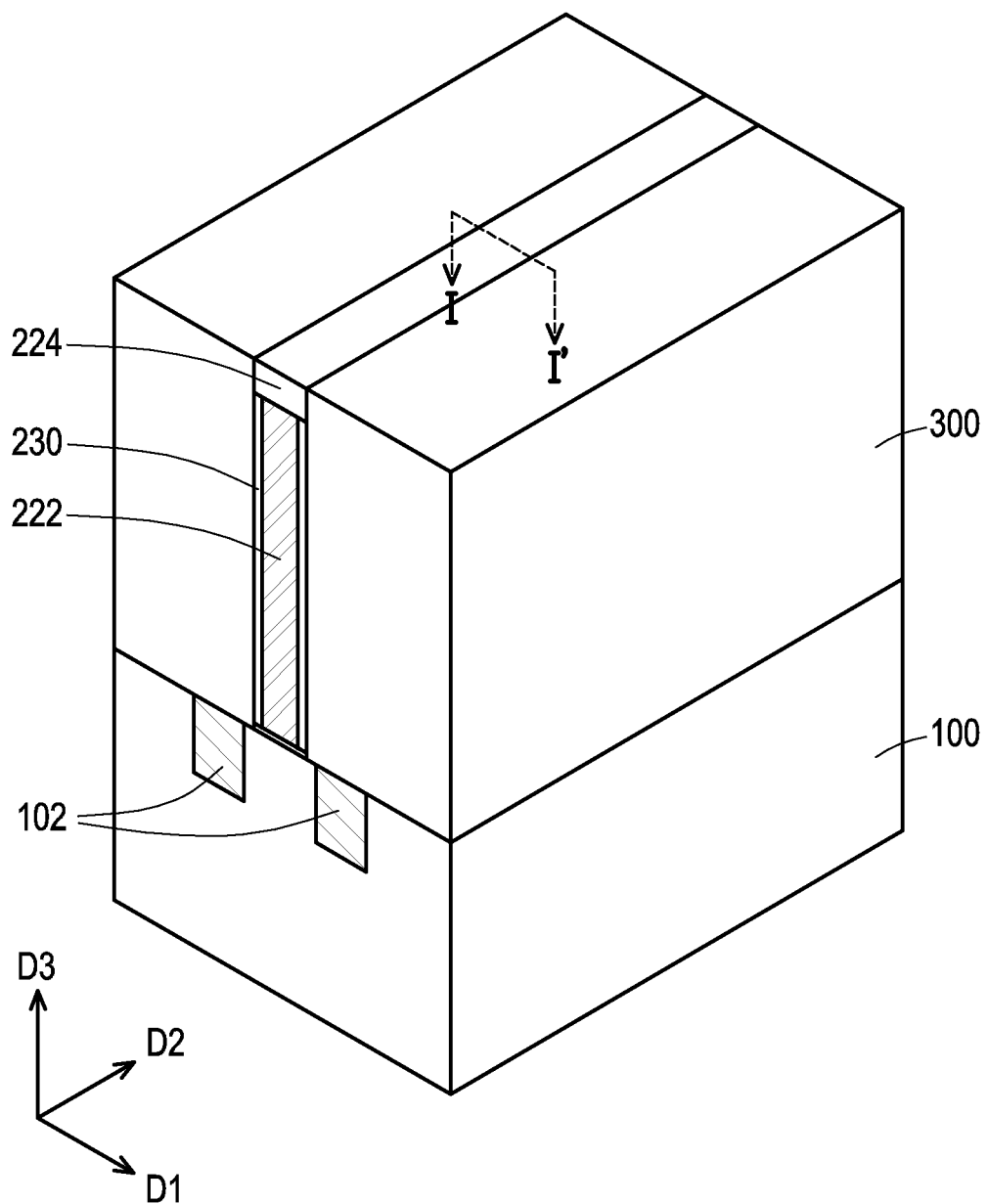
Figures 1, 2H:
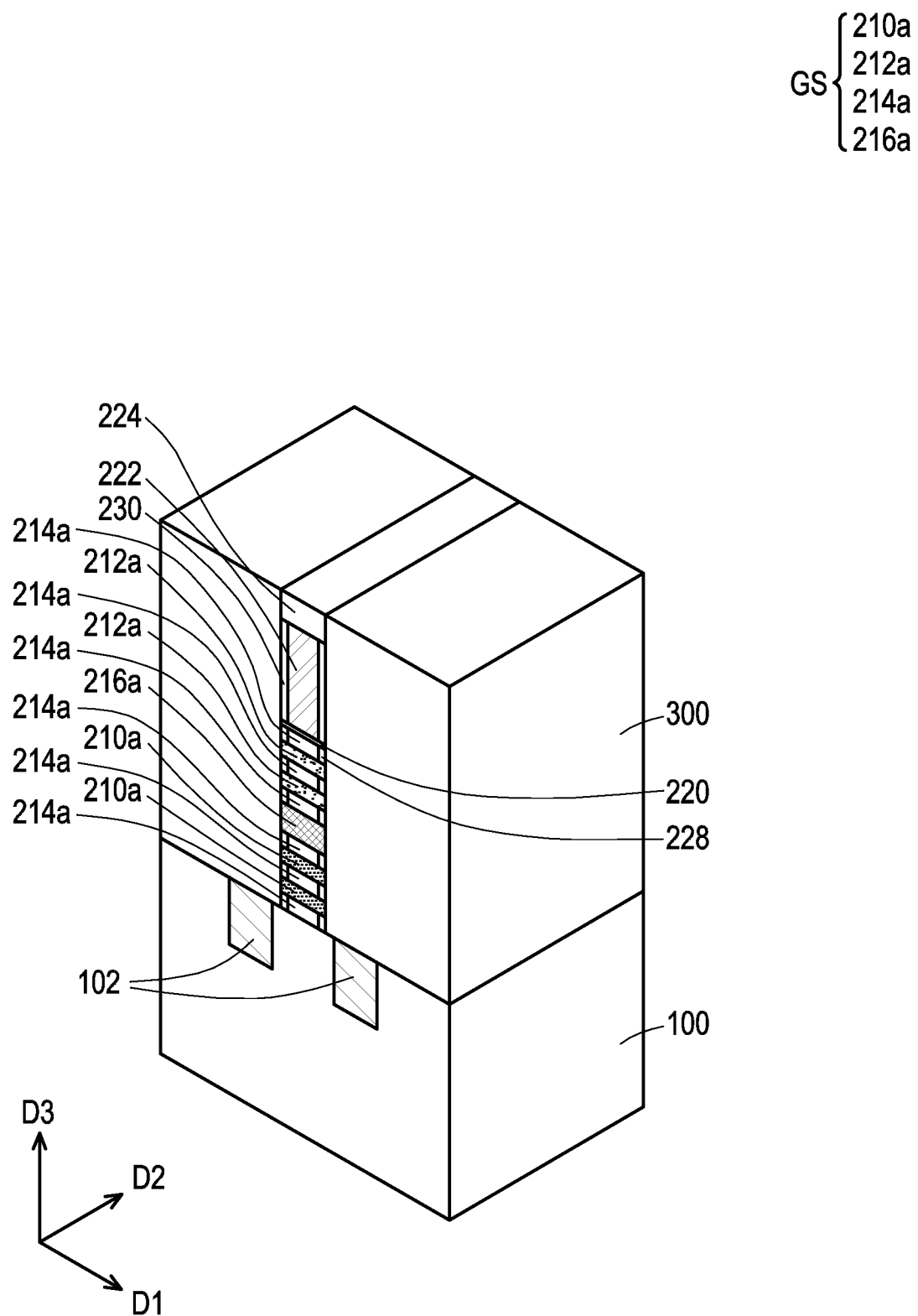
Figure 2I:
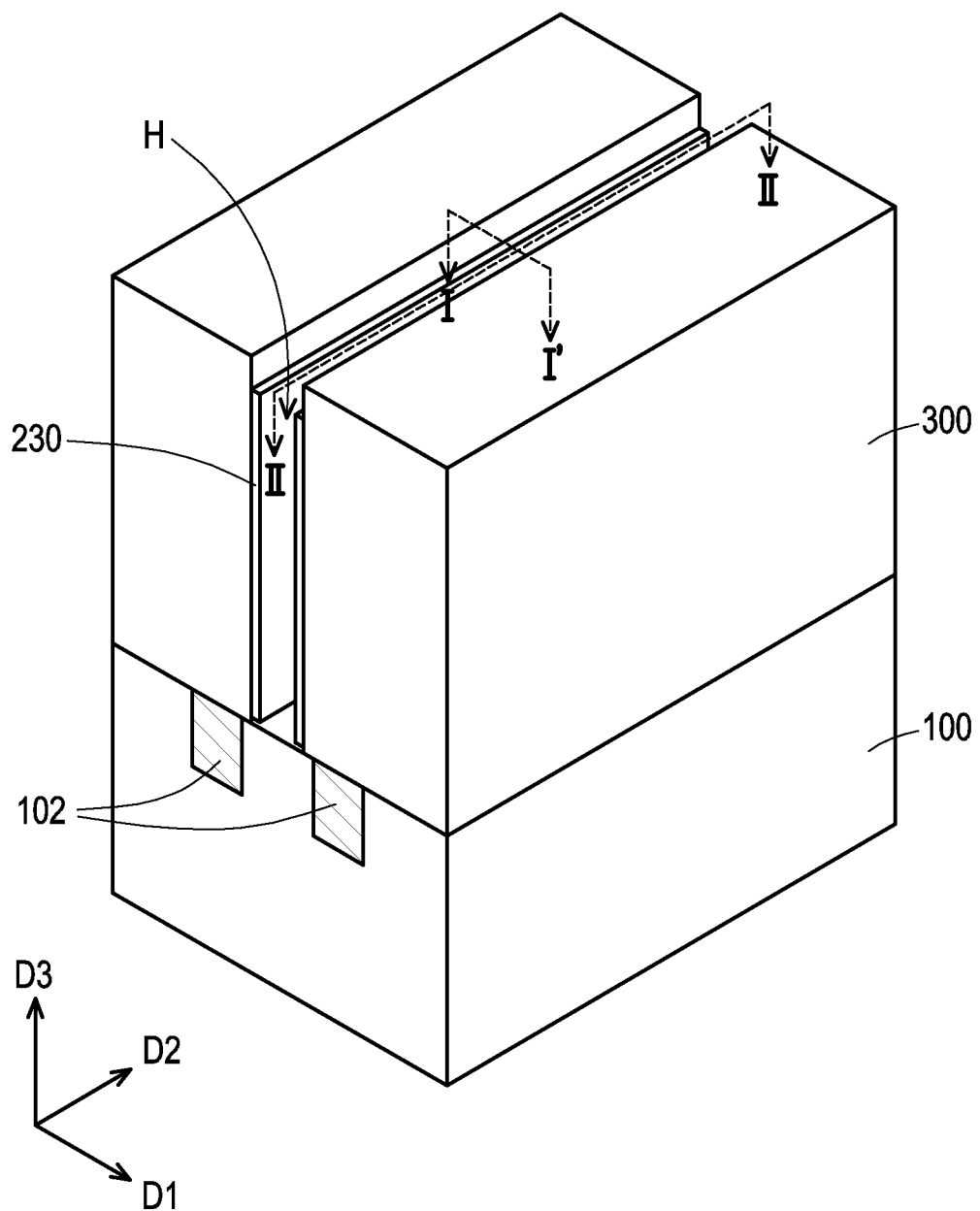
Figures 1, 2I:
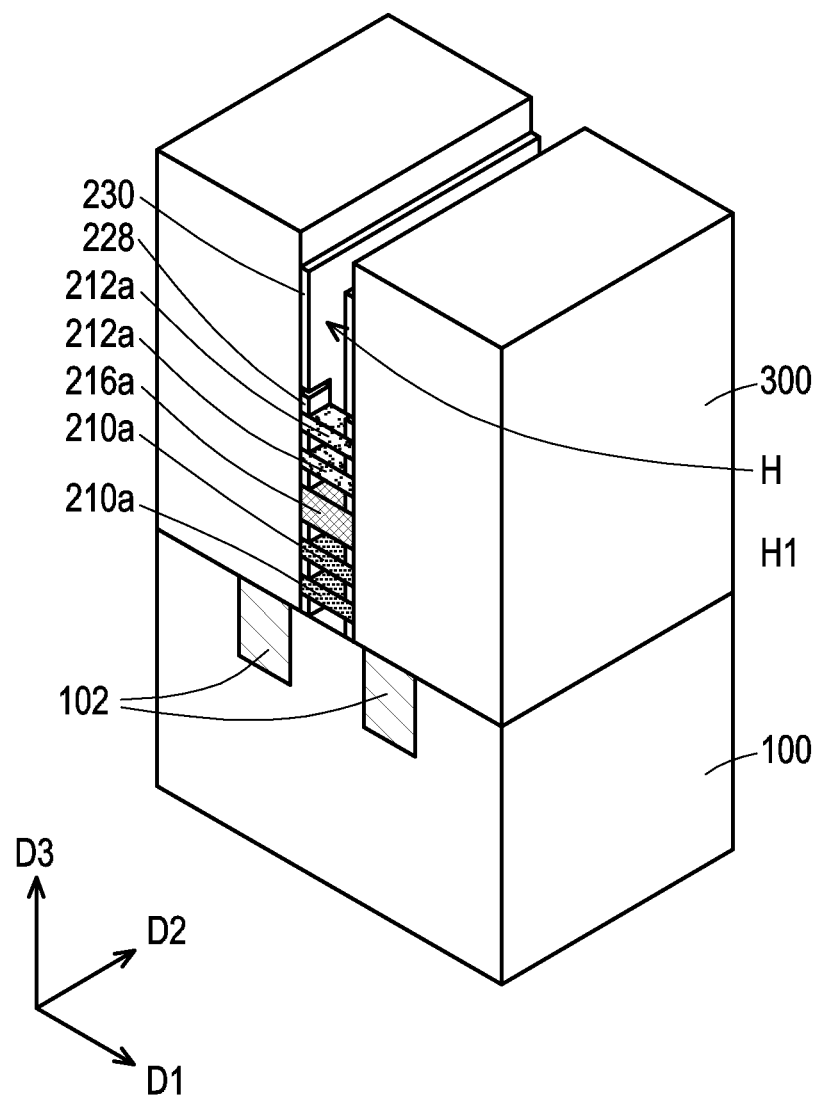
Figures 2, 2I:
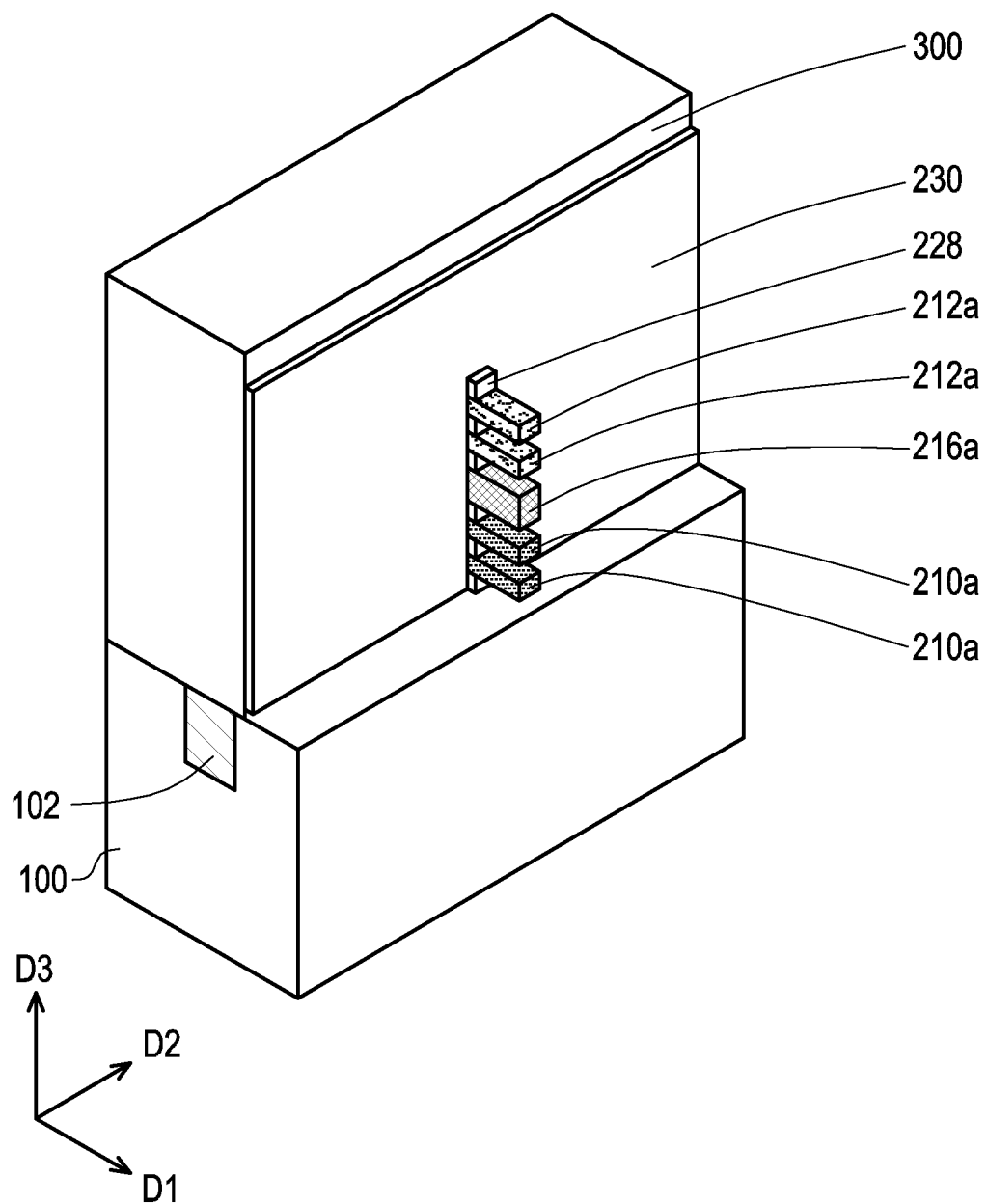
Figure 2J:
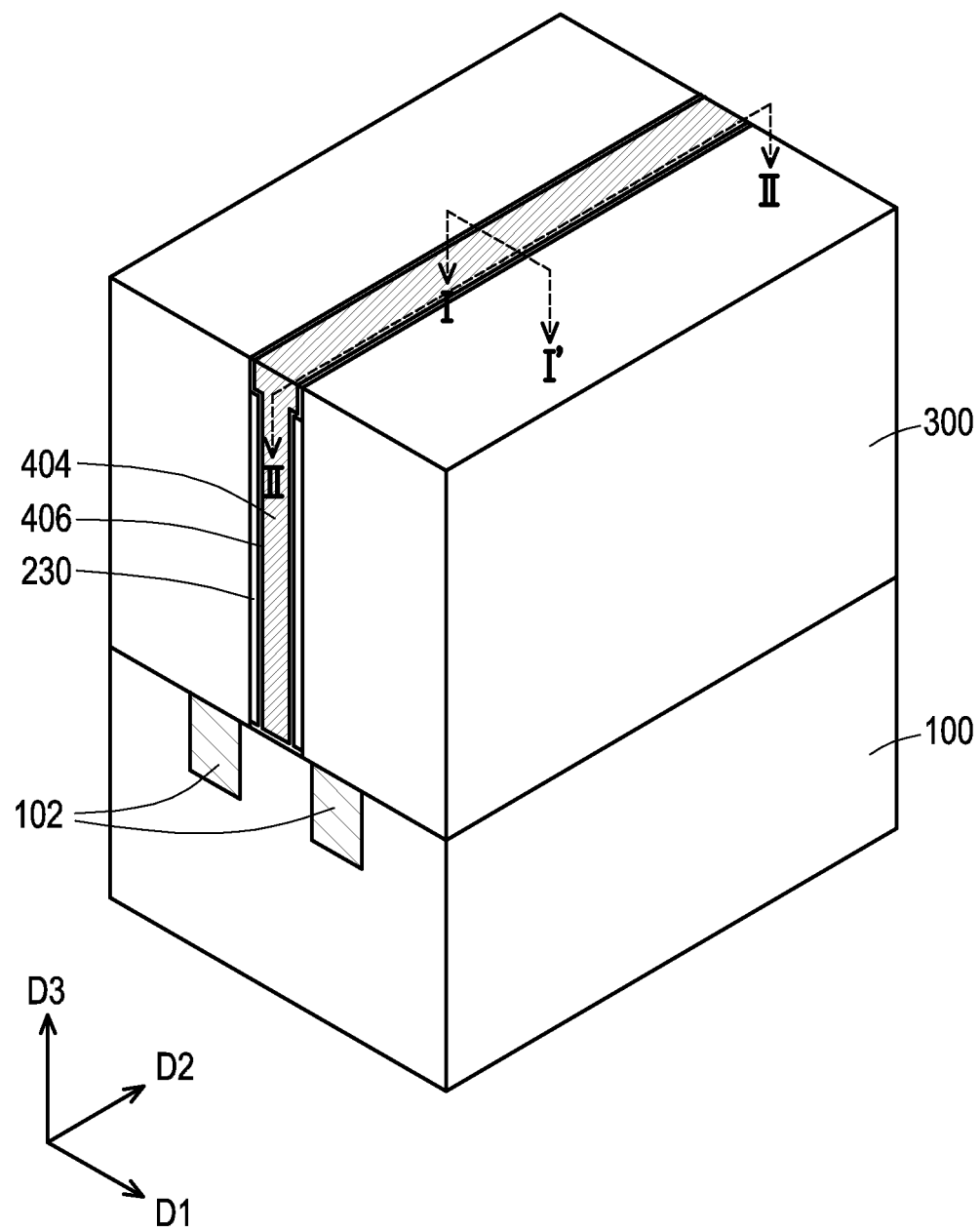
Figures 1, 2J:
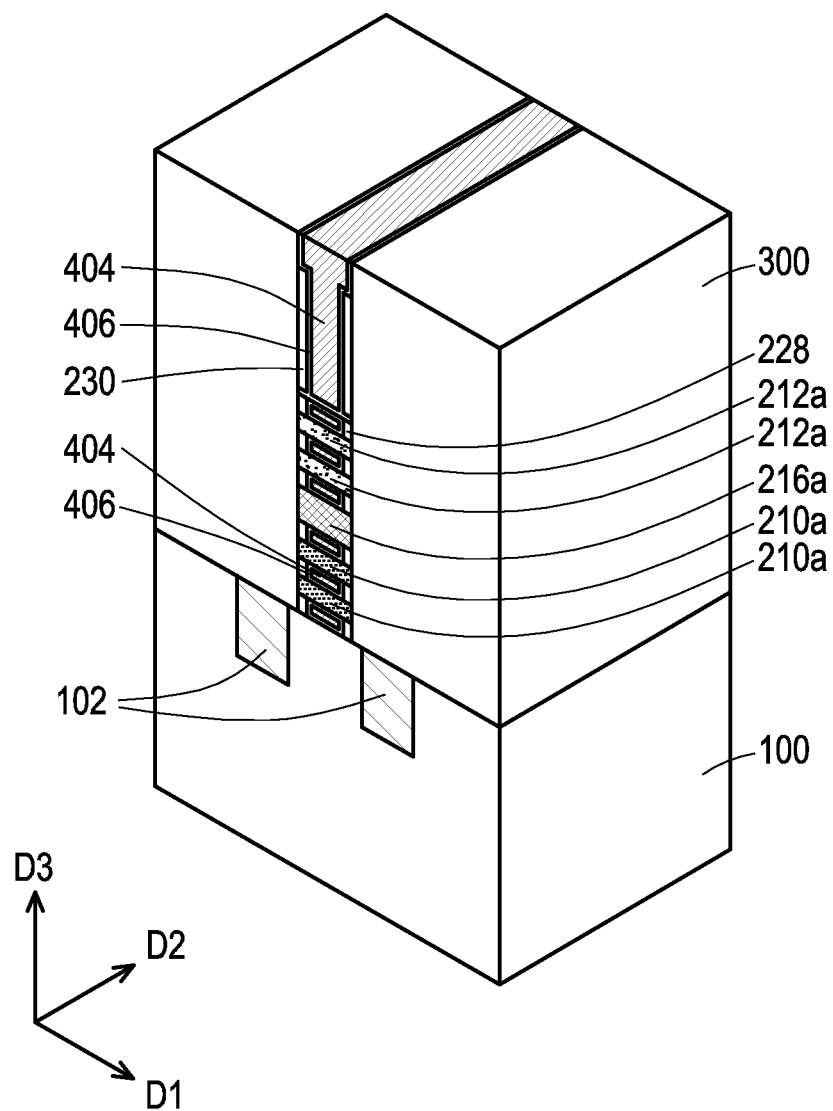
Figures 2, 2J:
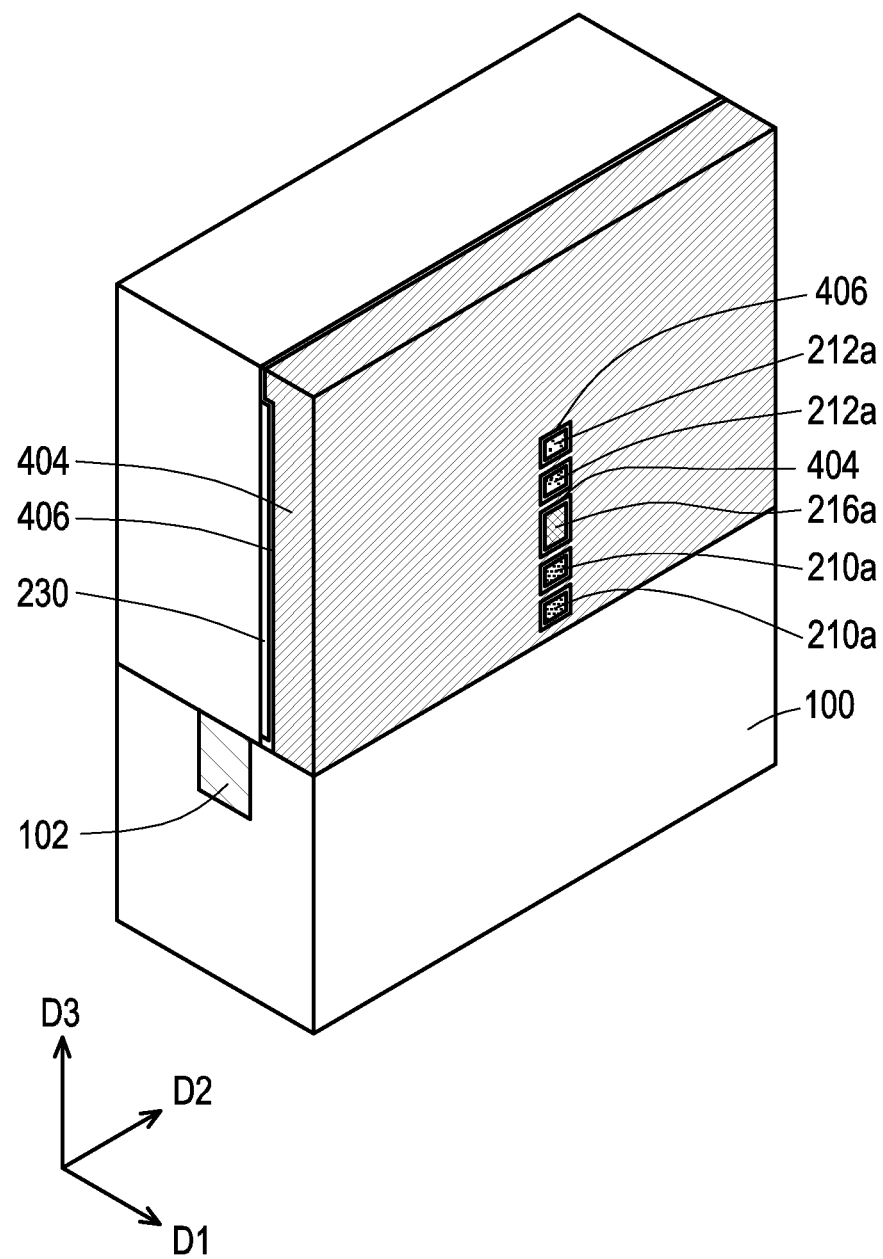

FIG. 2A to FIG. 2L are three dimensional views illustrating various stages of a manufacturing method of a transistor. FIG. 2F-1, FIG. 2G-1, FIG. 2H-1, FIG. 2I-1, FIG. 2J-1, FIG. 2K-1 and FIG. 2L-1 are cross-sectional views taken along cross section line I-I' in FIG. 2F, FIG. 2G, FIG. 2H, FIG. 2I, FIG. 2J, FIG. 2K and FIG. 2L. FIG. 2I-2 and FIG. 2J-2 are cross-sectional views taken along cross section line II-II' in FIG. 2I and FIG. 2J.

Referring to FIG. 2A, a dielectric layer 100 is provided. In some embodiments, the dielectric layer 100 is one of the dielectric layers 36 of the interconnection structure 30 of FIG. 1, so the detailed description thereof is omitted herein. In some embodiments, a plurality of contacts 102 are formed in the dielectric layer 100. The contacts 102 may be formed by patterning a conductive material over the dielectric layer 100 through a lithography process and an etching process. For example, a conductive material and a patterned resist layer are sequentially formed on the dielectric layer 100, and the conductive material is patterned by using the patterned resist layer as a mask. Then, a dielectric material may be formed to cover the patterned conductive material. After that, the dielectric material and the patterned conductive material may be partially removed by a planarization process such as a mechanical grinding process, a chemical mechanical polishing (CMP) process, or the like, so as to remove the dielectric material completely and form the contacts 102. In some embodiments, the contacts 102 may be line-shaped. In some embodiments, the bottom contacts 102 are arranged along a first direction D1 (e.g., X direction), and the bottom contact 102 is extended along a second direction D2 (e.g., Y direction) substantially perpendicular to the first direction D1. The first direction D1 and the second direction D2 may be substantially parallel to a surface (e.g., upper surface) of the substrate 20 of FIG. 1, respectively. It should be noted that the number and the shape of the contacts 102 illustrated in FIG. 2A are merely for illustrative purposes, and the disclosure is not limited thereto. In some alternative embodiments, the number and the shape of the contacts 102 may be adjusted based on demand. In addition, in some alternative embodiments, the contacts 102 are omitted.

Referring to FIG. 2B, a stack LS is formed on the dielectric layer 100. In some embodiments, the stack LS includes a plurality of first material layers 210, a plurality of second material layers 212, a plurality of third material layers 214 and a fourth material layer 216. The first material layers 210 and the third material layers 214 are alternately stacked on one another below the fourth material layer 216, and the second material layers 212 and the third material layers 214 are alternately stacked on one another over the fourth material layer 216. For example, the first material layer 210 is sandwiched between two adjacent third material layers 214, and the third material layer 210 is sandwiched between two adjacent third material layers 214. In some embodiments, the first material layers 210 and the third material layers 214 are alternately stacked in a third direction D3 (e.g., Z direction) substantially perpendicular to the first direction D1 and the second direction D2. Similarly, the second material layers 212 and the third material layers 214 are alternately stacked in the third direction D3. The third direction D3 may be substantially vertical to a surface (e.g., upper surface) of the substrate 20 of FIG. 1. The third direction D3 is a vertical direction, for example. In some embodiments, the third material layers 214 are also referred to as sacrificial layers.

In some embodiments, the first material layers 210 are made of a first conductive type oxide semiconductor material, and the second material layers 212 are made of a second conductive type oxide semiconductor material. The first conductive type and the second conductive type are opposite to each other. For example, the first conductive type is p-type, and the second conductive type is n-type, and vice versa. In some embodiments, the material of the first material layers 210 includes SnO, Ni(Sn)O, $Cu_2O$, $CuFeO_2$, $Cu_{15}Fe_3O_2$, or a combination thereof, and the material of the second material layers 212 includes IGZO, ITO, IAZO, IWO, IZO, or a combination thereof. In some embodiments, the first material layers 210 and the second material layers 212 are respectively made of a single layer having one of the foregoing materials. However, the disclosure is not limited thereto. In some alternative embodiments, the first material layers 210 and the second material layers 212 may be made of a laminate structure of at least two of the foregoing materials. In some embodiments, the first material layer 210 is doped with a first conductive type dopant and the second material layer 212 is doped with a second conductive type dopant. For example, the first material layer 210 is doped with p-type dopants, such as boron, $BF_2$ or a combination thereof, and the second material layer 212 is doped with n-type dopants, such as phosphorus, arsenic or a combination thereof.

In some embodiments, a material of the third material layers 214 is not particularly limited, as long as said material renders good etching selectivity between the first material layer 210 and the third material layers 214 and between the second material layers 212 and the third material layers 214. For example, the third material layer 214 may be made of a conductive material, a semiconductor material, or a dielectric material. Examples of the conductive material includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. Examples of the semiconductor material includes elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. Examples of the dielectric material includes polyimide, epoxy resin, acrylic resin, phenol resin, BCB, PBO, silicon oxide, silicon nitride, or any other suitable polymer-based dielectric material.

In some embodiments, an etching selectivity between the first material layer 210 and the third material layer 214 and between the second material layer 212 and the third material layer 214 is high. For example, the etching selectivity between the first material layer 210 and the third material layer 214 and between the second material layer 212 and the third material layer 214 ranges between 1:10 and 1:10000. Herein, the etching selectivity is denoted by a ratio between an etch rate of the first material layer 210 and the third material layer 214 and a ratio between an etch rate of the second material layer 212 and the third material layer 214.

In some embodiments, a barrier layer (not shown) is optionally formed between the first material layer 210 and the third material layer 214, so as to avoid diffusion of atoms between elements. In some embodiments, materials of the barrier layer include titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof.

In some embodiments, a material of the fourth material layer 216 includes silicon oxide such as high temperature oxide (HTO), silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some alternative embodiments, the fourth material layer 216 may be omitted.

In some embodiments, the first material layer 210, the second material layer 212, the third material layer 214 and the fourth material layer 216 are deposited on the dielectric layer 100 through ALD, CVD, PVD, or the like. As illustrated in FIG. 2B, the third material layers 214 and the first material layers 210 are alternately deposited on the dielectric layer 100, and then the third material layer 214 and the fourth material layer 216 are sequentially deposited. After that, the third material layers 214 and the second material layers 212 are alternately deposited, so as to form the stack LS. In such embodiments, the fourth material layer 216 is sandwiched between two adjacent third material layers 214.

Referring to FIG. 2C, the stack LS is patterned, to form a stack LS'. For example, a portion of the stack LS is removed to expose the underlying dielectric layer 100. In some embodiments, the stack LS is patterned through a lithography process and an etching process by using a mask. The lithography process includes, for example, photoresist coating, soft baking, exposing, post-exposure baking (PEB), developing, and hard baking. The etching process includes, for example, an anisotropic etching process such as dry etch or an isotropic etching process such as wet etch. In some embodiments, after patterning, the stack LS' covers portions of the contacts 102. In some embodiments, the stack LS' is extended along the first direction D1. In other words, an extending direction (e.g., the first direction D1) of the stack LS' is substantially perpendicular to an extending direction (e.g., the second direction D2) of the contacts 102. However, the disclosure is not limited thereto.

Referring to FIG. 2D, a patterned mask layer 224, a dummy gate dielectric layer 220 and a dummy gate 222 are sequentially formed on the stack LS'. In some embodiments, a dummy gate dielectric material (not shown), a dummy gate material (not shown) and a mask material (not shown) are sequentially formed over the stack LS'. The dummy gate dielectric material is conformally formed on the exposed surfaces of the dielectric layer 100 and the stack LS', and the dummy gate material is conformally formed on the exposed surfaces of the dummy gate dielectric material, for example. Then, the mask material is patterned by using a patterned resist layer 226 as a mask to form the patterned mask layer 224. In some embodiments, as shown in FIG. 2D, the patterned mask layer 224 crosses over a portion of the stack LS'. After that, by using the patterned mask layer 224 as a mask, the dummy gate dielectric material and the dummy gate material are patterned to form the dummy gate dielectric layer 220 and the dummy gate 222. In some embodiments, after the dummy gate 222 is formed, side portions of the dummy gate 222 are partially removed by an etching process, to reduce a width of the dummy gate 222. Accordingly, as shown in FIG. 2D, a width of the dummy gate 222 is smaller than a width of the patterned mask layer 224, and a width of the dummy gate dielectric layer 220 may be substantially the same as the width of the patterned mask layer 224. However, the disclosure is not limited thereto. In some embodiments, the dummy gate dielectric layer 220 is conformally formed on opposite sidewalls and a surface of the stack LS'.

The dummy gate dielectric layer 220 may be formed by suitable fabrication techniques such as ALD, CVD, or combinations thereof. In some embodiments, the dummy gate dielectric layer 220 includes silicon oxide such as low temperature oxide (LTO), silicon nitride, silicon oxynitride, high-k dielectrics, or a combination thereof. In some embodiments, a material of the dummy gate 222 has a similar etching selectivity as the material of the third material layers 214 with respect to the first material layers 210 and the second material layers 212. In an embodiment, the material of the third material layers 214 is silicon germanium, and the material of the dummy gate 222 is amorphous silicon. In some embodiments, the patterned mask layer 224 is a silicon nitride layer. However, the disclosure is not limited thereto. In some alternative embodiments, the patterned mask layer 224 may be a silicon oxide layer. In some embodiments, the patterned mask layer 224 is formed by low-pressure chemical vapor deposition (LPCVD) or PECVD. In some alternative embodiments, the patterned mask layer 224 may be formed by thermal oxidation or nitridation of silicon. In some embodiments, the patterned mask layer 224 is used as a hard mask during the photolithography and etching process. In some embodiments, as shown in FIG. 2D, an extending direction (e.g., the second direction D2) of the dummy gate dielectric layer 220 and the dummy gate 222 is substantially perpendicular to the extending direction (e.g., the first direction DO of the stack LS'. The dummy gate dielectric layer 220 and the dummy gate 222 may be formed between the contacts 102, for example. However, the disclosure is not limited thereto.

Referring to FIG. 2E, by using the dummy gate dielectric layer 220, the dummy gate 222 and the patterned mask layer 224 as a mask, the stack LS' is patterned to form a stacking structure GS. For example, portions of the first material layers 210, the third material layers 214, the second material layers 212 and the fourth material layer 216 are removed, to obtain the stacking structure GS including a plurality of first nanosheets 210a, a plurality of second nanosheets 212a, a plurality of third nanosheets 214a and a fourth nanosheet 216a. In some embodiments, sidewalls of the first nanosheets 210a are substantially flush with sidewalls of the second nanosheets 212a. In some embodiments, the fourth nanosheet 216a is also referred to as a dielectric nanosheet. In some embodiments, the first material layers 210, the third material layers 214, the second material layers 212 and the fourth material layer 216 are removed through an etching process. The etching process includes, for example, an anisotropic etching process such as dry etch or an isotropic etching process such as wet etch. In some embodiments, an etchant for the wet etch includes a combination of hydrogen fluoride (HF) and ammonia (NH$_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. In some embodiments, a width of the formed stacking structure GS in the first direction D1 is larger than a width of the dummy gate 222 and substantially the same as the dummy gate dielectric layer 220 in the first direction D1. For example, side surfaces of the formed stacking structure GS and the formed stacking structure GS are substantially coplanar. However, the disclosure is not limited thereto.

Referring to FIG. 2F and FIG. 2F-1, portions of the third nanosheets 214a of the stacking structure GS are removed, so as to form a plurality of recesses 213 at sidewalls of the stacking structure GS. In some embodiments, the recesses 213 are formed at opposite sidewalls of the stacking structure GS between the first nanosheets 210a and between the second nanosheets 212a. In some embodiments, the third nanosheets 214a are partially removed through an etching process. The etching process includes, for example, an anisotropic etching process such as dry etch or an isotropic etching process such as wet etch. In some embodiments, an etchant for the wet etch includes a combination of hydrogen fluoride (HF) and ammonia (NH$_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. As mentioned above, the etching selectivity between the first material layer 210 and the third material layer 214 and between the second material layer 212 and the third material layer 214 is high. Therefore, during the etching process, the etchant may selectively remove the exposed third nanosheets 214a without damaging the exposed first nanosheets 210a and second nanosheets 212a.

Referring to FIG. 2G and FIG. 2G-1, plural pairs of spacers 228 are formed in the recesses 213 of the stacking structure GS, and a pair of spacers 230 are formed on exposed sidewalls of the dummy gate 222. In some embodiments, a spacer material is conformally formed on exposed surfaces (e.g., the side surfaces and the top surfaces) of the patterned resist layer 226, the patterned mask layer 224, the dummy gate 222, the dummy gate dielectric layer 220, the stacking structure GS and the dielectric layer 100, and portions of the spacer material on the patterned resist layer 226, the patterned mask layer 224, the dummy gate dielectric layer 220, the first, second and fourth nanosheets 210a, 212a, 216a and the dielectric layer 100 are removed by an etching process such as a straight etch process. Thus, the remained portions of the spacer material filling up the recesses 213 may form the spacers 228, and the remained portions of the spacer material on the sidewalls of the dummy gate 222 may form the spacers 230. In some embodiments, the spacers 228 are disposed on opposite sidewalls of the third nanosheets 214a respectively, and the spacers 230 are disposed opposite sidewalls of the dummy gate 222. In some embodiments, outer sidewalls of the spacers 228 and the spacers 230 are substantially flush with outer sidewalls of the first nanosheets 210a, the second nanosheets 212a and the fourth nanosheet 216a of the stacking structure GS and outer sidewalls of the dummy gate dielectric layer 220. In some embodiments, a material of the spacers 228 is the same as a material of the spacers 230. For example, the material of the spacers 228 and the spacers 230 includes silicon nitride. However, the disclosure is not limited thereto. In some alternative embodiments, a material of the spacers 228 and the spacers 230 may be silicon oxide. In some embodiments, the spacers 228 and the spacers 230 are formed by low-pressure chemical vapor deposition (LPCVD) or PECVD.

Referring to FIG. 2H and FIG. 2H-1, a dielectric layer 300 is formed over the dielectric layer 100 to surround the stacking structure GS, the dummy gate dielectric layer 220, the dummy gate 222, the patterned mask layer 224 and the spacers 228, 230. In some embodiments, a dielectric material is conformally formed over the dielectric layer 100 to cover the stacking structure GS, the dummy gate dielectric layer 220, the dummy gate 222, the spacers 228, 230, the patterned mask layer 224 and the patterned resist layer 226, and then the dielectric material is partially removed until the patterned mask layer 224 is exposed. The dielectric material may be partially removed by a planarization process such as a mechanical grinding process, a chemical mechanical polishing (CMP) process, or the like. In some embodiments, during the removal of the dielectric material, the patterned resist layer 226 is removed and the patterned mask layer 224 may be partially removed. In some embodiments, the material of the dielectric layer 100 and the material of the dielectric layer 300 are identical. For example, the material of the dielectric layer 100 and the material of the dielectric layer 300 are silicon oxide. However, the disclosure is not limited thereto. In some alternative embodiments, the material of the dielectric layer 100 may be different from the material of the dielectric layer 300. In some embodiments, the dielectric layer 300 is referred to as an interlayer dielectric layer.

Referring to FIG. 2I, FIG. 2I-1, and FIG. 2I-2, the third nanosheets 214a in the stacking structure GS, the dummy gate 222 and the dummy gate dielectric layer 220 are removed to form a hollow H. In some embodiments, the hollow H exposes the first nanosheets 210a, the second nanosheets 212a, the fourth nanosheet 216a and the spacers 228 and 230. In some embodiments, the third nanosheets 214a, the dummy gate 222 and the dummy gate dielectric layer 220 are removed through an etching process. In some embodiments, the remained patterned mask layer 224 is also removed. The etching process includes, for example, an anisotropic etching process such as dry etch or an isotropic etching process such as wet etch. In some embodiments, an etchant for the wet etch includes a combination of hydrogen fluoride (HF) and ammonia ($NH_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. In some embodiments, the third nanosheets 214a are also referred to as sacrificial nanosheets.

Referring to FIG. 2J, FIG. 2J-1, and FIG. 2J-2, a gate dielectric layer 406 and a conductive layer 404 are sequentially formed to fill the hollow H. In some embodiments, the gate dielectric layer 406 and the conductive layer 404 are continuously deposited over sidewalls of the hollow H. In some embodiments, the gate dielectric layer 406 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some alternative embodiments, the gate dielectric layer 406 includes metal oxides, metal nitrides, metal silicates, transition metal-oxides, transition metal-nitrides, transition metal-silicates, oxynitrides of metals, metal aluminates, or combinations thereof. For example, the gate dielectric layer 406 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The gate dielectric layer 406 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. In some embodiments, the conductive layer 404 includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. The conductive layer 404 may be formed by a deposition process such as ALD, CVD, PVD, or the like. In some embodiments, a barrier layer (not shown) is optionally formed between the conductive layer 404 and the gate dielectric layer 406, so as to avoid diffusion of atoms between elements. In some embodiments, the barrier material includes TiN, TaN, TiSiN, TaSiN, WSiN, TiC, TaC, TiAlC, TaAlC, TiAlN, TaAlN, or a combination thereof.

In some embodiments, the gate dielectric layer 406 is conformally formed on surfaces of the spacers 228, surfaces of the spacers 230, surfaces of the first nanosheets 210a, surfaces of the second nanosheets 212a and a surface of the fourth nanosheet 216a. For example, as illustrated in FIG. 2J, the gate dielectric layer 406 continuously covers the surfaces of the spacers 228, the surfaces of the spacers 230, the surfaces of the first nanosheets 210a, the surfaces of the second nanosheets 212a and the surface of the fourth nanosheet 216a. In some embodiments, the gate dielectric layer 406 is sandwiched between the spacer 230 and the conductive layer 404, between the first nanosheet 210a and the conductive layer 404, between the second nanosheet 212a and the conductive layer 404 and between the fourth nanosheet 216a and the conductive layer 404.

In some embodiments, as shown in FIG. 2J-2, from another cross-sectional view, the gate dielectric layer 406 and the conductive layer 404 together wrap around the first nanosheets 210a and the second nanosheets 212a. In some embodiments, as shown in FIG. 2J-1, from a cross-sectional view, portions of the conductive layer 404 and the first nanosheets 210a are alternately stacked in the third direction D3 (e.g., Z direction), and similarly, portions of the conductive layer 404 and the second nanosheets 212a are alternately stacked in the third direction D3 (e.g., Z direction). In some embodiments, the conductive layer 404 between the adjacent two first nanosheets 210a and the adjacent two second nanosheets 212a has a width of about 10 nm to about 100 nm. On the other hand, the conductive layer 404 between the adjacent two first nanosheets 210a and the adjacent two second nanosheets 212a has a height of about 3 nm to about 20 nm. In some embodiments, the cross-sectional view of the conductive layer 404 between the adjacent two first nanosheets 210a and the adjacent two second nanosheets 212a is rectangular with straight edges and sharp corners, as illustrated in FIG. 2J-1. However, the disclosure is not limited thereto. The cross-sectional view of the conductive layer 404 between the adjacent two first nanosheets 210a and the adjacent two second nanosheets 212a may exhibit other shapes.

Figure 2K:
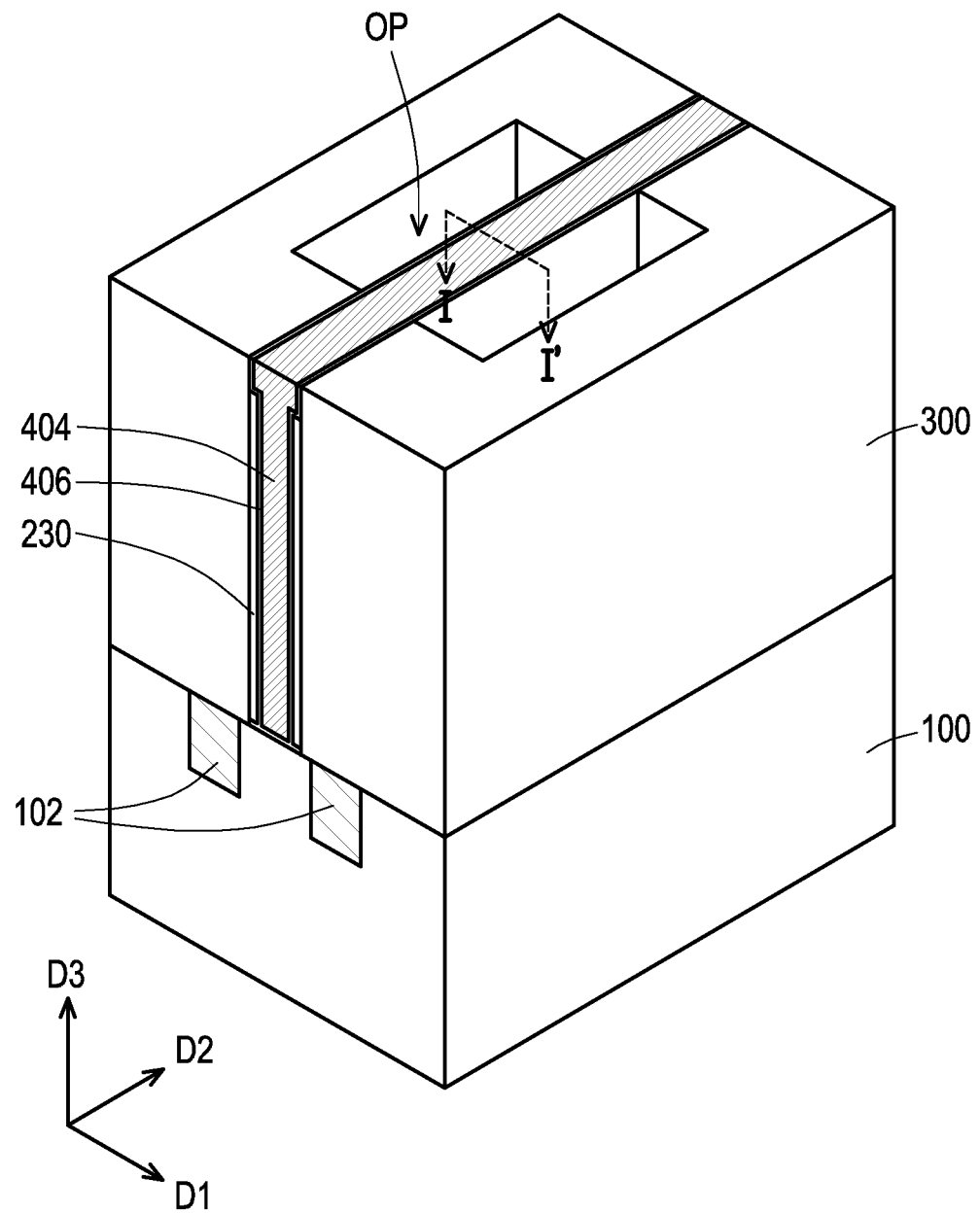
Figures 1, 2K:
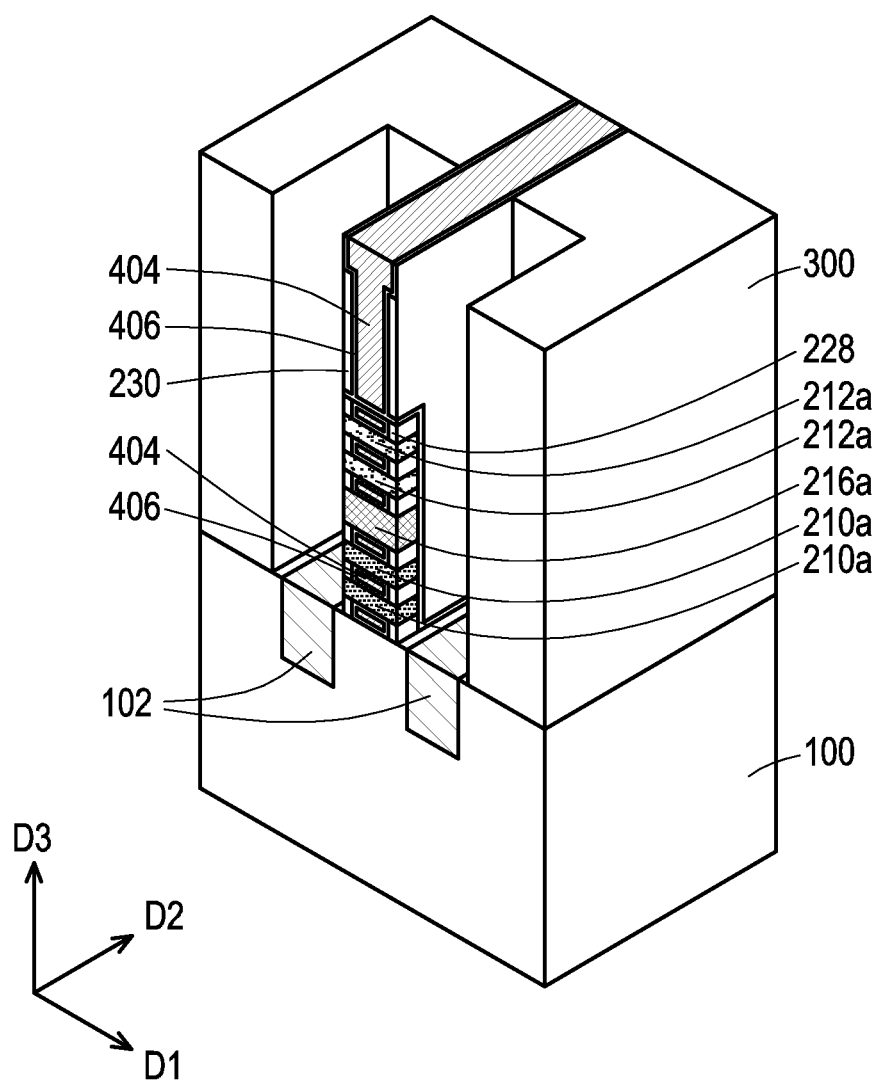

Referring to FIG. 2K and FIG. 2K-1, a plurality of contact openings OP is formed in the dielectric layer 300. For example, the contact openings OP are formed through the dielectric layer 300 to expose the contacts 102, respectively. In some embodiments, the contact openings OP are formed by performing an etching process on the dielectric layer 300. The etching process includes, for example, an anisotropic etching process such as dry etch or an isotropic etching process such as wet etch. As illustrated in FIG. 2K-1, the contact openings OP are formed at two opposite sides of the first nanosheets 210a, the second nanosheets 212a, the conductive layer 404 and the fourth nanosheet 216a.

Figure 2L:
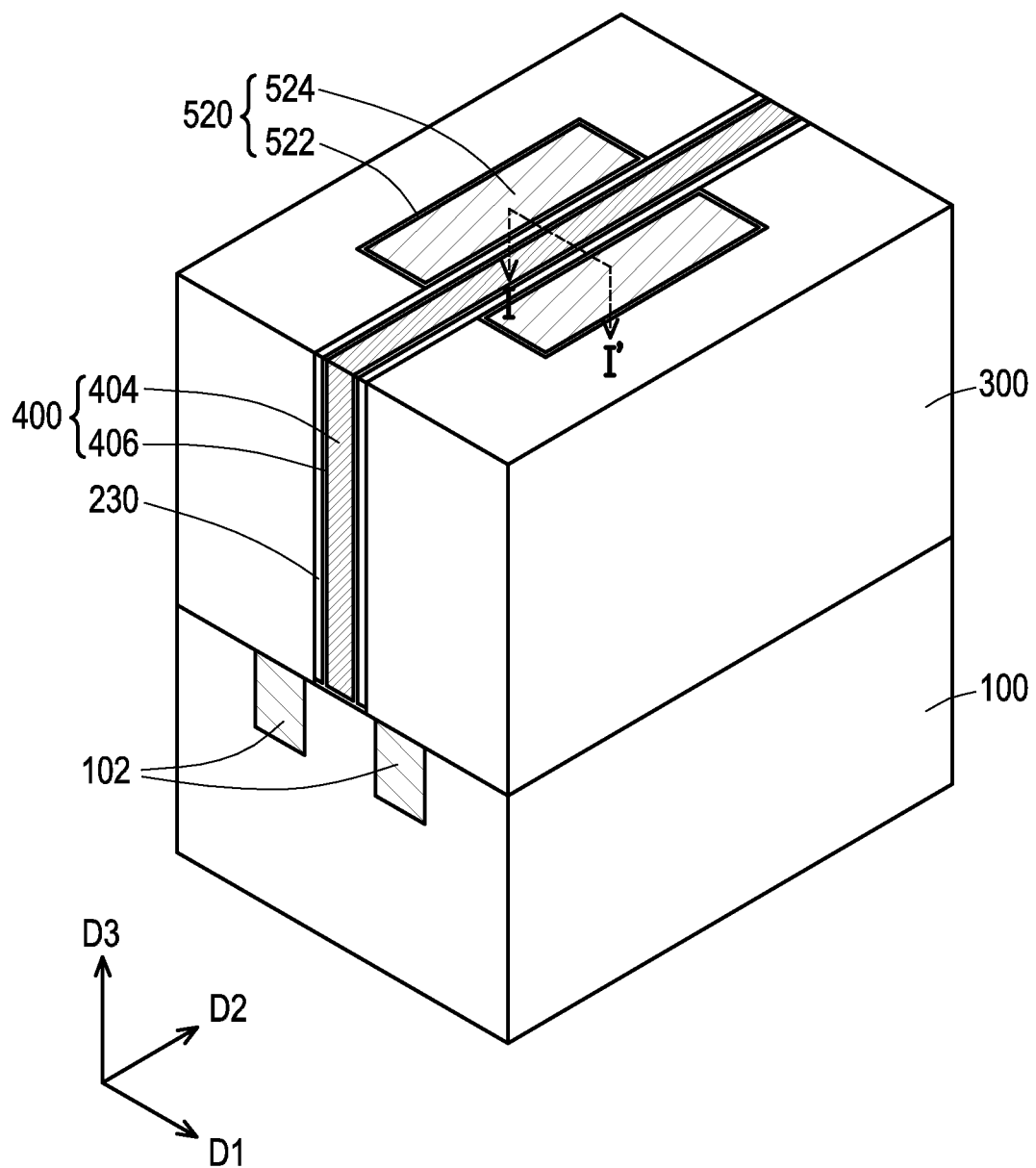
Figures 1, 2L:
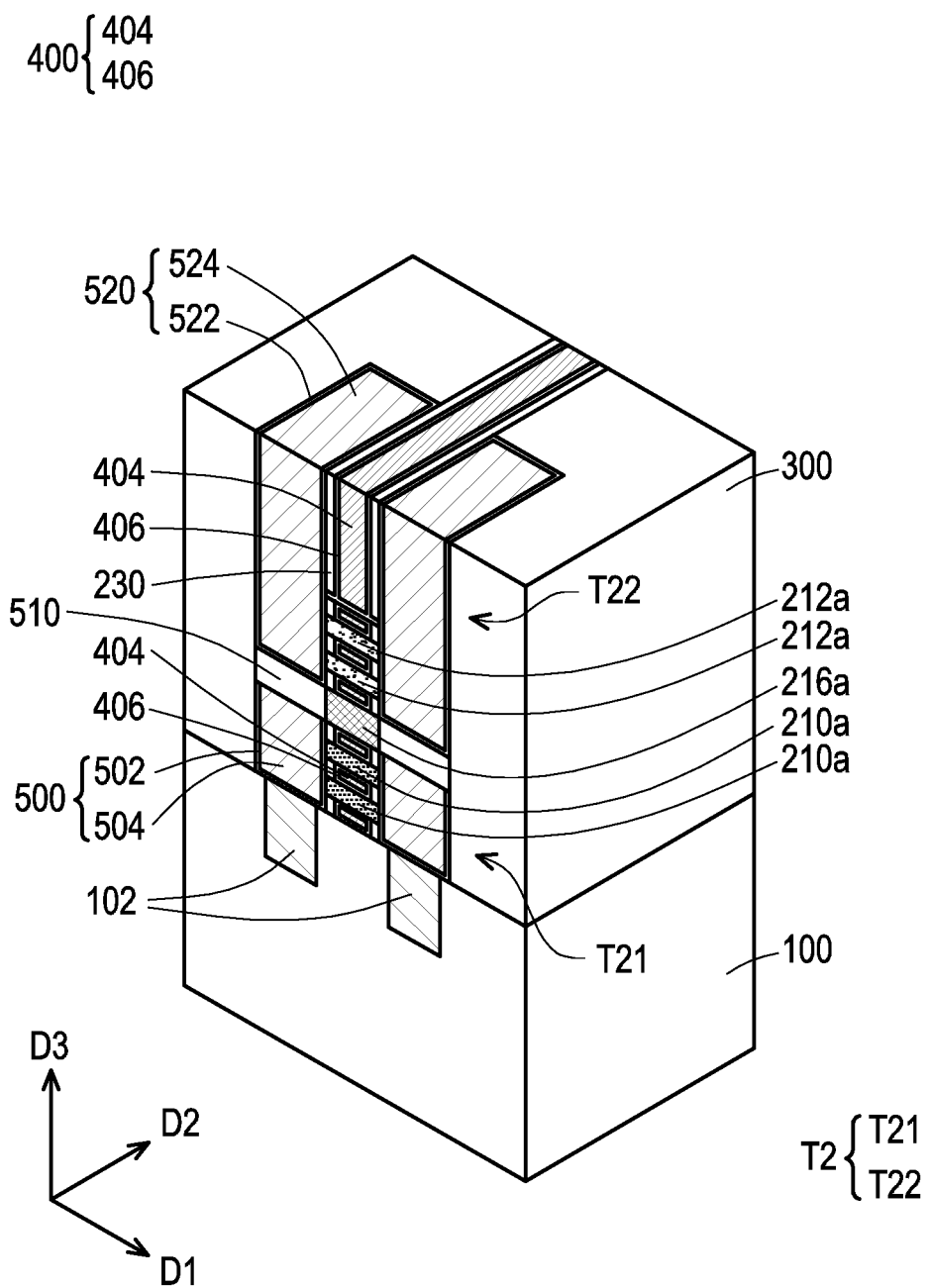

Referring to FIG. 2L and FIG. 2L-1, after the contact openings OP are formed, first source/drain regions 500 are formed aside the conductive layer 404 and the first nanosheets 210a therebetween. In some embodiments, a conductive material (not shown) is filled into the contacts openings OP and is formed over the dielectric layer 300. Thereafter, the conductive material is partially removed until the dielectric layer 300 is exposed. In some embodiments, the conductive material is partially removed through a mechanical grinding process, a CMP process, or the like. Then, the conductive material is partially etched by an etching process such as an etch back process, so as to form the first source/drain regions 500. In some embodiments, the first source/drain regions 500 are disposed at opposite sides of the first nanosheets 210a. In some embodiments, the first source/drain regions 500 include a barrier layer 502 and a conductive layer 504, and the barrier layer 502 surrounds the conductive layer 504. In some embodiments, the barrier layer 502 is optionally formed between the conductive layer 504 and the dielectric layer 300, so as to avoid diffusion of atoms between elements. The barrier layer 502 includes, for example, TiN, TaN, TiSiN, TaSiN, WSiN, TiC, TaC, TiAlC, TaAlC, TiAlN, TaAlN, or a combination thereof. In some embodiments, the conductive material of the conductive layer 504 includes cobalt, tungsten, copper, titanium, tantalum, aluminum, zirconium, hafnium, a combination thereof, or other suitable conductive materials. In some embodiments, the conductive layer 504 is formed through CVD, ALD, plating, or other suitable deposition techniques. In some embodiments, top surfaces of the first source/drain regions 500 are not higher than a bottom surface of the fourth nanosheet 216a. For example, the top surfaces of the first source/drain regions 500 are lower than the bottom surface of the fourth nanosheet 216a. However, the disclosure is not limited thereto.

Then, insulating layers 510 are formed in the contact openings OP on the first source/drain regions 500. The insulating layer 510 may be formed of organic material such as silicon oxycarbide or the like. The insulating layer 510 may be formed by suitable fabrication techniques such as area selective dielectric-on-metal deposition or a deposition process and a partial removal process. For example, the deposition process and the partial removal process includes filling a dielectric material (not shown) into the contacts openings OP and over the dielectric layer 300, performing a planarization process on the dielectric material until the dielectric layer 300 is exposed and partially removing the dielectric material. The dielectric material may be partially removed by an etch back process, for example. In some embodiments, a top surface of the insulating layer 510 is not higher than a top surface of the fourth nanosheet 216a. For example, the top surface of the insulating layer 510 is substantially flush with the top surface of the fourth nanosheet 216a. However, the disclosure is not limited thereto.

Thereafter, second source/drain regions 520 are formed on the insulating layers 510 aside the conductive layer 404 and the second nanosheets 212a therebetween. In some embodiments, the second source/drain regions 520 include a barrier layer 522 and a conductive layer 524. In some embodiments, a conductive material (not shown) is formed to fill up the contacts openings and OP. Thereafter, the conductive material is partially removed until the dielectric layer 300 is exposed. In some embodiments, the conductive material is partially removed through a mechanical grinding process, a CMP process, or the like. In some embodiments, during the removal of the conductive material, the gate dielectric layer 406 and the conductive layer 404 are partially removed, to form a gate structure 400. In addition, the dielectric layer 300 may be also partially removed. The material and forming method of the second source/drain regions 520 may be substantially the same as those of the first source/drain regions 500, so the detailed descriptions thereof are omitted herein. In some embodiments, the top surfaces of the second source/drain regions 520 are substantially flush with top surfaces of the gate structure 400 and the dielectric layer 300.

After the first source/drain regions 500 and the second source/drain regions 520 are formed, the formation of the second transistor T2 is substantially completed. In some embodiments, the second transistor T2 includes a first conductive type transistor T21 and a second conductive type transistor T22. The first conductive type transistor T21 may include the gate structure 400, the first nanosheets 210a stacked in the third direction D3 and the first source/drain regions 500 at opposite sides of the first nanosheets 210a, and the second conductive type transistor T22 may include the gate structure 400, the second nanosheets 212a stacked in the third direction D3 and the second source/drain regions 520 at opposite sides of the second nanosheets 212a. For example, the first conductive type transistor T21 is p-type field effect transistor (pFET), the second conductive type transistor T22 is n-type field effect transistor (nFET), and the second transistor T2 is a complementary field effect transistor (CFET). The first nanosheets 210a and the second nanosheets 212a may be all formed of oxide semiconductors. Thus, the second transistor T2 may be also referred to as an oxide semiconductor complementary FET. The second transistor T2 provides high performance and has low leakage in off-state. In some embodiments, the gate structure 400 serves as a common gate for the first conductive type transistor T21 and the second conductive type transistor T22. However, the disclosure is not limited thereto.

The first nanosheets 210a and the second nanosheets 212a are channel layers. In some embodiments, the first nanosheets 210a are first conductive type channel layers, and the second nanosheets 212a are second conductive type channel layers. For example, the first nanosheets 210a are p-type channel layers, and the second nanosheets 212a are n-type channel layers.

As mentioned above, the second transistors T2 may be a selector for a memory device. However, the disclosure is not limited thereto. In some alternative embodiments, the second transistors T2 may be power gates used to switch off logic blocks in standby or input/output (I/O) devices acting as the interface between a computing element (such as a CPU) and the outside world (such as a hard drive).

Referring to FIG. 1 and FIG. 2L, the first source/drain regions 500 are electrically connected to the contacts 102, and the second source/drain regions 520 are electrically connected to the conductive vias 32. In other words, the second transistors T2 may be electrically connected to the first transistor T1 through the contacts 102 and electrically connected to the conductive terminals 80 through the conductive vias 32 and the conductive patterns 34 of the interconnection structure 30. In some embodiments, the second transistor T2 is embedded in the interconnection structure 30, which is being considered as formed during back-end-of-line (BEOL) process. That is, the second transistor T2 may be manufactured at low temperature, which is compatible with thermal budget (i.e., the process temperature window) of the BEOL process. As such, the second transistor T2 does not use up valuable front-end chip area and the device size may be further reduced.

FIG. 3A to FIG. 3D are three dimensional views illustrating various stages of a manufacturing method of a transistor in accordance with some alternative embodiments of the disclosure. FIG. 3A-1, FIG. 3C-1 and FIG. 3D-1 are cross-sectional views taken along cross-sectional line I-I' in FIG. 3A, FIG. 3C and FIG. 3D. FIG. 3B-1 and FIG. 3C-2 are cross-sectional views taken along cross-sectional line II-II' in FIG. 3B and FIG. 3C. The difference between the second transistor T2 of FIG. 3D and FIG. 3D-1 and the second transistor T2 of FIG. 2L and FIG. 2L-1 lies in that the gate structure includes a first gate structure and a second gate structure.

Figure 3A:
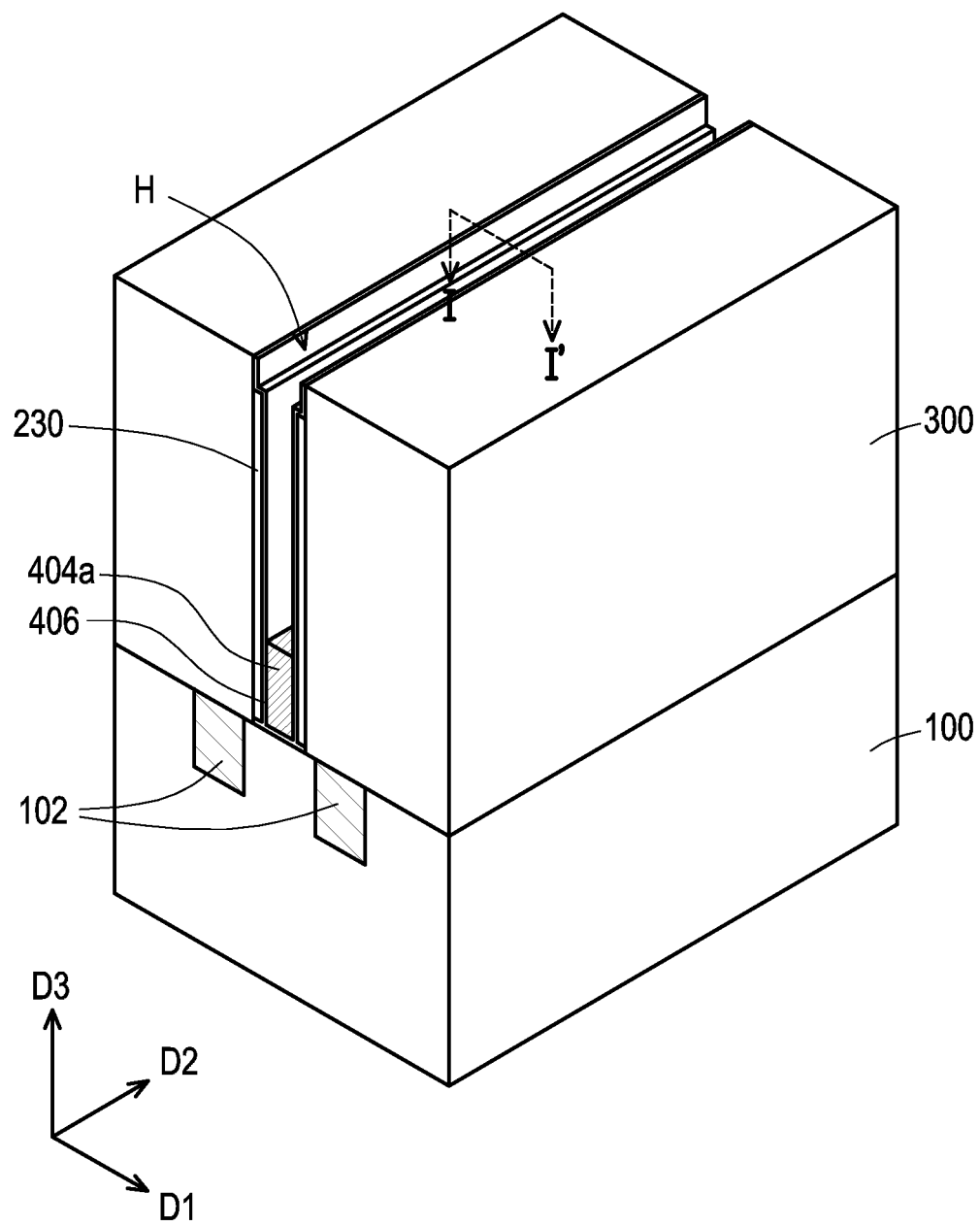
FIG. 3A to FIG. 3D are three dimensional views illustrating various stages of a manufacturing method of a transistor in accordance with some alternative embodiments of the disclosure.
Figures 1, 3A:
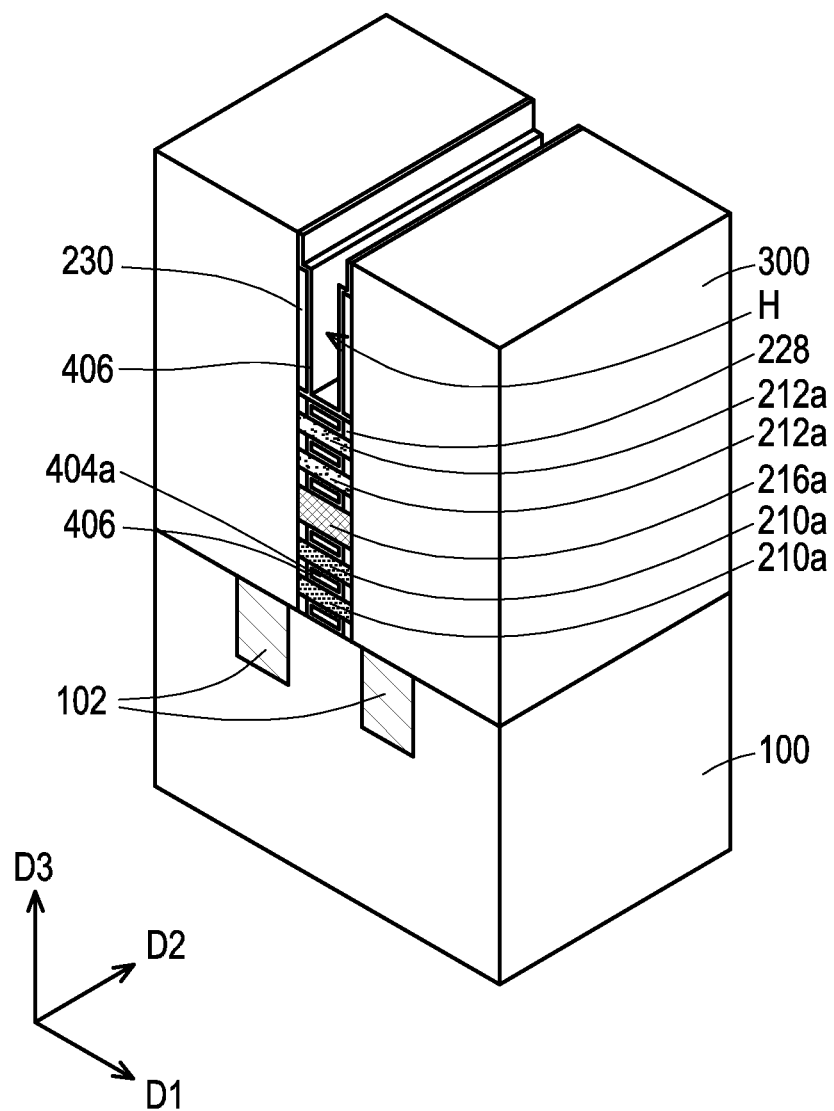

Referring to FIG. 3A and FIG. 3A-1, in some embodiments, after forming the hollow H in the structure of FIG. 2I and FIG. 2I-1, a gate dielectric layer 406 is formed on exposed surfaces of the hollow H, and a conductive layer 404a is formed to fill up a portion of the hollow H not higher than the nanosheet 216a. In some embodiments, the gate dielectric layer 406 covers the exposed surfaces of the first nanosheets 210a and the second nanosheets 212a. A top surface of the gate dielectric layer 406 may be substantially flush with the dielectric layer 300. In some embodiments, the conductive layer 404a wraps around the first nanosheets 210a. A top surface of the conductive layer 404a may be substantially flush with the bottom surface of the fourth nanosheet 216a. However, the disclosure is not limited thereto. In some alternative embodiments, the top surface of the conductive layer 404a is located between the bottom surface and the top surface of the nanosheet 216a. In some embodiments, the conductive layer 404a is formed by forming a conductive material (not shown) in the hollow H and over the dielectric layer 300. Thereafter, the conductive material is partially removed until the dielectric layer 300 is exposed. In some embodiments, the conductive material is partially removed through a mechanical grinding process, a CMP process, or the like. Then, the conductive material is partially etched by an etching process such as an etch back process, so as to form the conductive layer 404a. The material of the conductive layer 404b may be substantially the same as those of the conductive layer 404, so the detailed descriptions thereof are omitted herein.

Figure 3B:
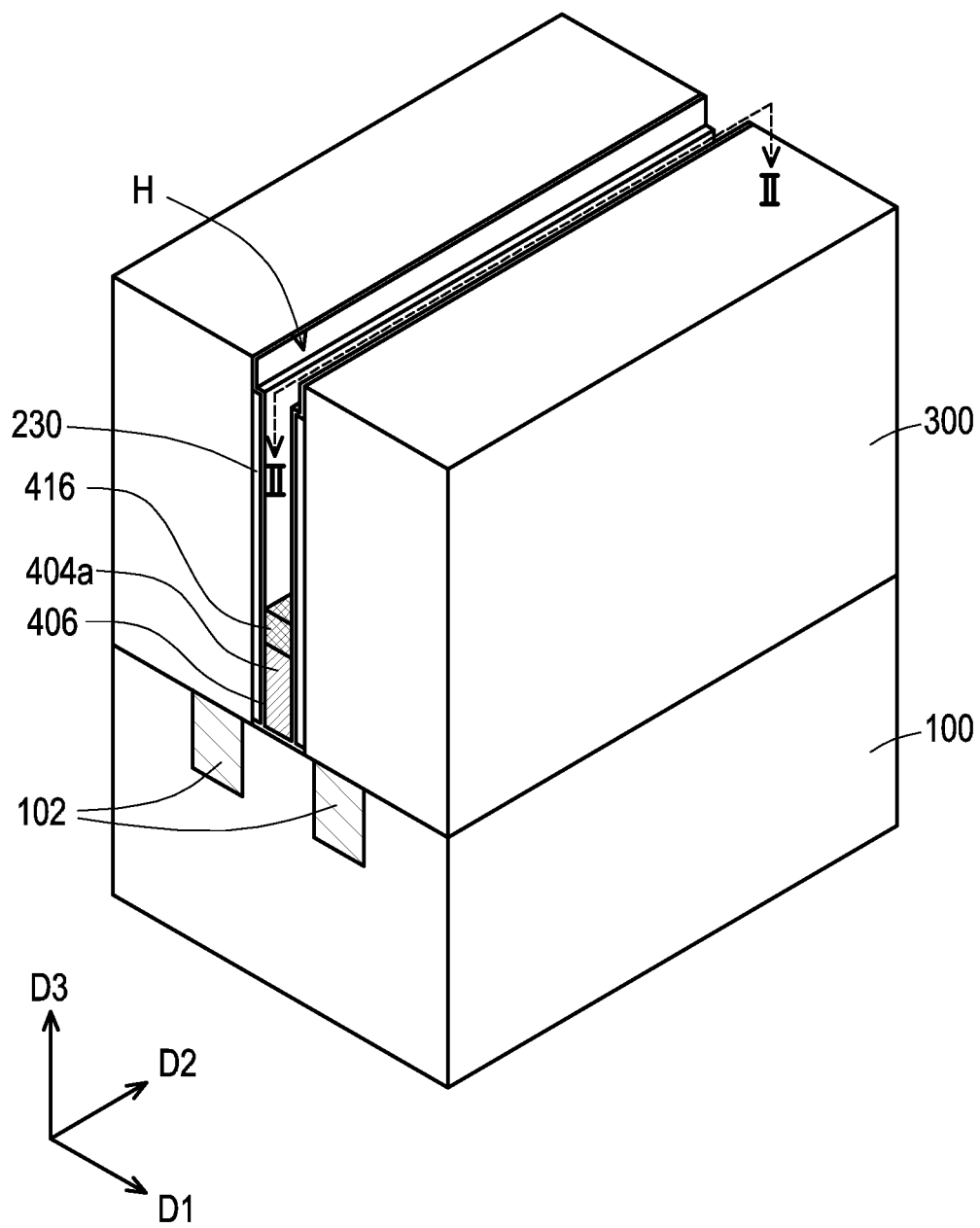
Figures 1, 3B:
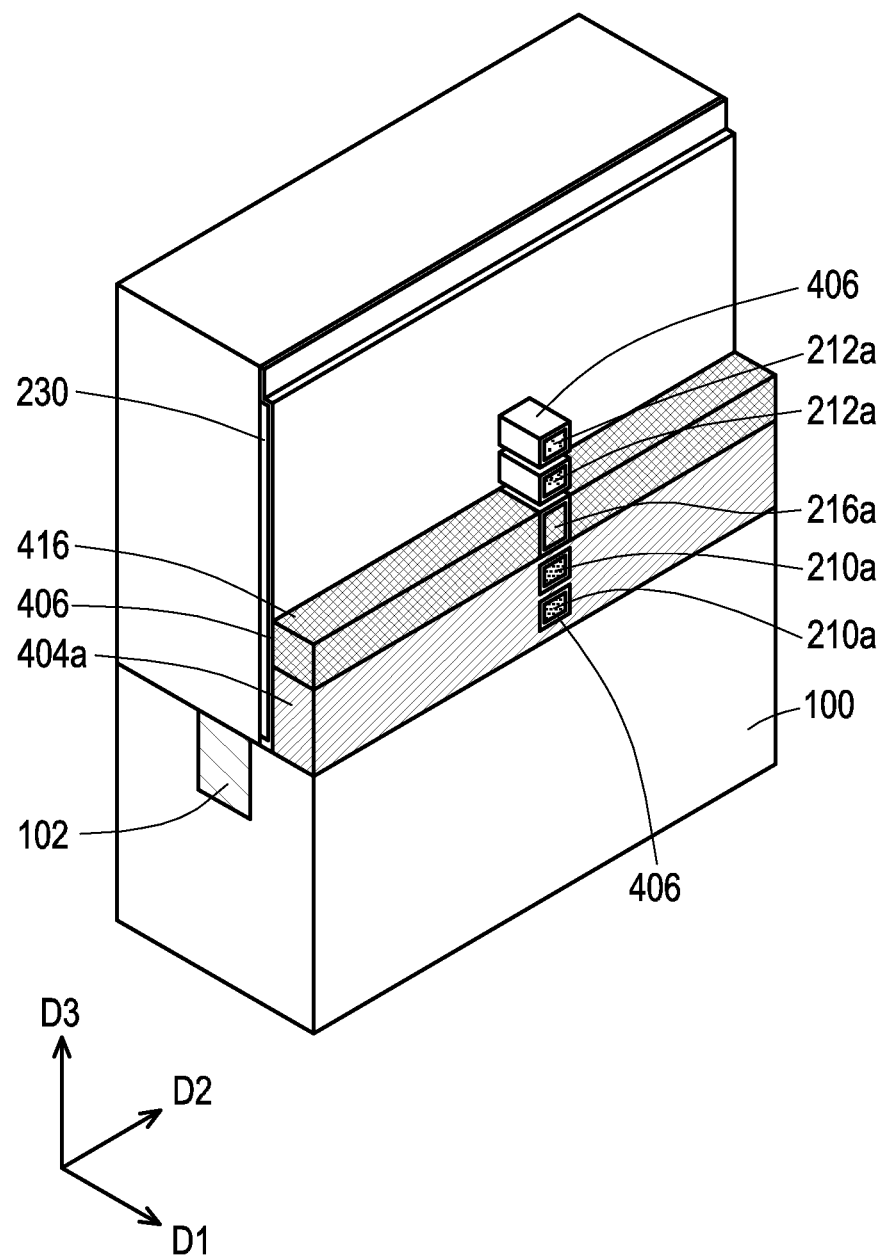

Referring to FIG. 3B and FIG. 3B-1, an insulating layer 416 is formed on the conductive layer 404a. In some embodiments, the insulating layer 416 is formed in a portion of the hollow H above the conductive layer 404a. The insulating layer 416 may be formed of organic material such as silicon oxycarbide or the like. The insulating layer 416 may be formed by suitable fabrication techniques such as area selective dielectric-on-metal deposition or a deposition process and a partial removal process. In some embodiments, a top surface of the insulating layer 416 is not higher than a top surface of the fourth nanosheet 216a. For example, the top surface of the insulating layer 416 is substantially flush with the top surface of the fourth nanosheet 216a. However, the disclosure is not limited thereto.

Figure 3C:
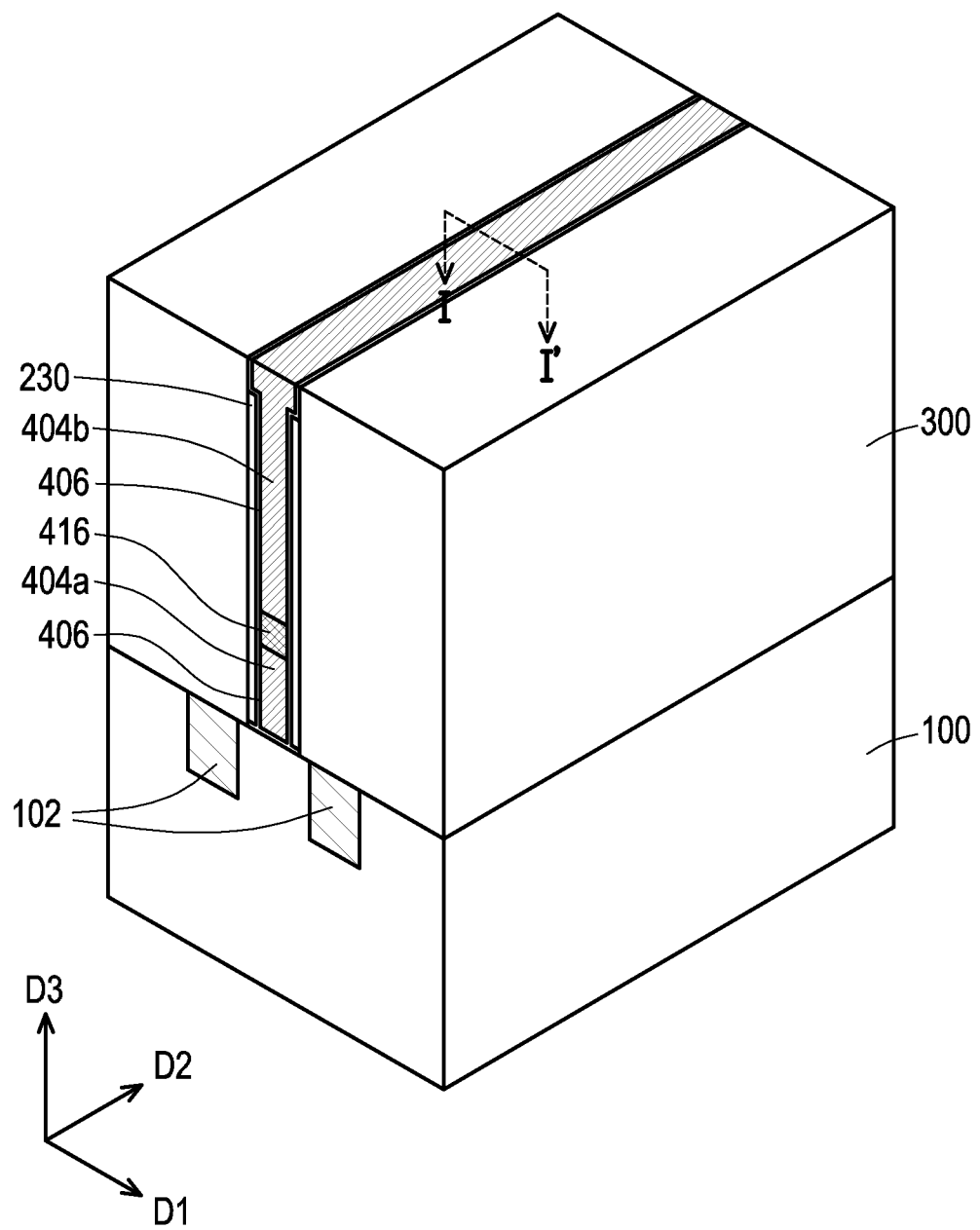
Figures 1, 3C:
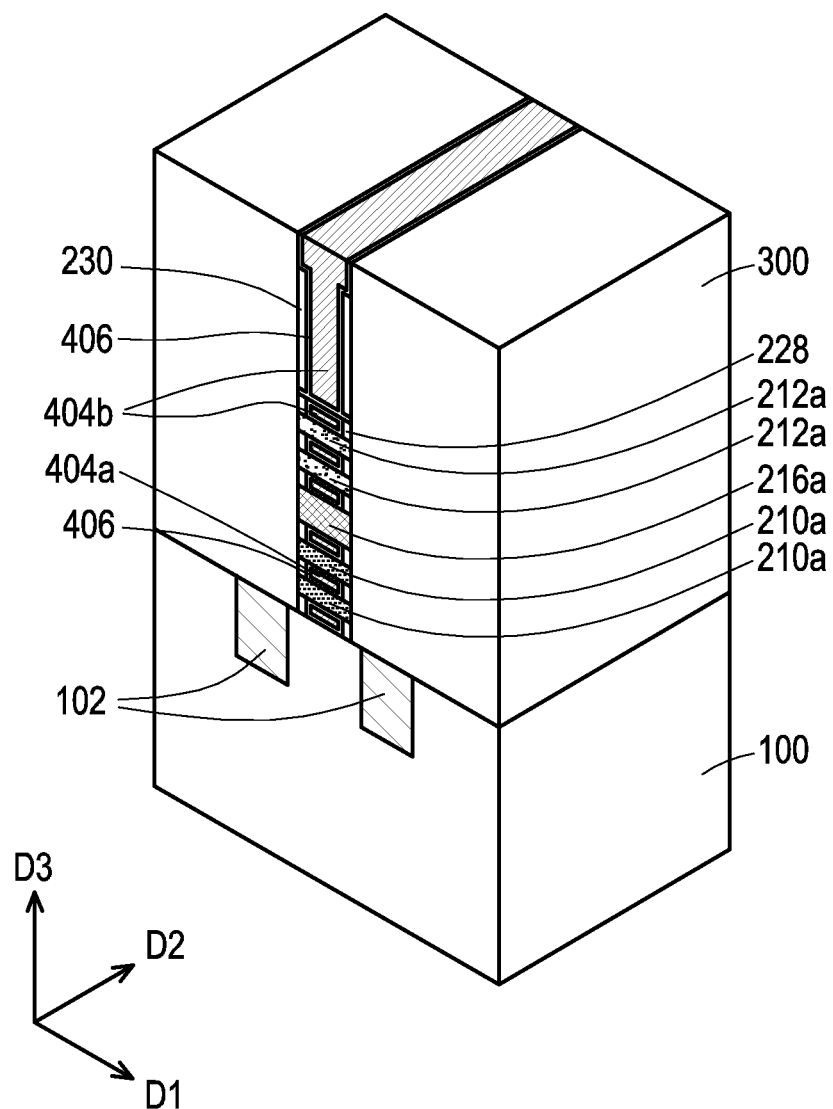
Figures 2, 3C:
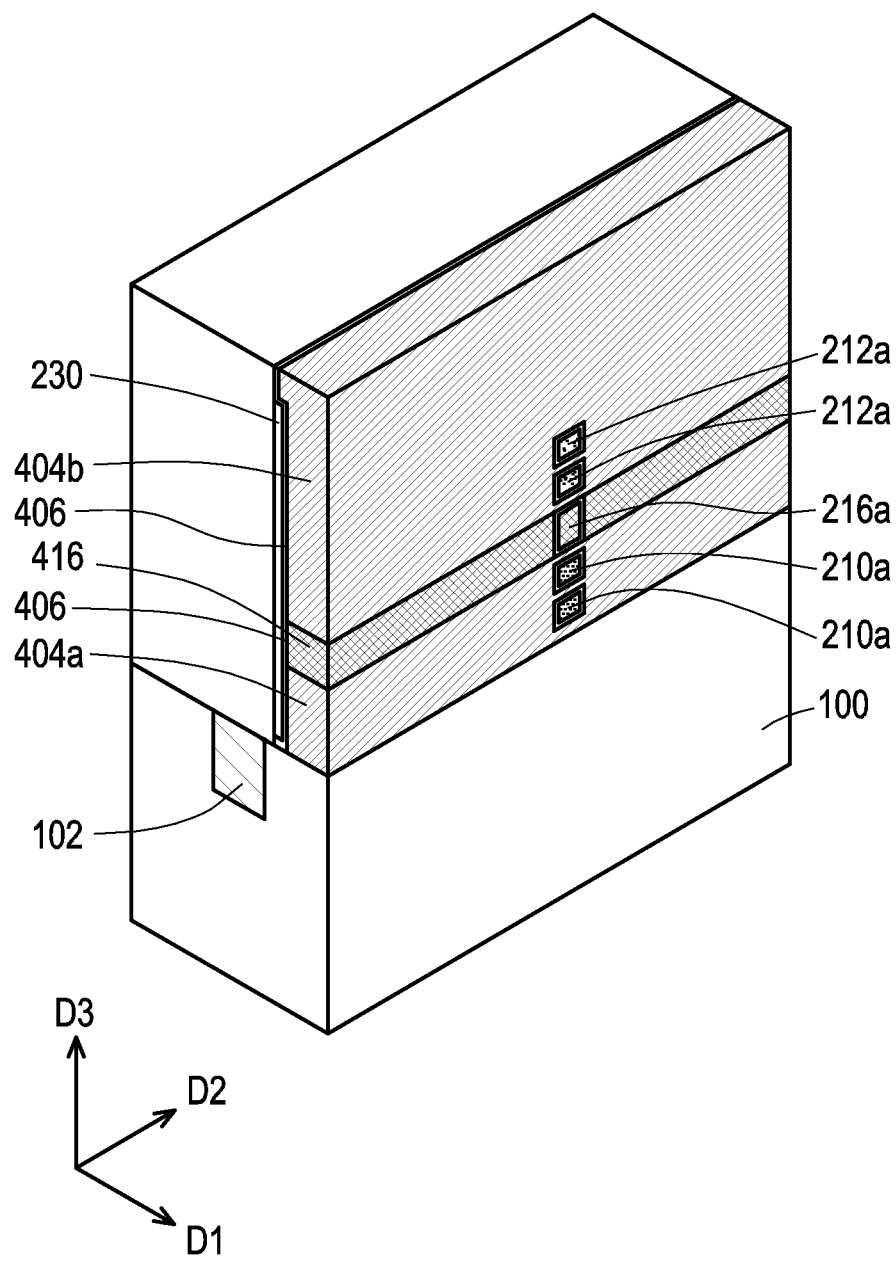

Referring to FIG. 3C, FIG. 3C-1 and FIG. 3C-2, thereafter, a conductive layer 404b is formed on the insulating layer 416 to fill up the hollow H. In some embodiments, the conductive layer 404b fills the remaining hollow H and wraps around the second nanosheets 212a. In some embodiments, a top surface of the conductive layer 404b is substantially flush with the top surface of the dielectric layer 300. The material and forming method of the conductive layer 404b may be substantially the same as those of the conductive layer 404, so the detailed descriptions thereof are omitted herein. In some embodiments, as shown in FIG. 3C, the insulating layer 416 is surrounded by the gate dielectric layer 406. In such embodiments, sidewalls of the insulating layer 416 is substantially flush with sidewalls of the conductive layer 404a and the conductive layer 404b.

Figure 3D:
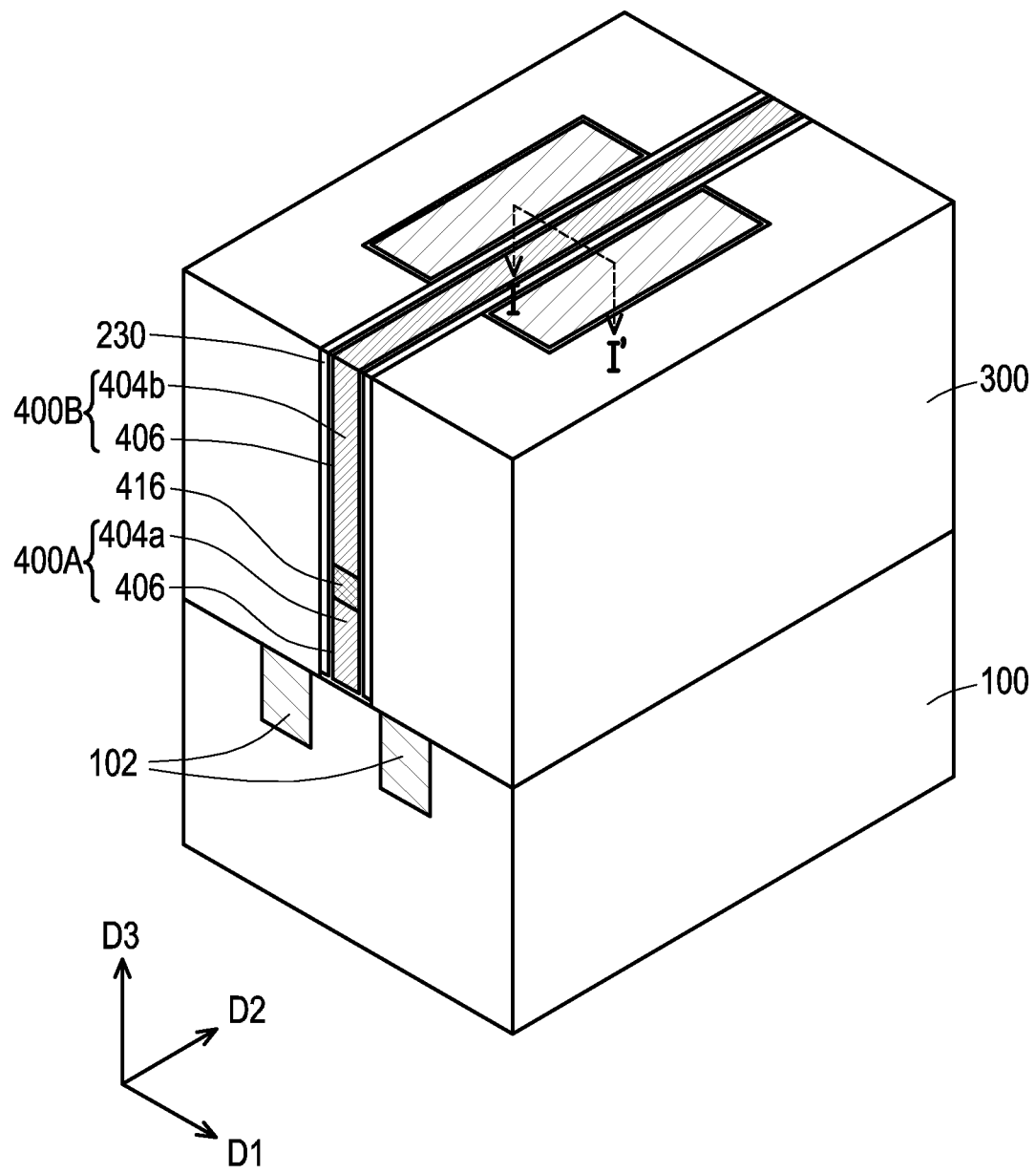
Figures 1, 3D:
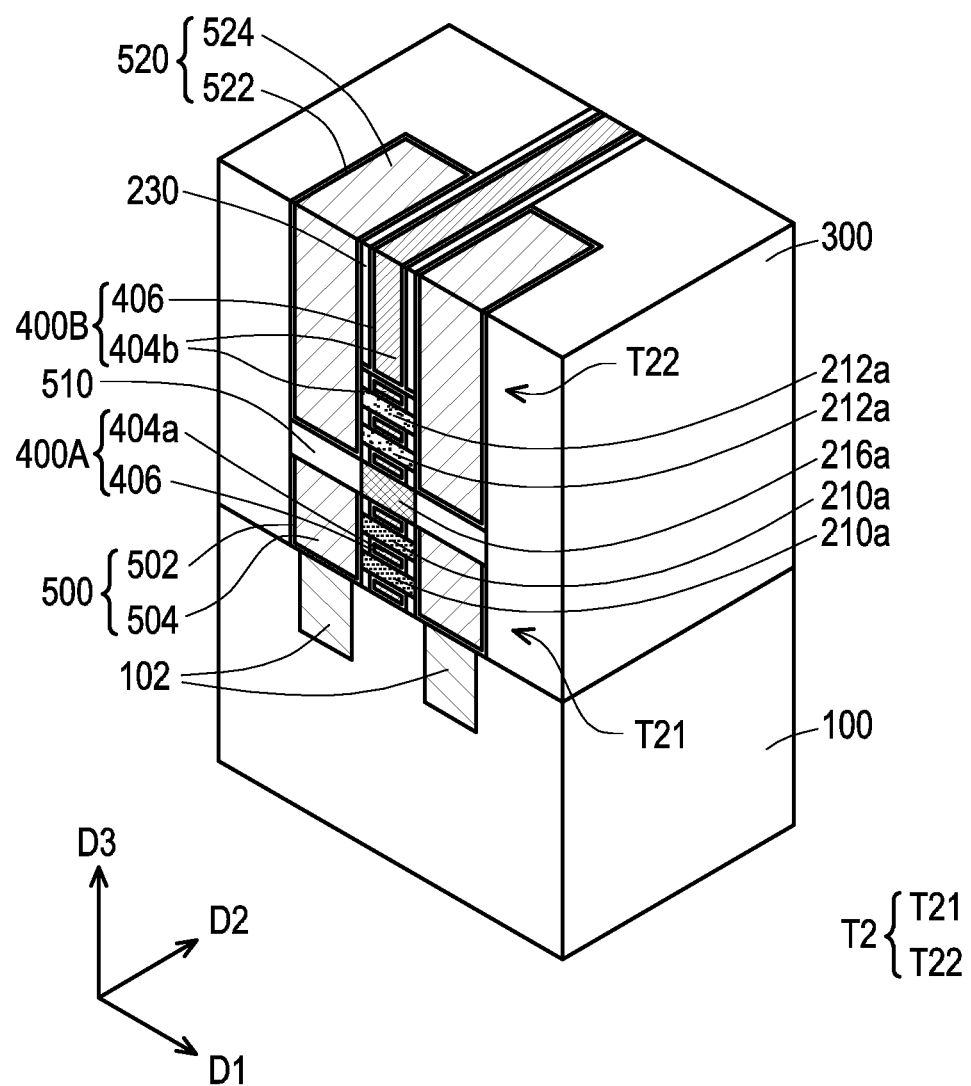

Referring to FIG. 3D and FIG. 3D-1, the processes similar to those of FIG. 2K and FIG. 2K-1 to FIG. 2L and FIG. 2L-1 are performed on the structure of FIG. 3C and FIG. 3C-1, to form first and second gate structures 400A and 400B, first and second source/drain regions 500 and 520, and insulating layers 510 between the first and second source/drain regions 500 and 520. Then, the second transistor T2 is formed. In some embodiments, the second transistor T2 is a complementary field effect transistor (CFET) and includes a first conductive type transistor T21 and a second conductive type transistor T22. In some embodiments, the first conductive type transistor T21 includes the first gate structure 400A, the first nanosheets 210a and the first source/drain regions 500 at opposite sides of the first gate structure 400A, and the second conductive type transistor T22 includes the second gate structure 400B, the second nanosheets 212a and the second source/drain regions 520 at opposite sides of the second gate structure 400B. The first gate structure 400A and the second gate structure 400B are physically separated and electrically isolated by the insulating layer 416, for example. Accordingly, the first conductive type transistor T21 and the second conductive type transistor T22 are electrically isolated, for example.

In some embodiments, the nanosheets are stacked vertically with respect to the substrate. However, the disclosure is not limited thereto. In some alternative embodiments, the nanosheets may be arranged parallel to the substrate.

Figure 4A:
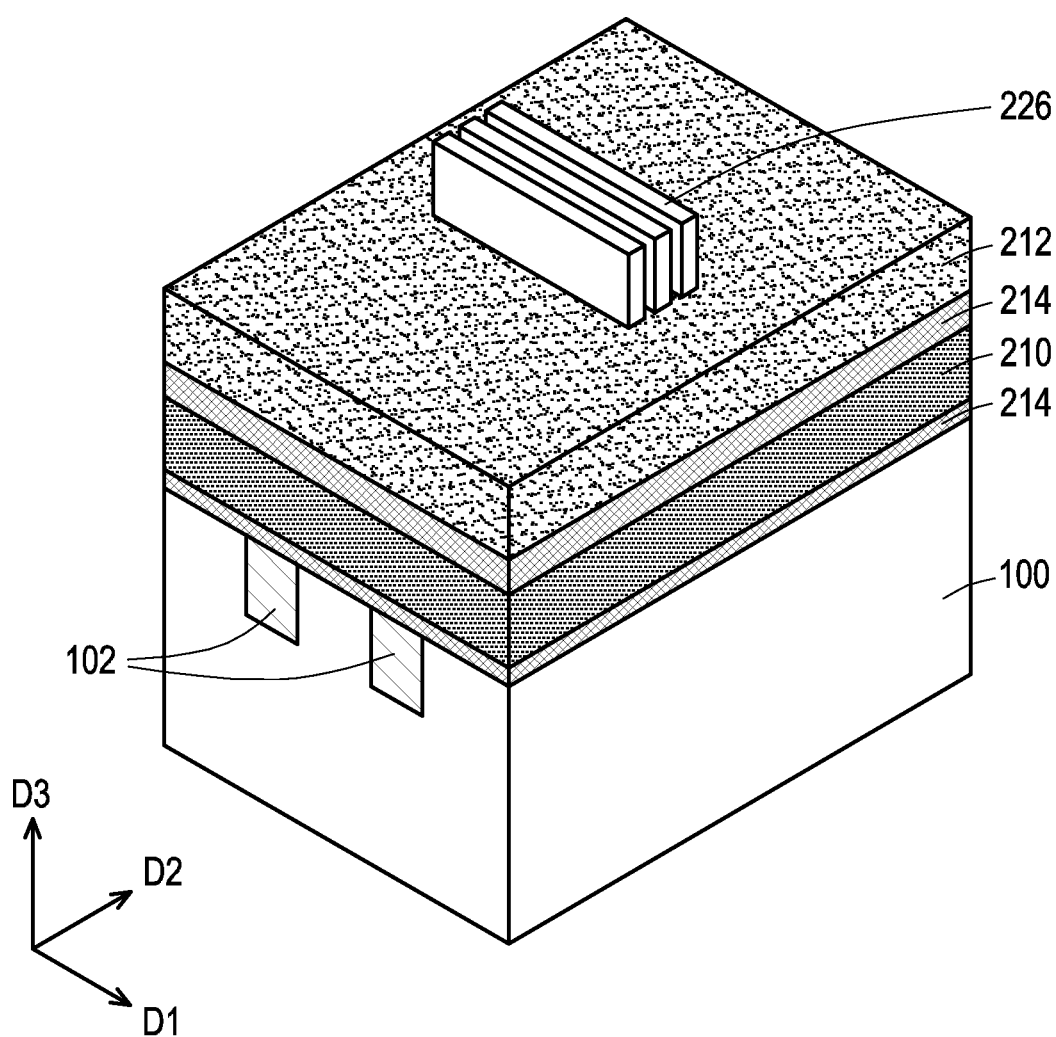
FIG. 4A to FIG. 4K are three dimensional views illustrating various stages of a manufacturing method of a transistor.
Figure 4B:
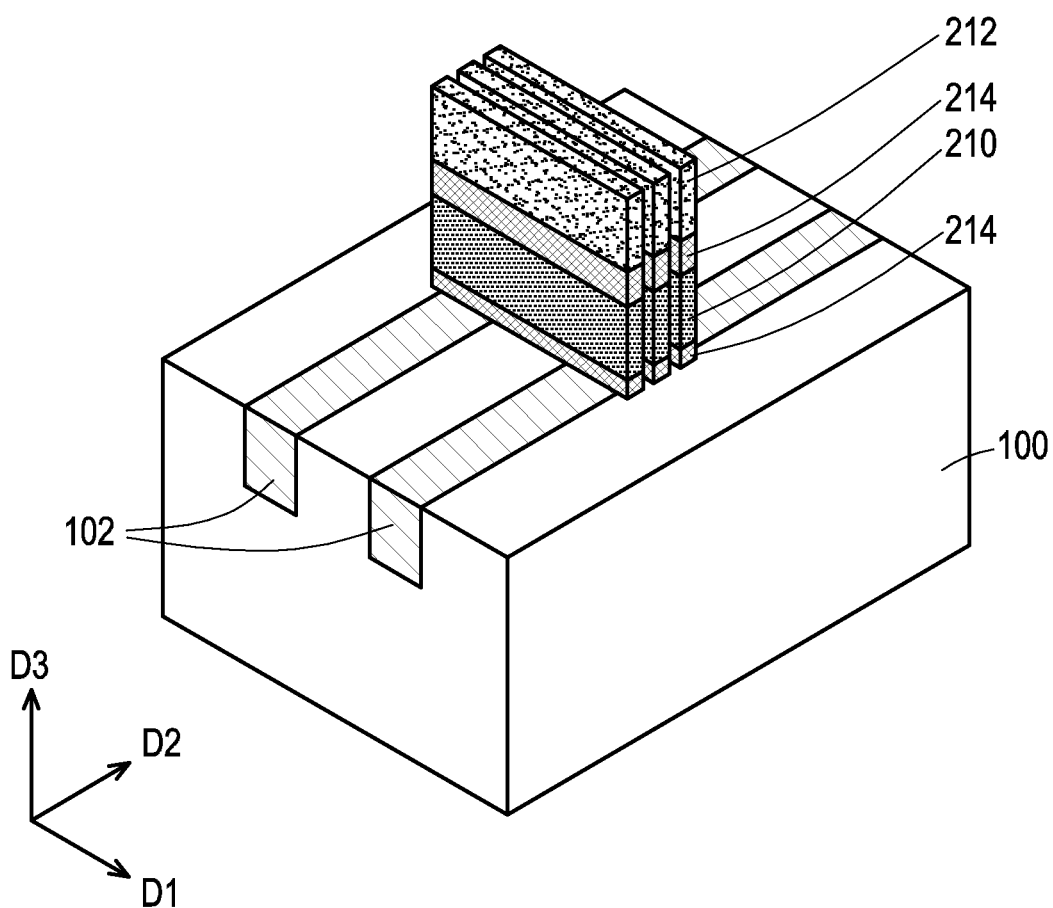
Figure 4C:
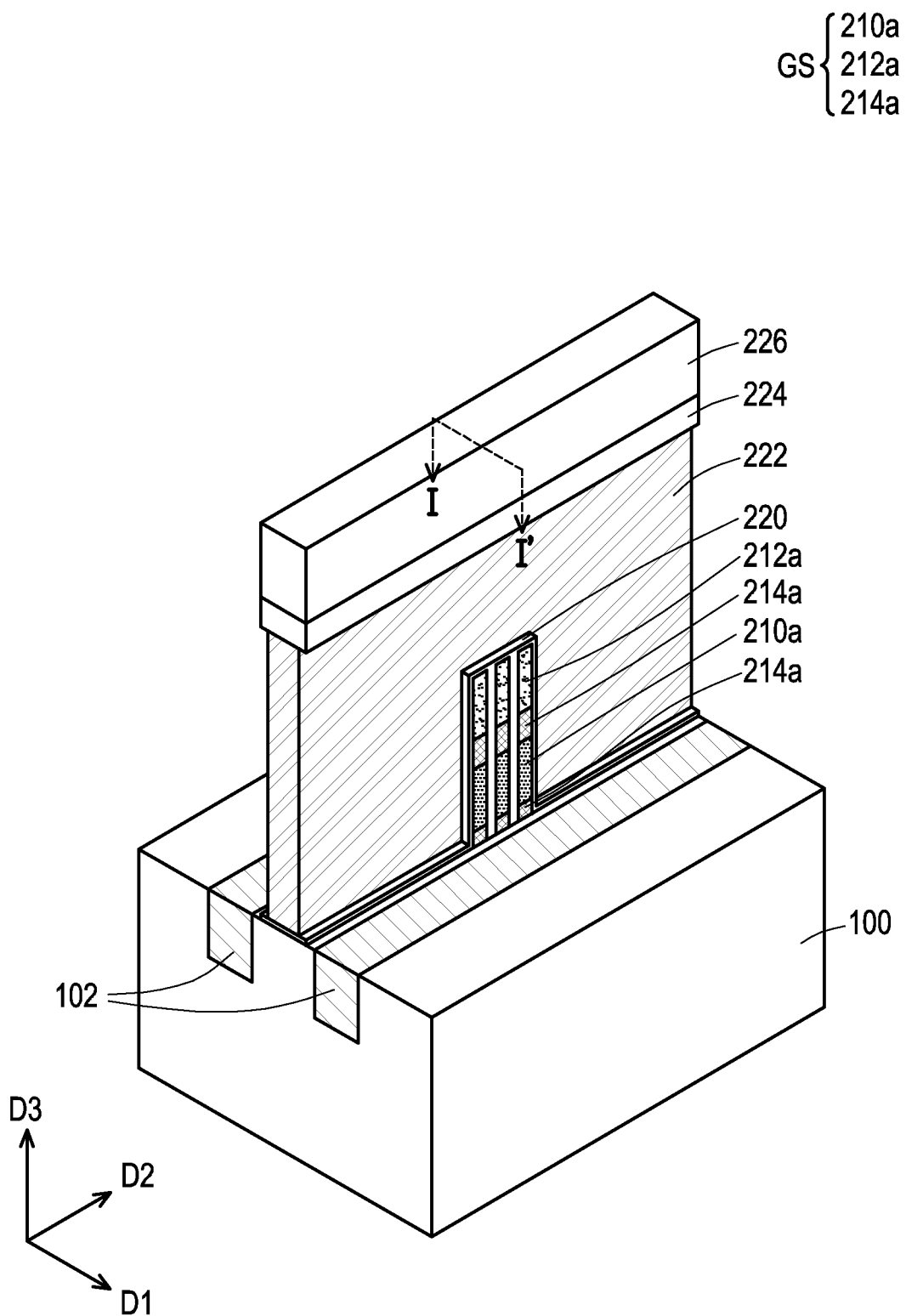
Figures 1, 4C:
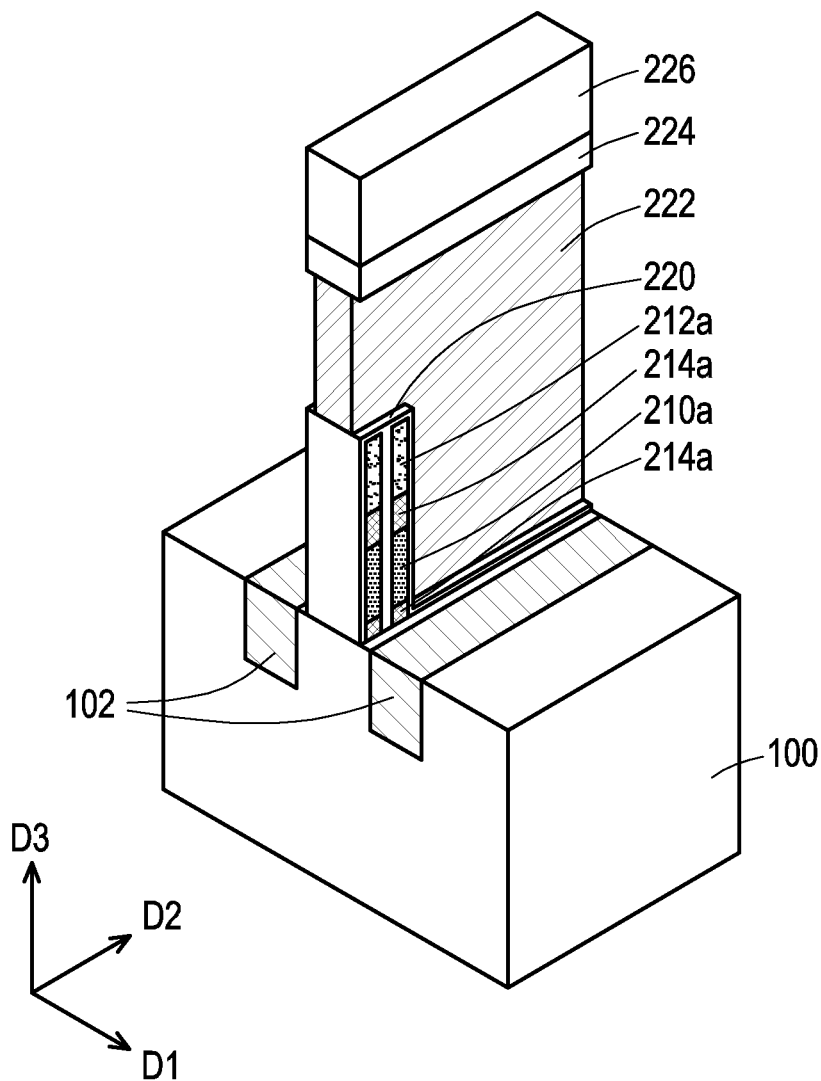
Figure 4D:
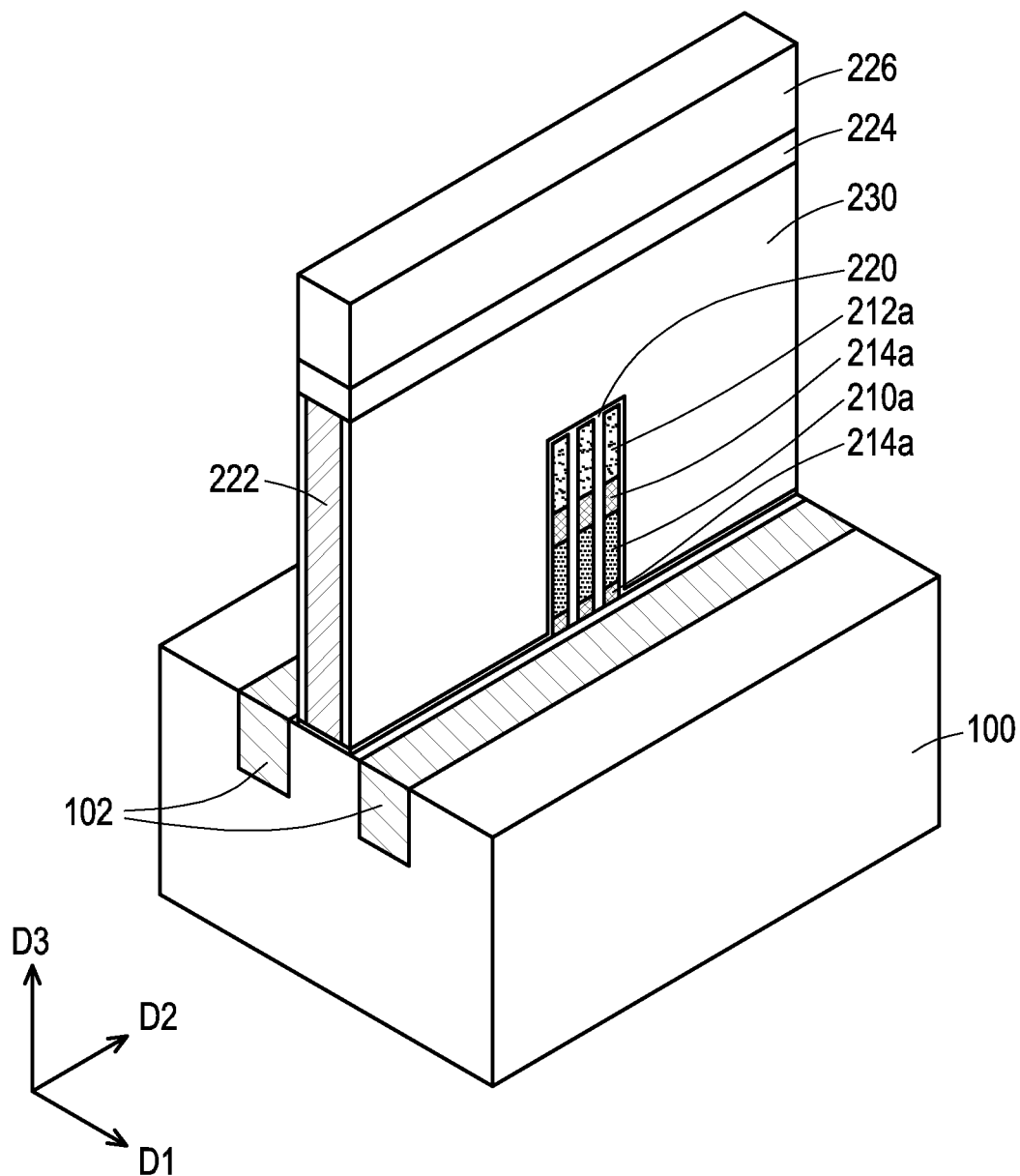
Figure 4E:
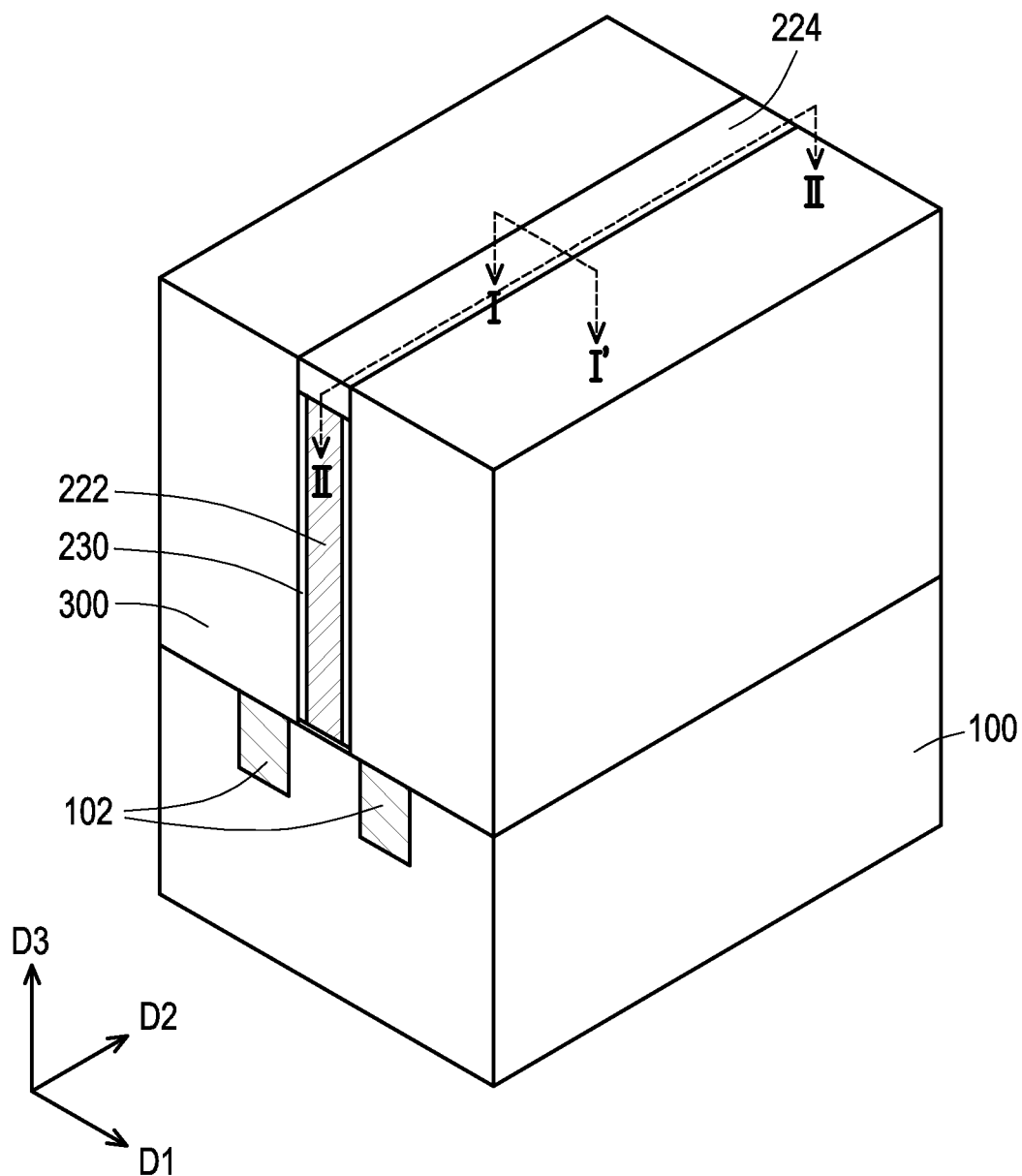
Figures 1, 4E:
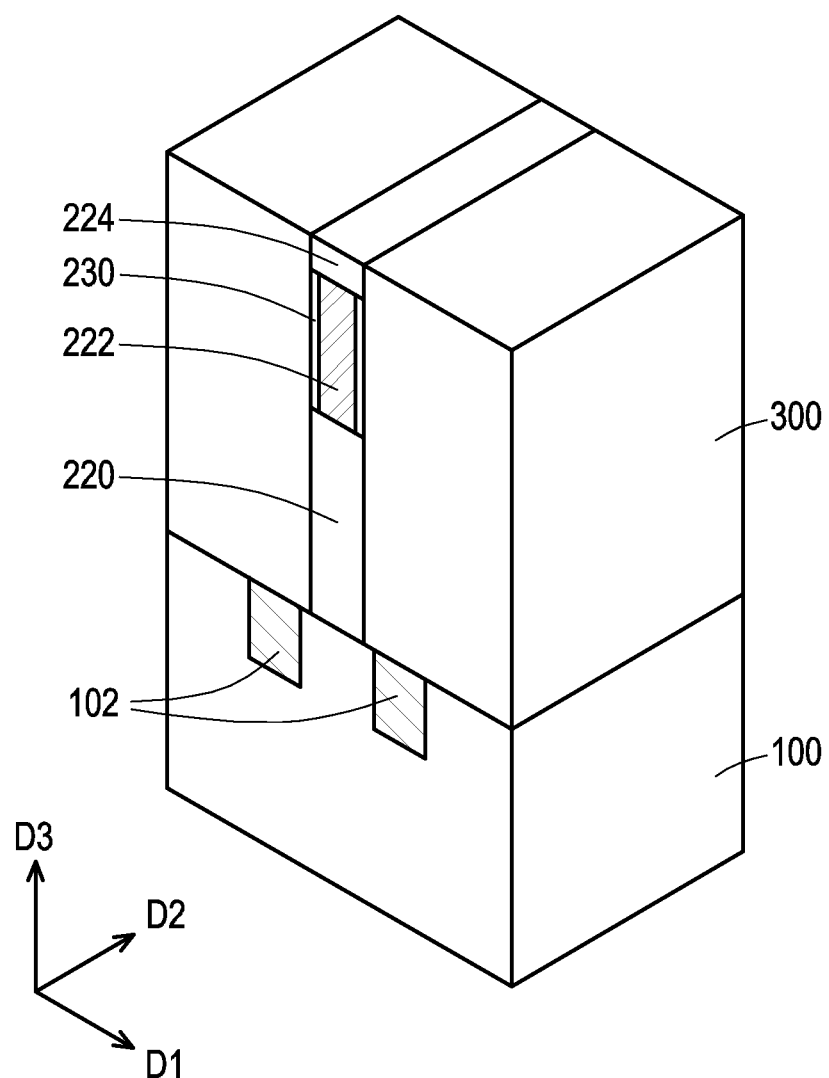
Figures 2, 4E:
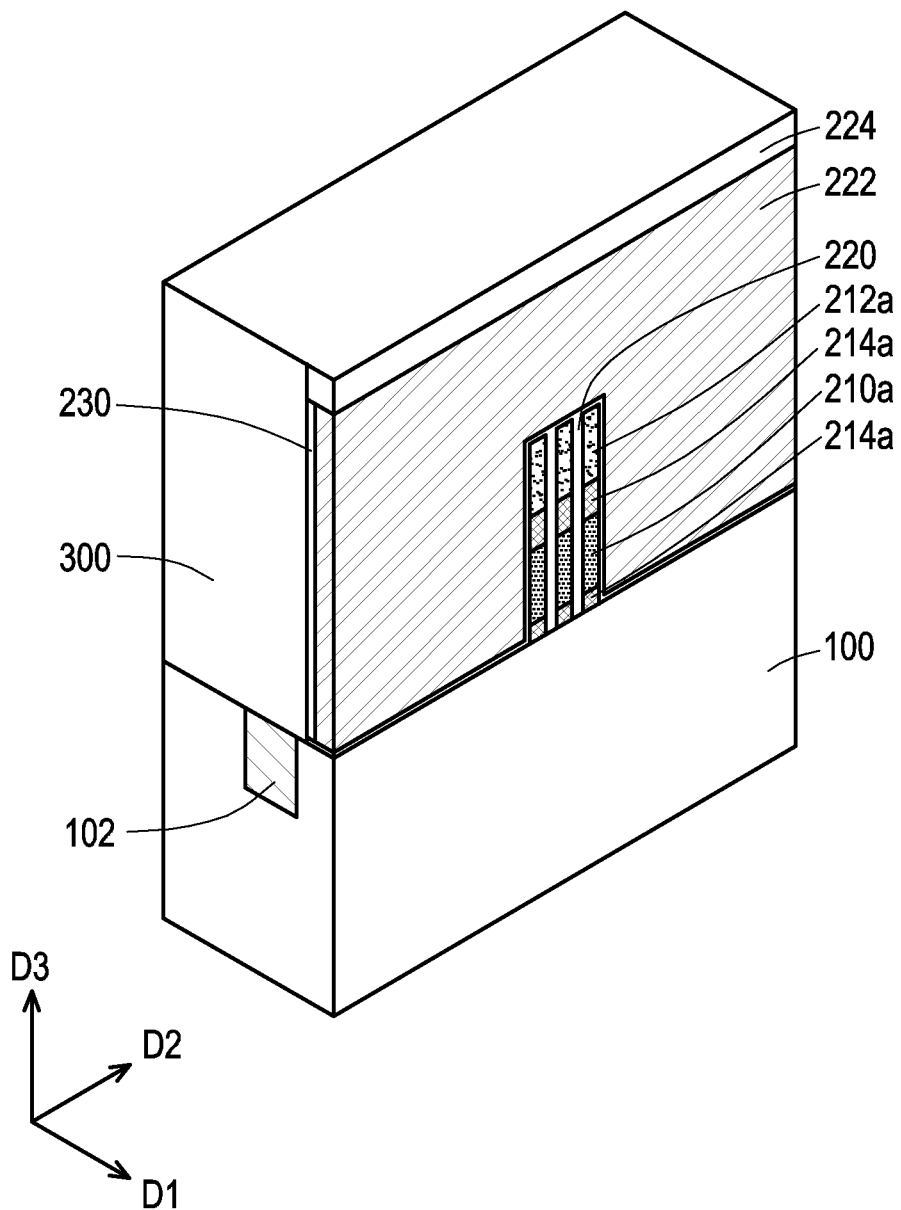
Figure 4F:
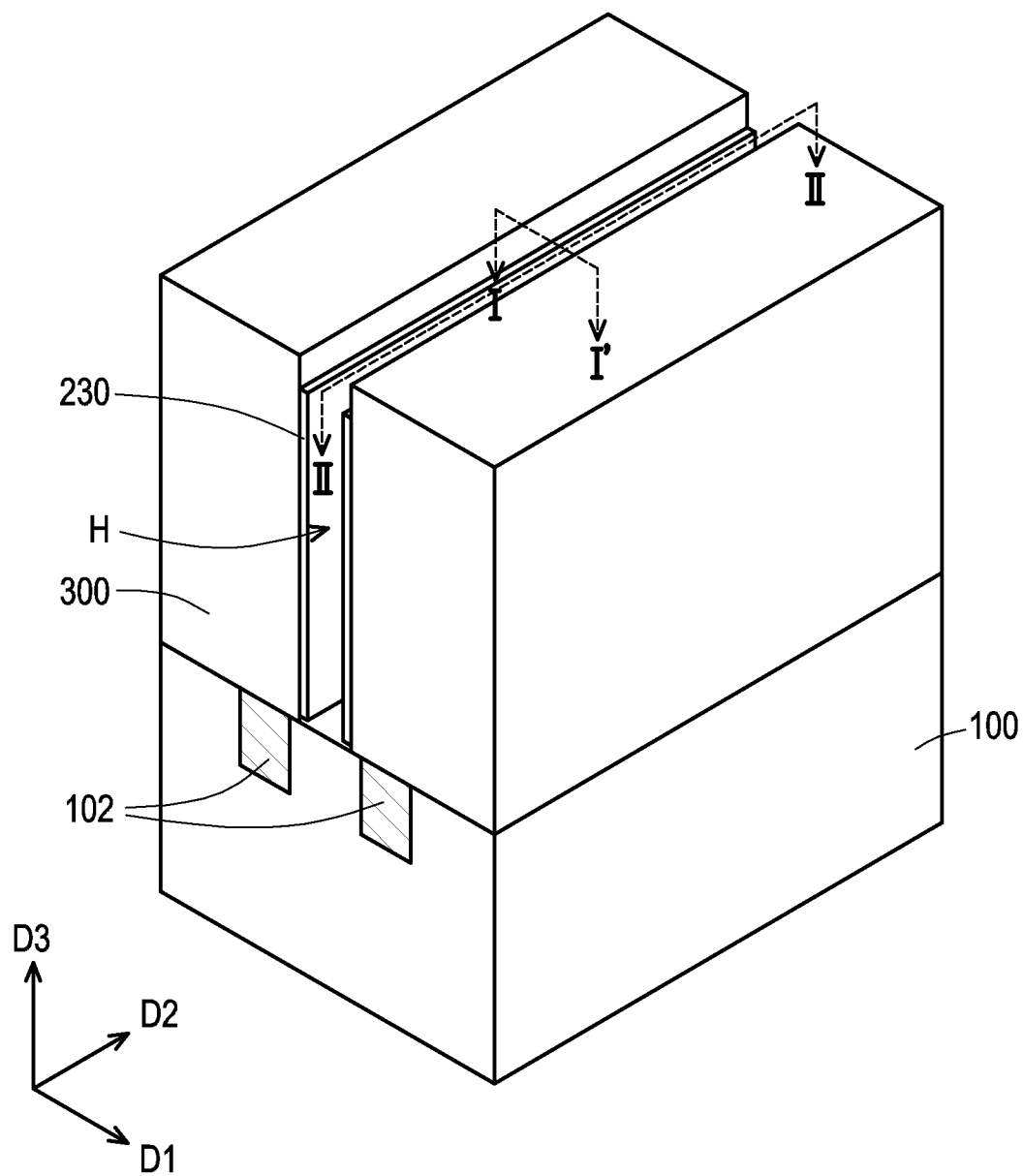
Figures 1, 4F:
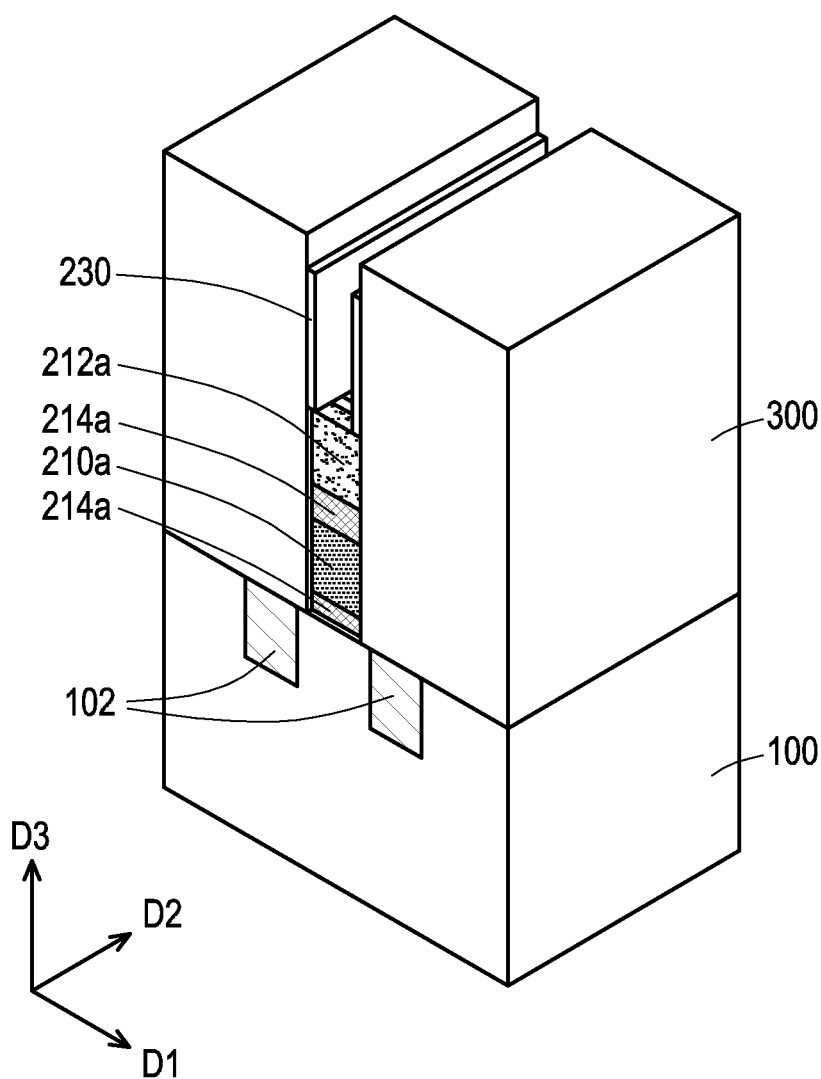
Figures 2, 4F:
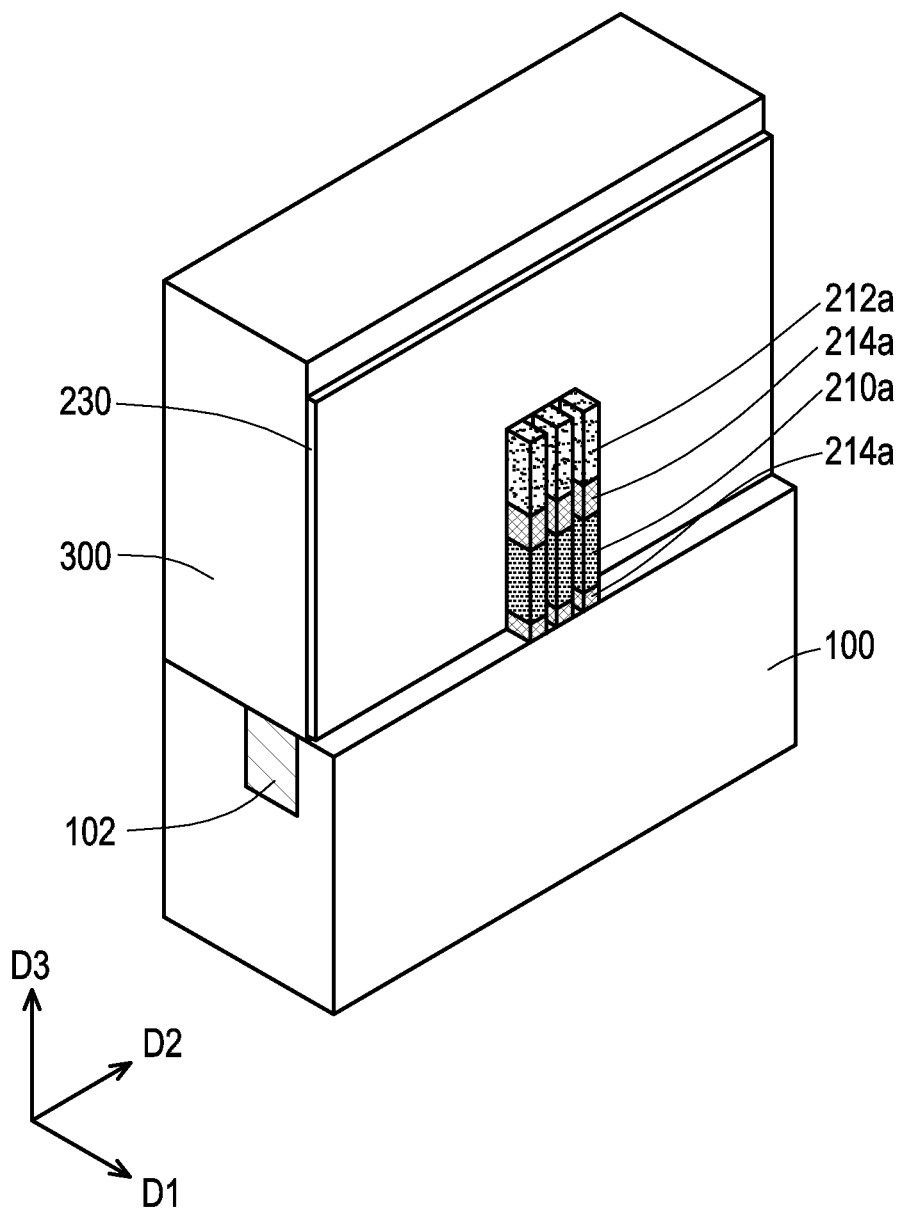
Figure 4G:
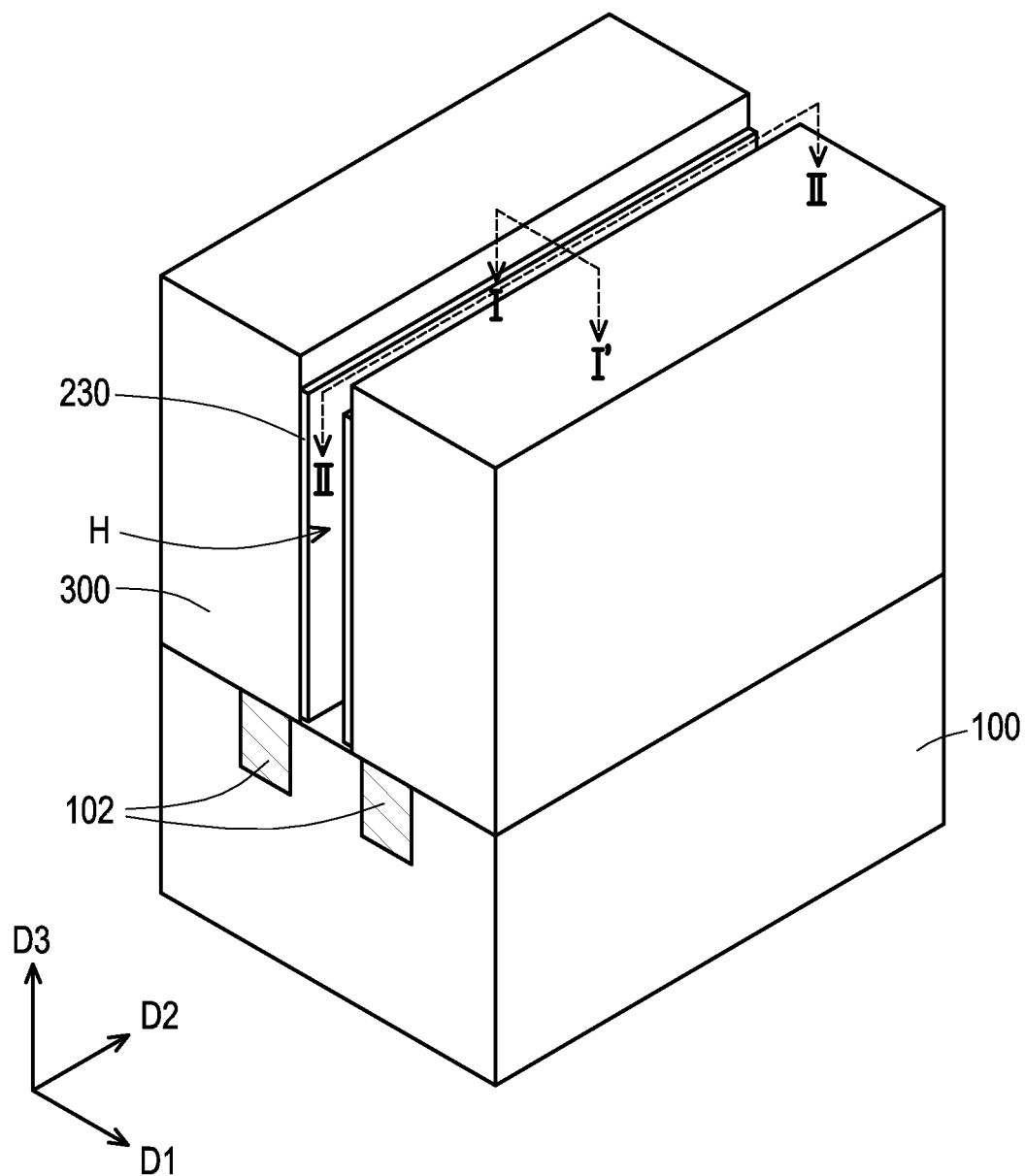
Figures 1, 4G:
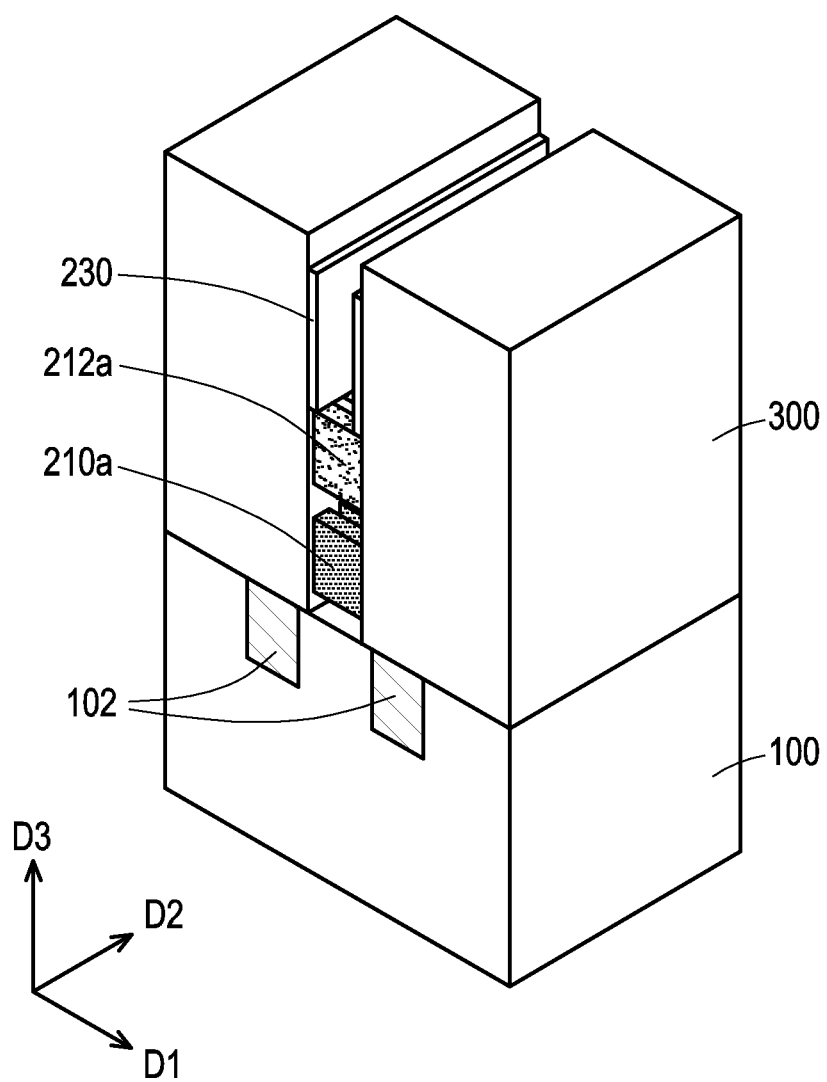
Figures 2, 4G:
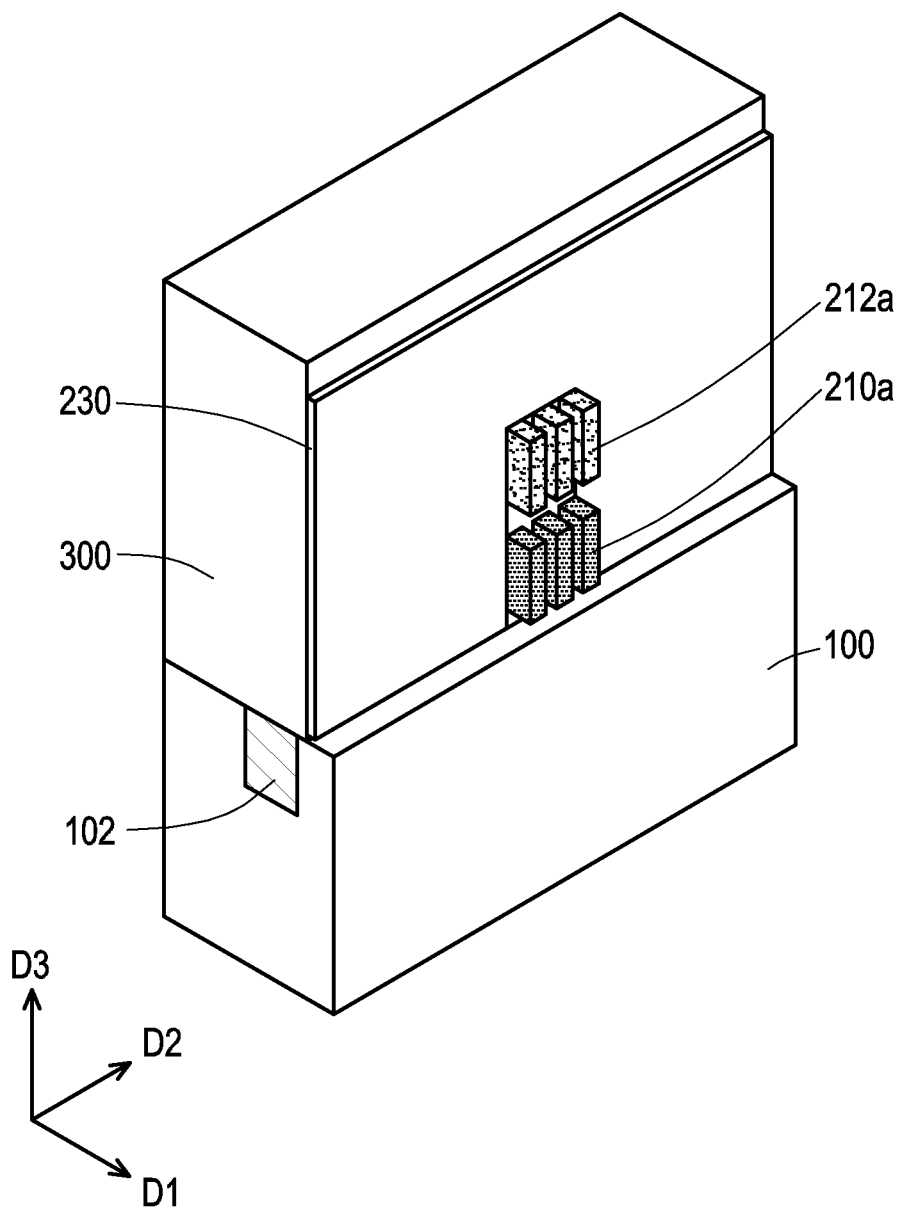
Figure 4H:
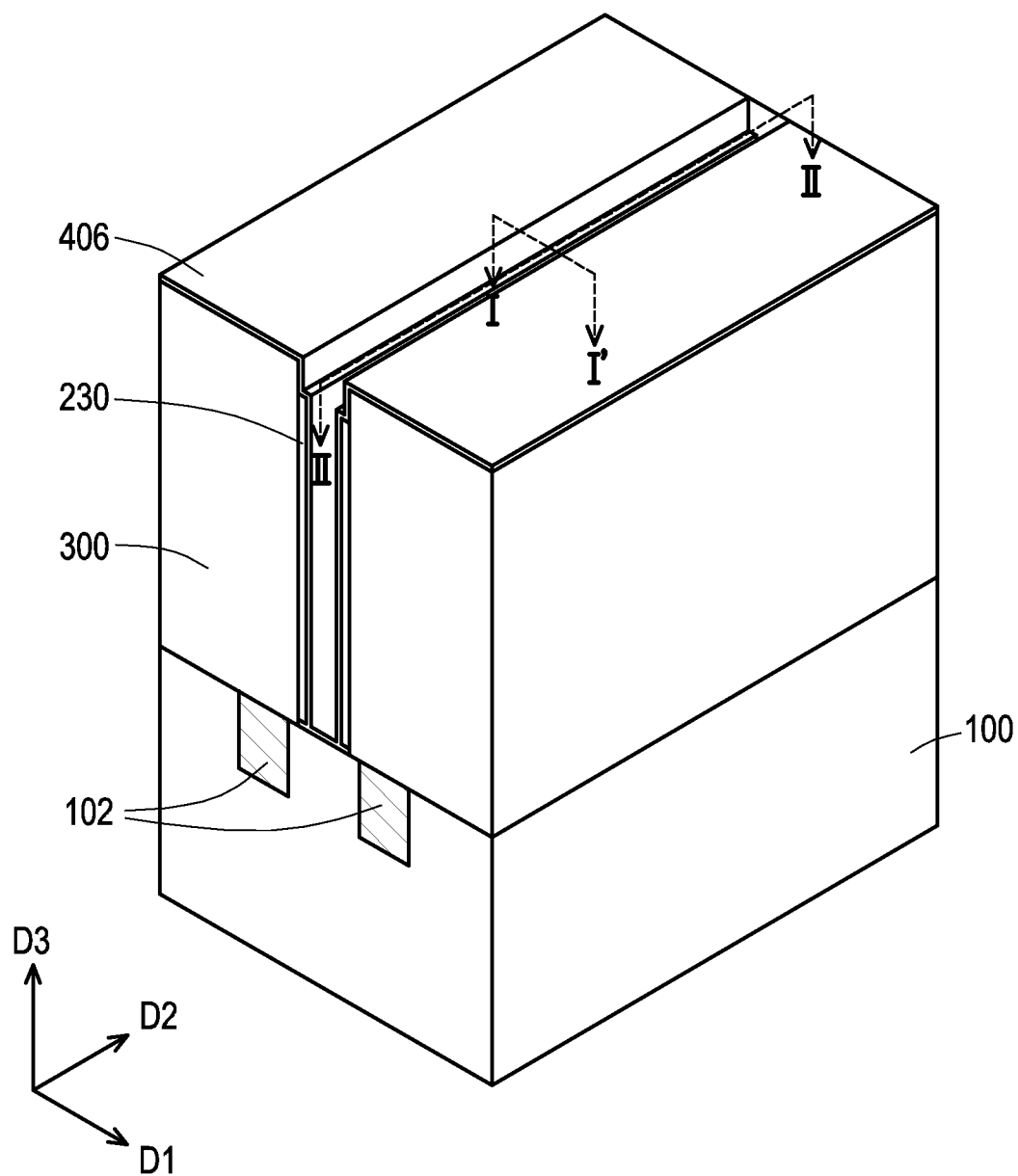
Figures 1, 4H:
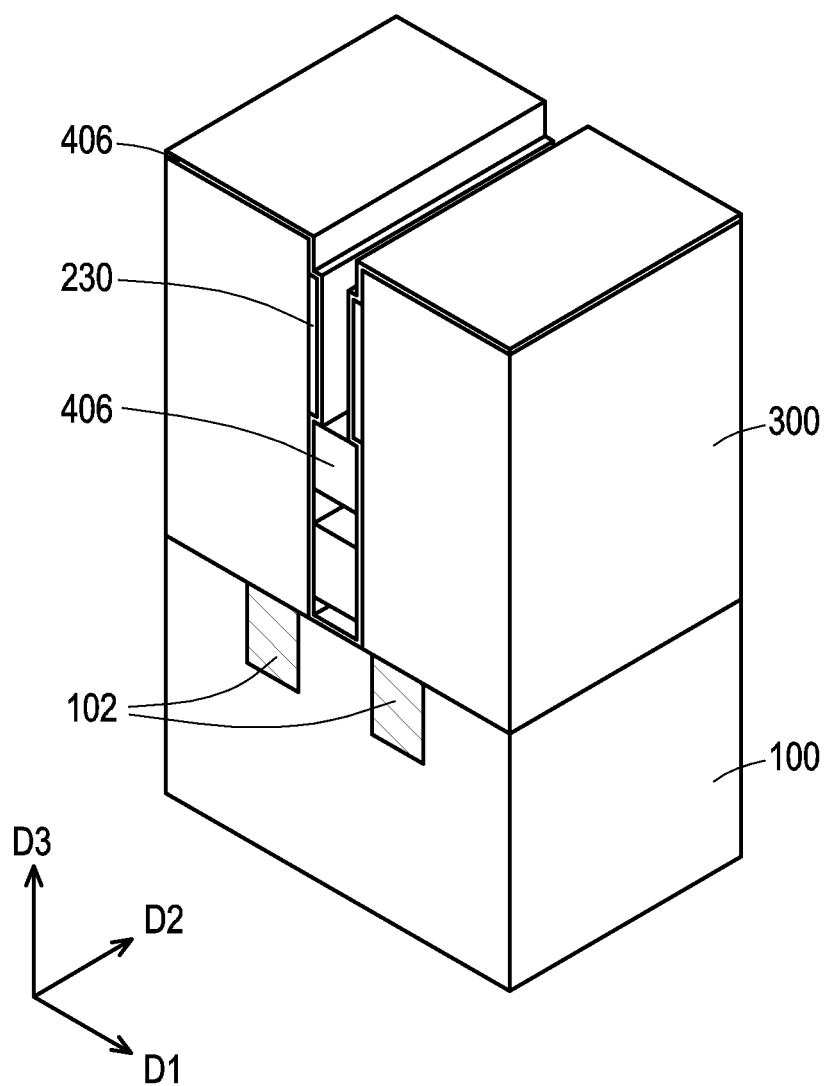
Figures 2, 4H:
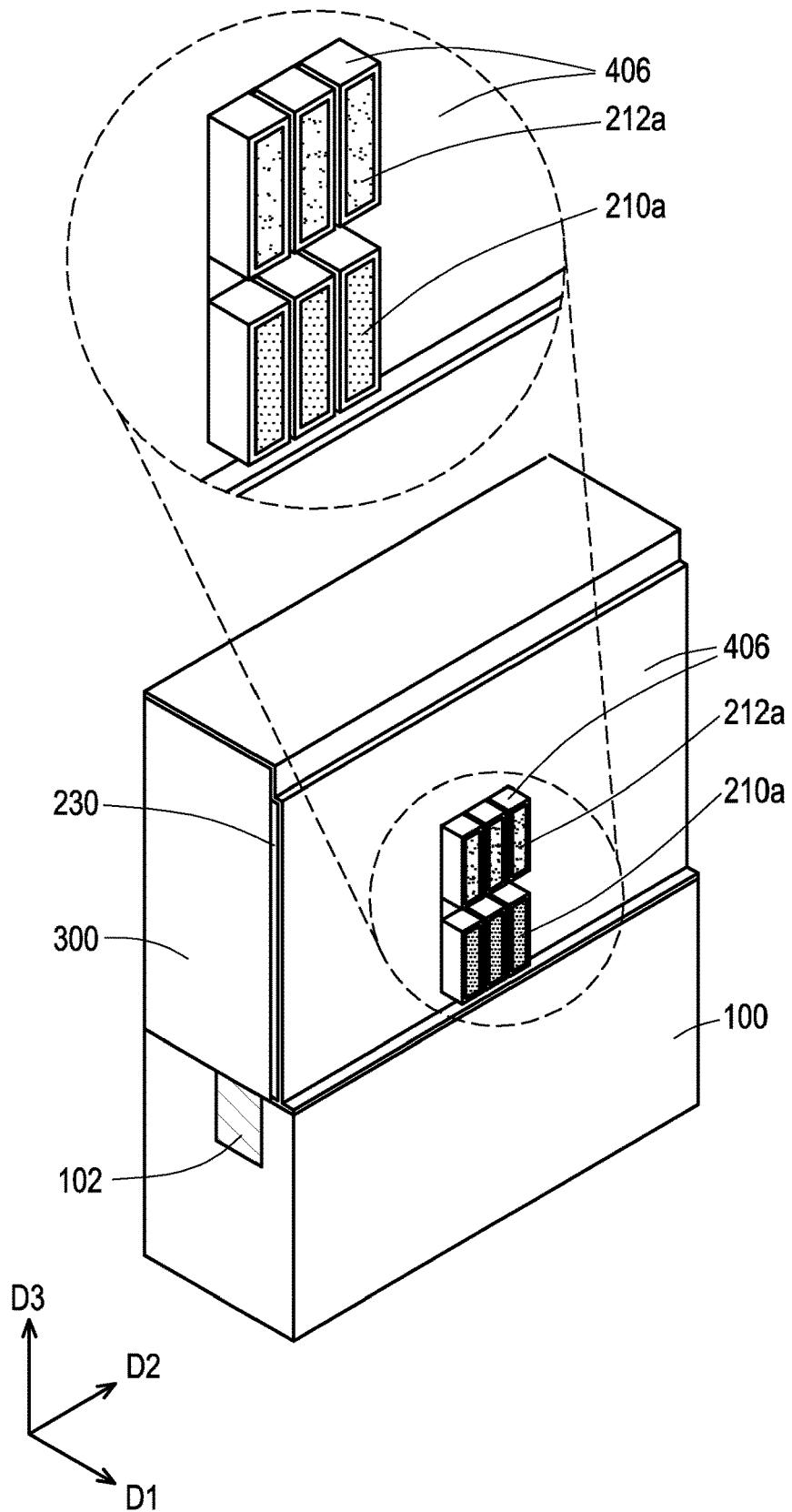
Figure 4I:
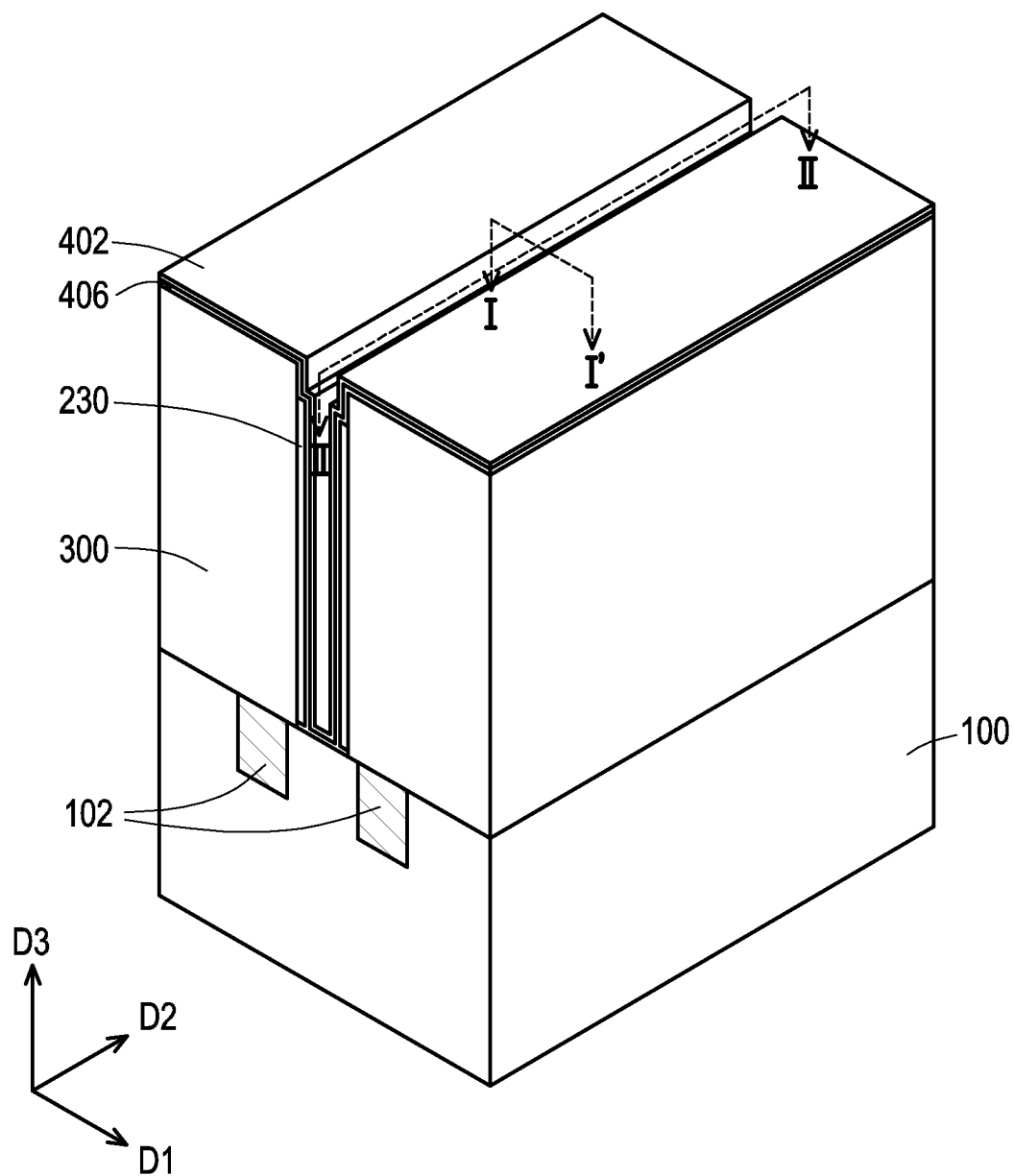
Figures 1, 4I:
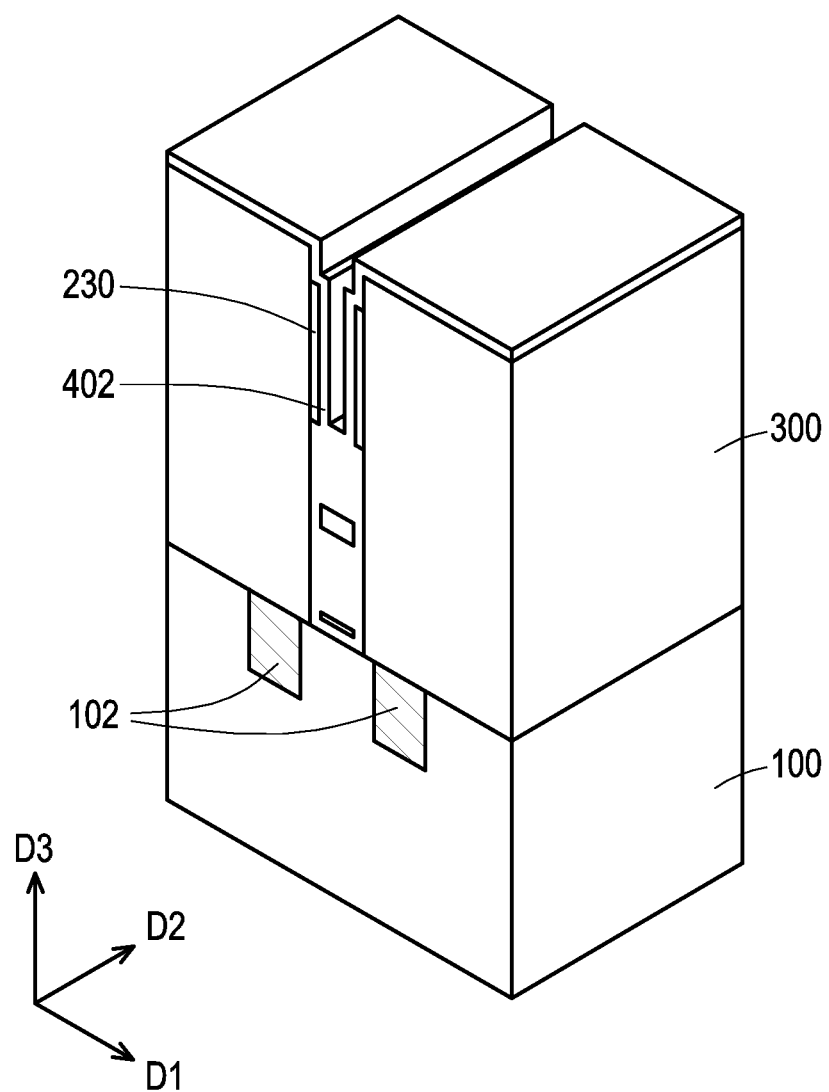
Figures 2, 4I:
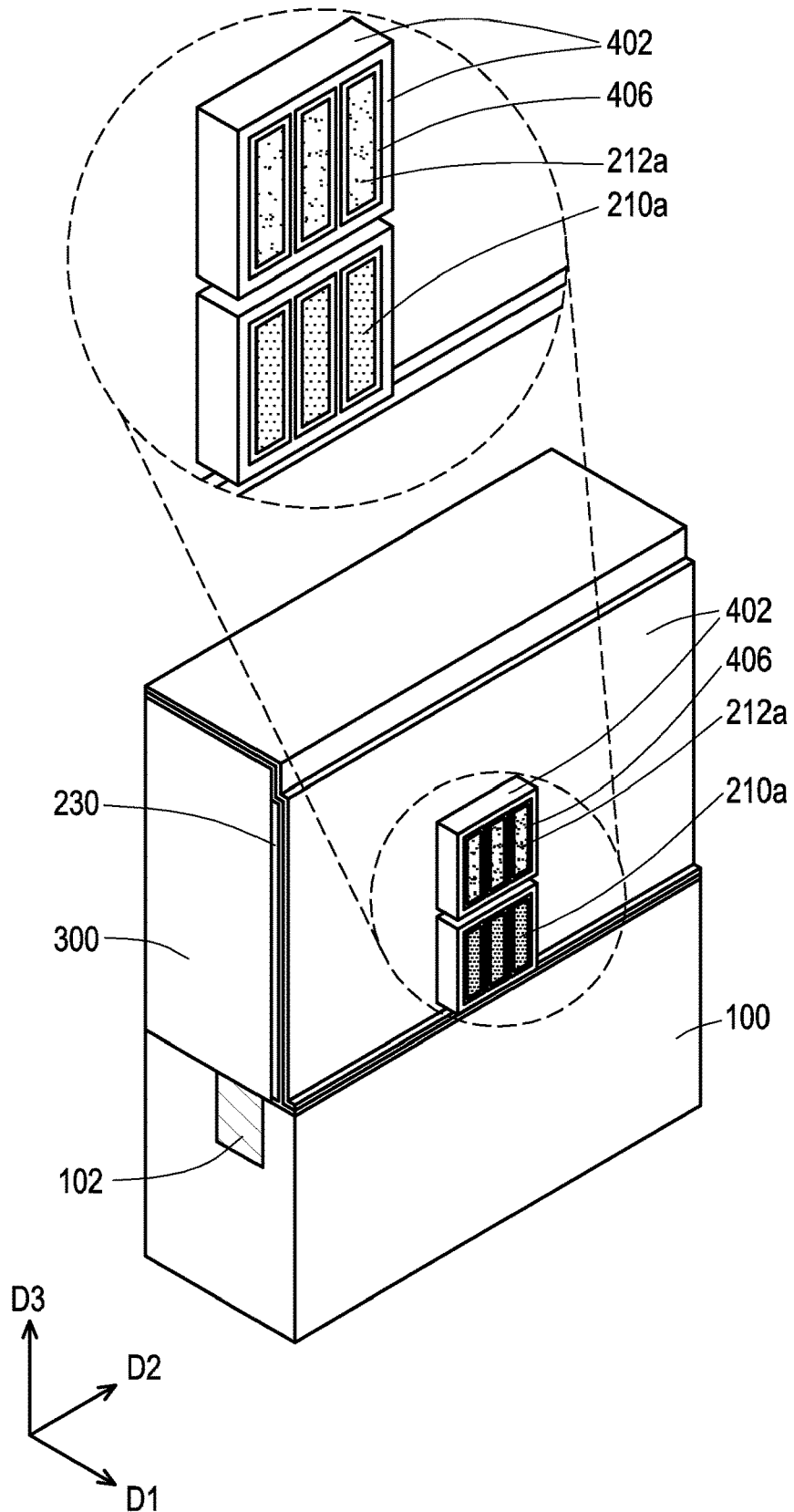
Figure 4J:
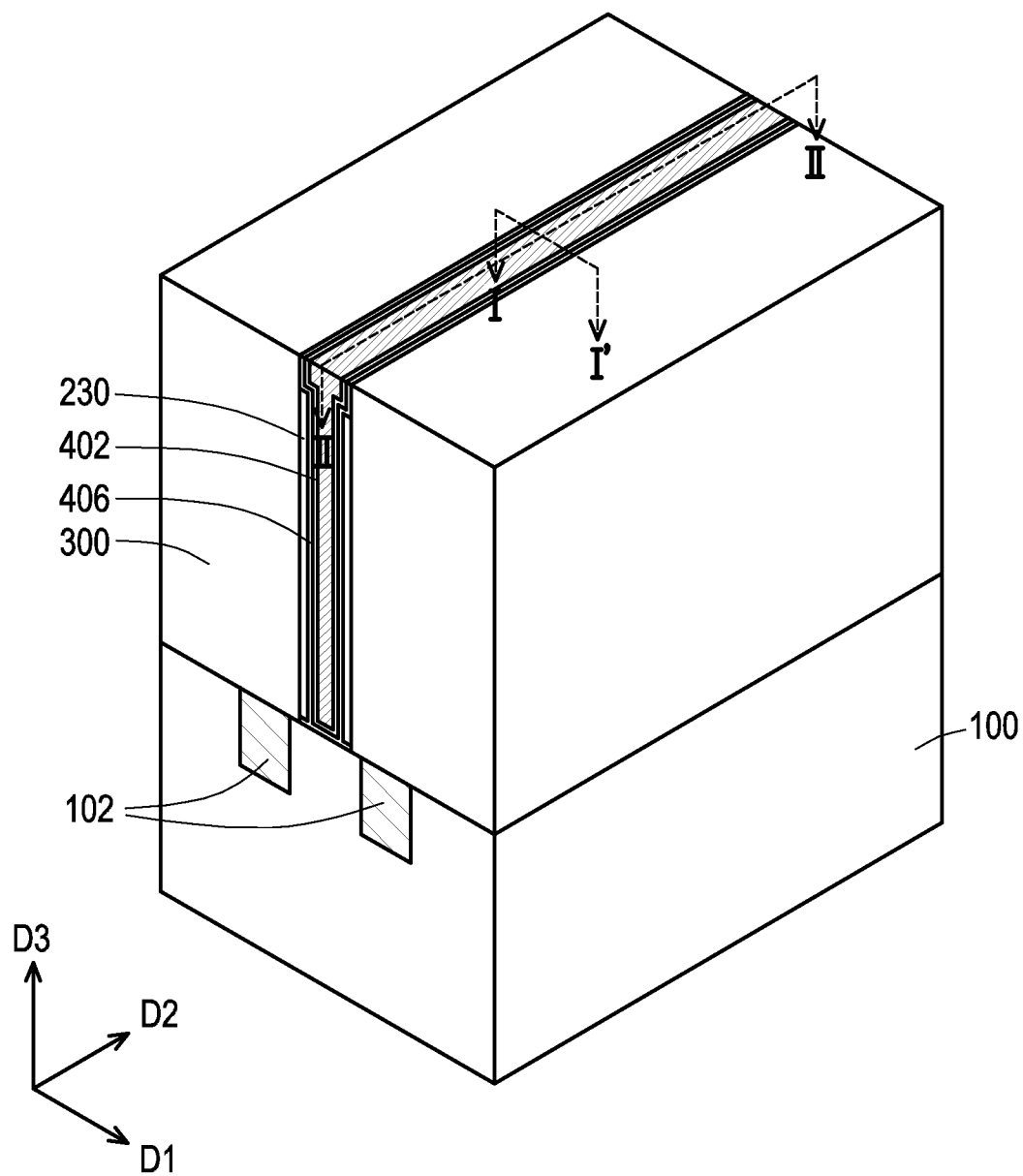
Figures 1, 4J:
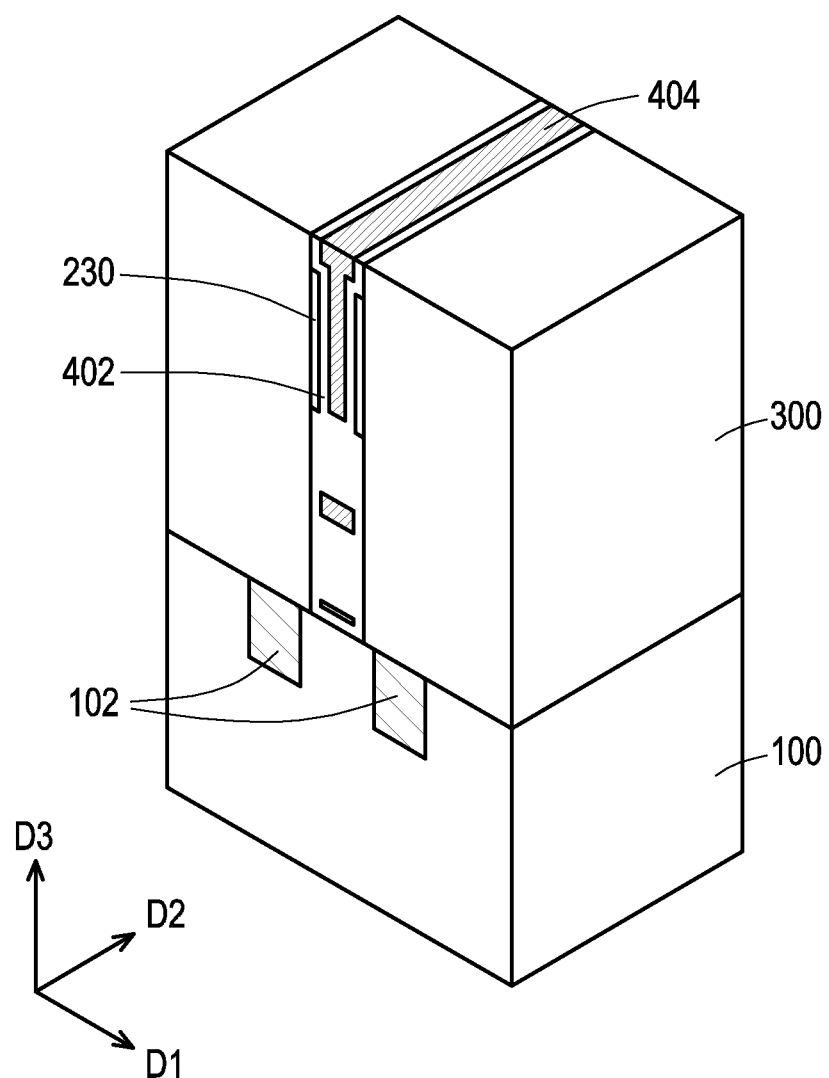
Figures 2, 4J:
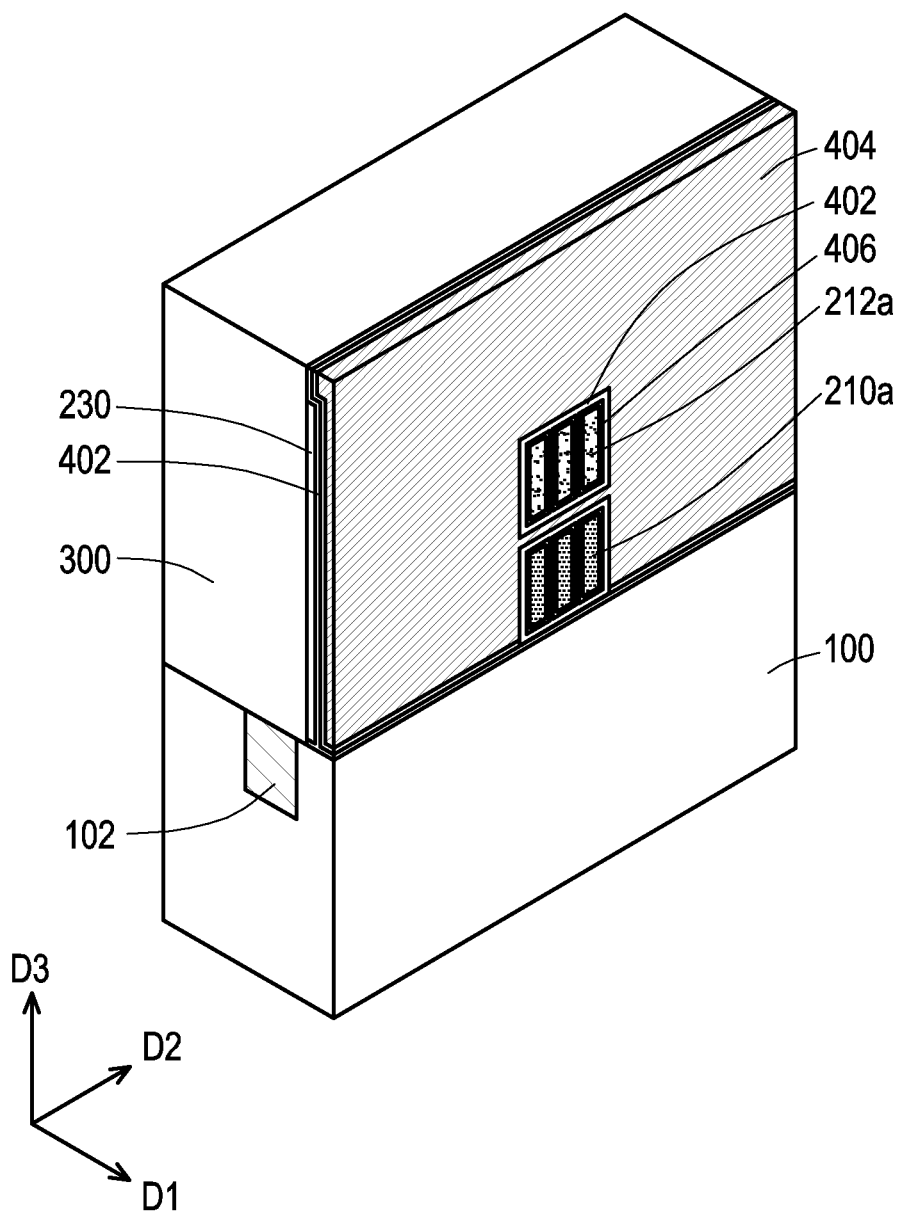
Figure 4K:
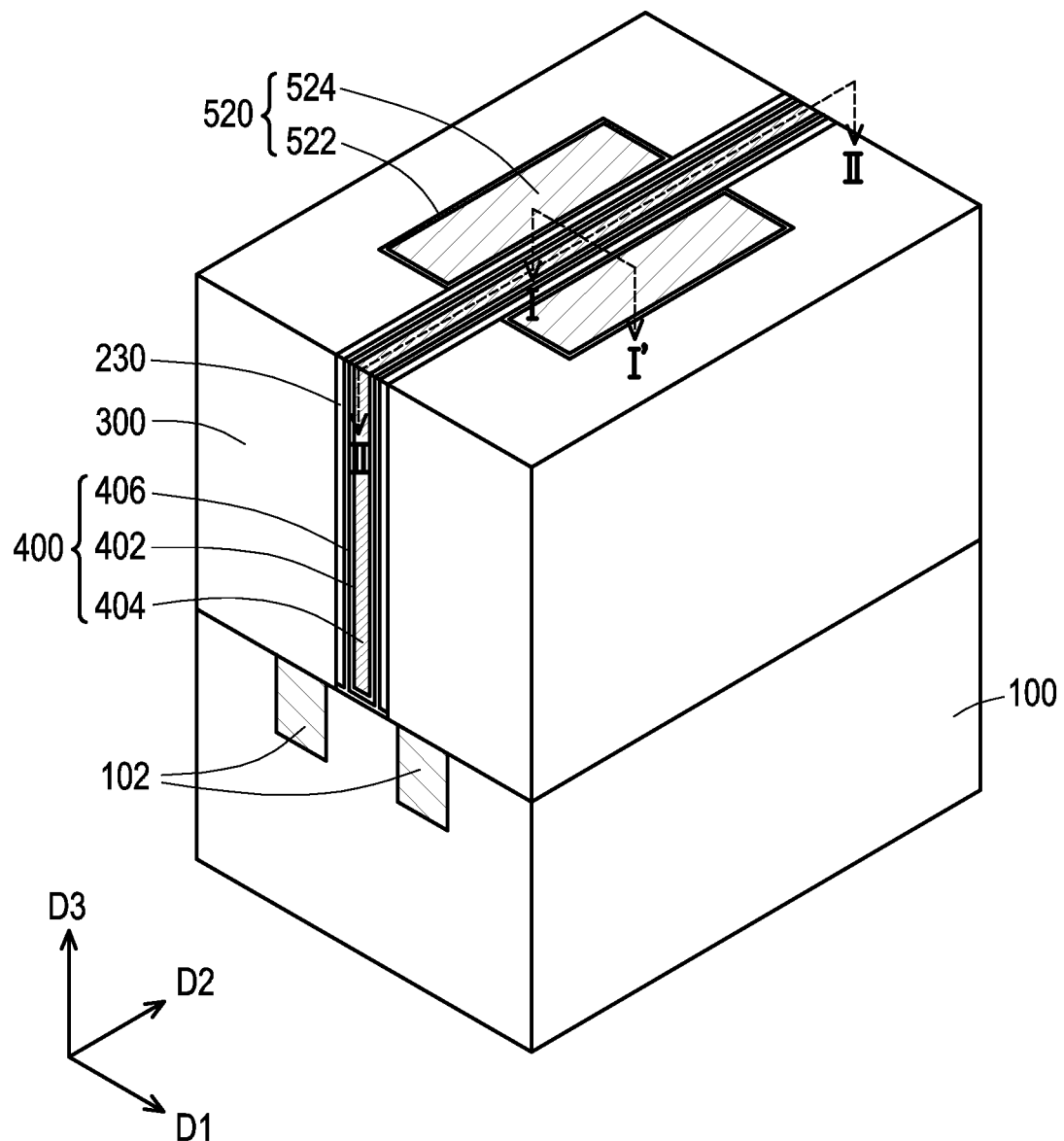
Figures 1, 4K:
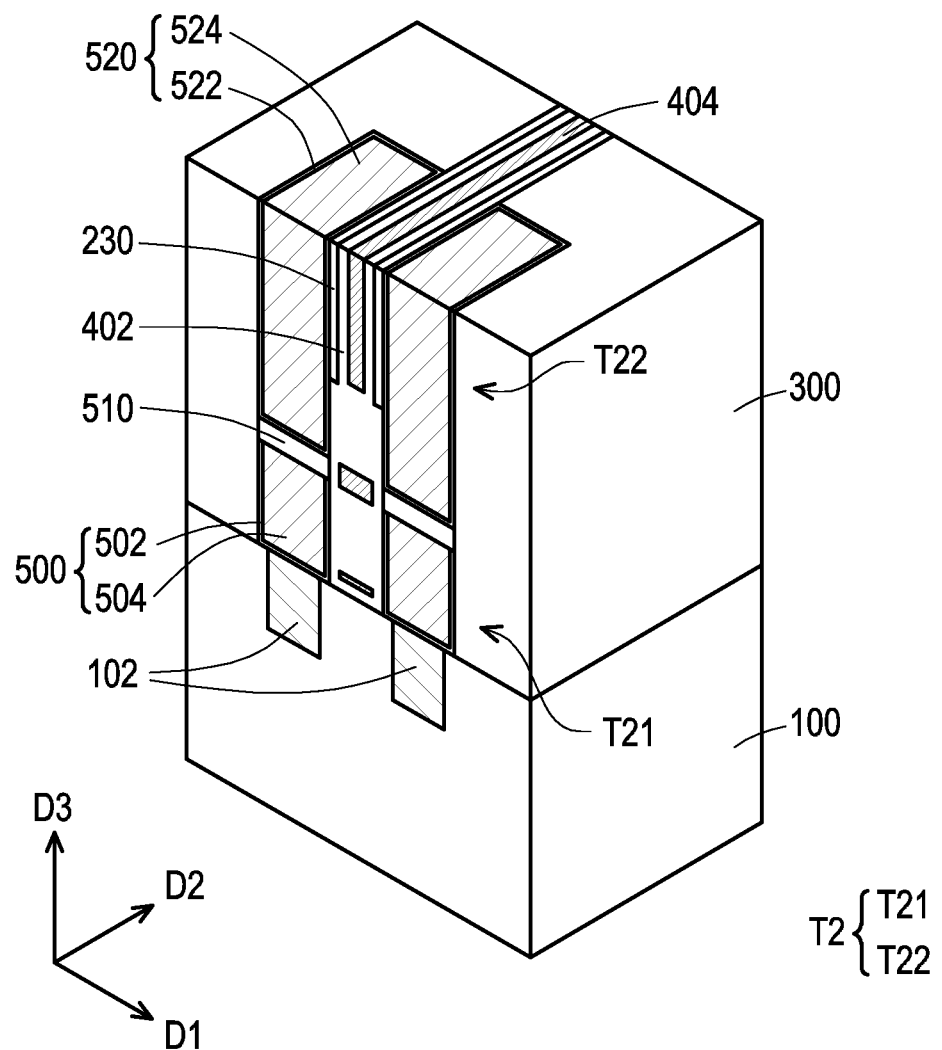
Figures 2, 4K:
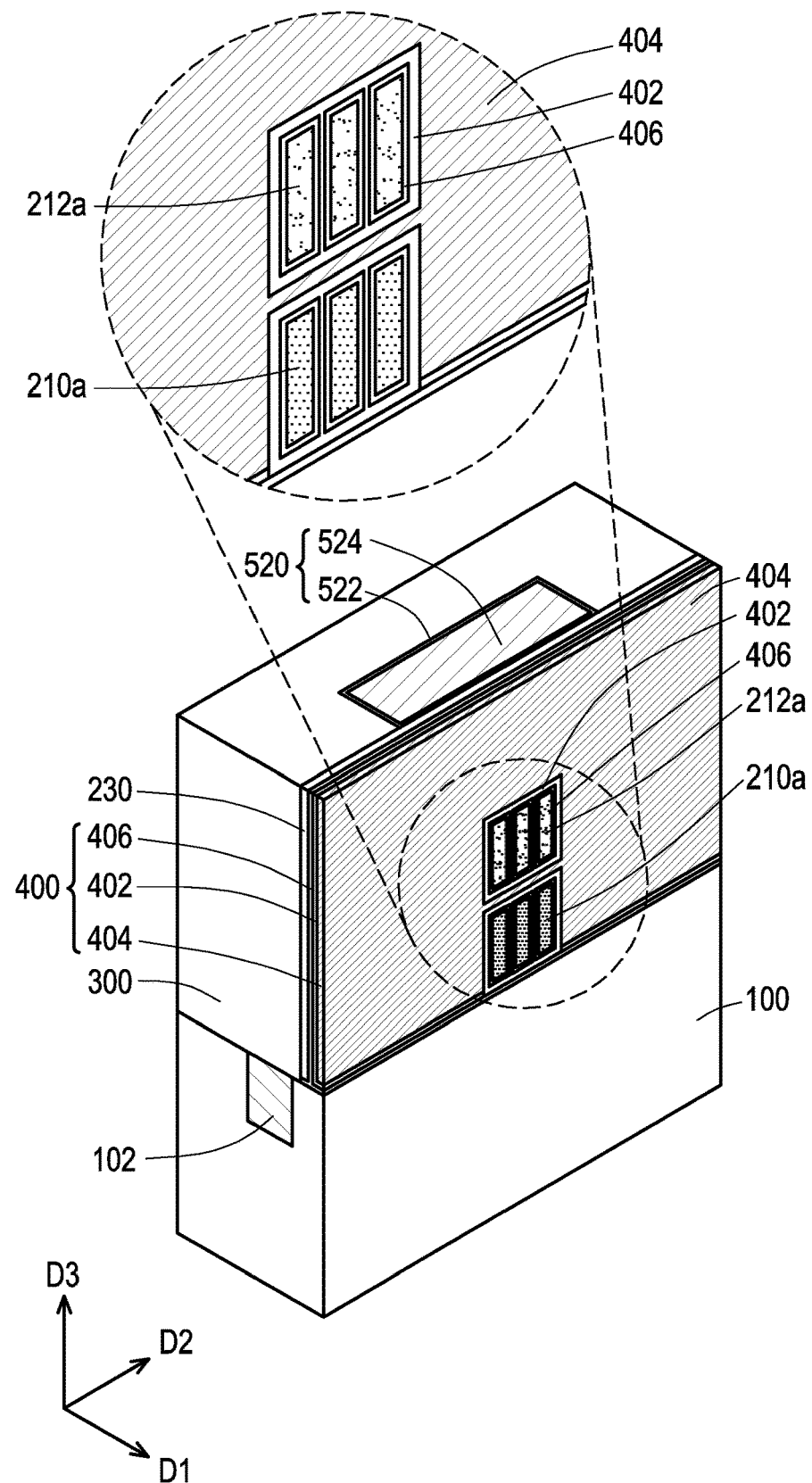

FIG. 4A to FIG. 4K are three dimensional views illustrating various stages of a manufacturing method of a transistor. FIG. 4C-1 and FIG. 4E-1 to FIG. 4K-1 are cross-sectional views taken along cross section line I-I' in FIG. 4C and FIG. 4E to FIG. 4K. FIG. 4E-2 to FIG. 4K-2 are cross-sectional views taken along cross section line II-II' in FIG. 4E to FIG. 4K. It is noted that the material and forming method of elements having the same reference numerals as the previous embodiment may be substantially the same as those of the previous embodiments, so the detailed descriptions thereof are omitted herein.

Referring to FIG. 4A, a stack LS is formed on a dielectric layer 100. In some embodiments, the stack LS includes a first material layer 210, a second material layer 212 and a plurality of third material layers 214. In some embodiments, the third material layers 214 are disposed between the first material layer 210 and the second material layer 212 and between the dielectric layer 100 and the first material layer 210. In some embodiments, the third material layer 214 is formed on the dielectric layer 100, the first material layer 210 is formed on the third material layer 214, the third material layer 214 is formed on the first material layer 210, and the second material layer 212 is formed on the third material layer 214. Then, a patterned resist layer 226 is formed on the stack LS.

Referring to FIG. 4B, by using the patterned resist layer 226 as a mask, the stack LS is patterned, to form a plurality of stacks LS'. In some embodiments, each stack LS' includes a patterned first material layer 210, a patterned second material layer 212 and a plurality of patterned third material layers 214. In some embodiments, each stack LS' is extended along the first direction D1. In some embodiments, the stacks LS' are arranged in the second direction D2, and the stacks LS' are separated from each other with gaps therebetween. Then, the patterned resist layer 226 is removed.

Referring to FIG. 4C and FIG. 4C-1, a dummy gate dielectric layer 220, a dummy gate 222, a patterned mask layer 224 and a patterned resist layer 226 and are sequentially formed on the stacks LS' of FIG. 4B. Then, by using the dummy gate dielectric layer 220, the dummy gate 222 and the patterned mask layer 224 as a mask, the stacks LS' are patterned to form a plurality of stacking structures GS. In some embodiments, a dummy gate dielectric material (not shown), a dummy gate material (not shown) and a mask material (not shown) are sequentially formed over the stacks LS' of FIG. 4B. The dummy gate dielectric material is conformally formed on the exposed surfaces of the dielectric layer 100 and the stack LS', and the dummy gate dielectric material fills up the gaps between the stack LS', for example. The dummy gate material is conformally formed on the exposed surfaces of the dummy gate dielectric material, for example. Then, the mask material is patterned by using the patterned resist layer 226 as a mask to form a patterned mask layer 224. In some embodiments, the patterned mask layer 224 crosses over portions of the stacks LS'. After that, by using the patterned mask layer 224 as a mask, the dummy gate dielectric material and the dummy gate material are patterned to form the dummy gate dielectric layer 220 and the dummy gate 222.

In some embodiments, after the dummy gate 222 is formed, side portions of the dummy gate 222 are partially removed by an etching process, to reduce a width of the dummy gate 222. Then, by using the dummy gate dielectric layer 220, the dummy gate 222 and the patterned mask layer 224 as a mask, the stacks LS' are patterned to form a plurality of stacking structures GS. Each stacking structure GS includes a first nanosheet 210a, a second nanosheet 212a, a plurality of third nanosheets 214a respectively between the first nanosheet 210a and the dielectric layer 100 and between the first nanosheet 210a and the second nanosheet 212a, for example. The dummy gate dielectric layer 220 covers exposed surfaces of the stacks LS', for example. In some embodiments, gaps between the stacking structures GS are filled up with the dummy gate dielectric layer 220. In some embodiments, a width of the formed stacking structure GS in the first direction D1 is larger than a width of the dummy gate 222 and substantially the same as the formed stacking structure GS in the first direction D1. For example, side surfaces of the formed stacking structure GS and the formed stacking structure GS are substantially coplanar. However, the disclosure is not limited thereto.

Referring to FIG. 4D, a pair of spacers 230 is formed on exposed sidewalls of the dummy gate 222. In some embodiments, a spacer material is conformally formed on exposed surfaces (e.g., the side surfaces and the top surfaces) of the patterned resist layer 226, the patterned mask layer 224, the dummy gate 222, the dummy gate dielectric layer 220, the stacking structures GS and the dielectric layer 100, and portions of the spacer material on the patterned resist layer 226, the patterned mask layer 224, the dummy gate dielectric layer 220, the stacking structures GS and the dielectric layer 100 are removed such as a straight etch process. Thus, the remained portions of the spacer material on the sidewalls of the dummy gate 222 may form the spacers 230. In some embodiments, outer sidewalls of the spacers 230 are substantially flush with outer sidewalls of the stacking structures GS and outer sidewalls of the dummy gate dielectric layer 220.

Referring to FIG. 4E, FIG. 4E-1 and FIG. 4E-2, a dielectric layer 300 is formed over the dielectric layer 100 to surround the stacking structures GS, the dummy gate dielectric layer 220, the dummy gate 222, the patterned mask layer 224 and the spacers 230. In some embodiments, a top surface of the dielectric layer 300 is substantially coplanar with a top surface of the patterned mask layer 224.

Referring to FIG. 4F, FIG. 4F-1 and FIG. 4F-2, the patterned mask layer 224, the dummy gate 222 and the dummy gate dielectric layer 220 are removed to form a hollow H. The patterned mask layer 224, the dummy gate 222 and the dummy gate dielectric layer 220 may be removed by an etching process. In some embodiments, as shown in FIG. 4F-2, the hollow H includes gaps between the stacking structures GS since the dummy gate dielectric layer 220 filling up the gaps between the stacking structures GS are removed. In some embodiments, as shown in FIG. 4F-1 and FIG. 4F-2, top surfaces and side surfaces of the stacking structures GS are exposed by the hollow H.

Referring to FIG. 4G, FIG. 4G-1 and FIG. 4G-2, the third nanosheets 214a in the stacking structures GS are removed. The third nanosheets 214a may be removed by an etching process. In some embodiments, after removal of third nanosheets 214a, the hollow H further includes gaps between the first nanosheet 210a and the second nanosheet 212a and between the first nanosheet 210a and the dielectric layer 100. Accordingly, as shown in FIG. 4G-1 and FIG. 4G-2, top and bottom surfaces and side surfaces of the first nanosheets 210a and the second nanosheets 212a are exposed by the hollow H.

Referring to FIG. 4H, FIG. 4H-1 and FIG. 4H-2, a gate dielectric layer 406 is formed on exposed surfaces of the hollow H. For example, the gate dielectric layer 406 is conformally formed over the dielectric layer 100 to cover exposed surfaces of the first nanosheet 210a, the second nanosheet 212a, the dielectric layer 100, the spacers 230 and the dielectric layer 300. In some embodiments, the gate dielectric layer 406 covers the top and bottom surfaces and the side surfaces of the first nanosheets 210a and the second nanosheets 212 and the exposed surfaces of the dielectric layer 100, the spacers 230 and the dielectric layer 300. In some embodiments, as shown in FIG. 4H-2, the gate dielectric layer 406 wraps around the first nanosheet 210a and the second nanosheet 212a respectively without filling up the gaps between the first nanosheet 210a and the second nanosheet 212a, between the adjacent first nanosheets 210a and between the adjacent second nanosheets 212a. In other words, after forming the gate dielectric layer 406, the gaps remain between the first nanosheet 210a and the second nanosheet 212a, between the adjacent first nanosheets 210a and between the adjacent second nanosheets 212a, for example.

Referring to FIG. 4I, FIG. 4I-1 and FIG. 4I-2, a barrier layer 402 is formed over the gate dielectric layer 406 in the hollow H. For example, the barrier layer 402 is conformally formed on the gate dielectric layer 406 over the first nanosheet 210a, the second nanosheet 212a, the dielectric layer 100, the spacers 230 and the dielectric layer 300. In some embodiments, as shown in FIG. 4I-2, the barrier layer 402 surrounds the adjacent first nanosheets 210a and surrounds the adjacent second nanosheets 212a, and the barrier layer 402 fills up the gaps between the adjacent first nanosheets 210a and between the adjacent second nanosheets 212a. In other words, a portion of the barrier layer 402 continuously surrounds the adjacent first nanosheets 210a, and a portion of the barrier layer 402 continuously surrounds the adjacent second nanosheets 212a, for example. In some embodiments, after forming the barrier layer 402, the gaps between the first nanosheet 210a and the second nanosheet 212a remain. A material of the barrier layer 402 includes TiN, TaN, TiSiN, TaSiN, WSiN, TiC, TaC, TiAlC, TaAlC, TiAlN, TaAlN, or a combination thereof, for example. The barrier layer 402 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof.

Referring to FIG. 4J, FIG. 4J-1 and FIG. 4J-2, a conductive layer 404 is formed over the barrier layer 402 to fill up the hollow H. In some embodiments, the conductive layer 404 is formed on the barrier layer 402 to fill up the hollow H. Then, portions of the conductive layer 404, the barrier layer 402 and the gate dielectric layer 406 may be removed by a planarization process such as a mechanical grinding process, a chemical mechanical polishing (CMP) process, or the like. Thus, top surfaces of the conductive layer 404, the barrier layer 402 and the gate dielectric layer 406 are substantially coplanar with the top surface of the dielectric layer 300, for example. In some embodiments, the conductive layer 404 fills up the gaps between the adjacent first nanosheet 210a and second nanosheet 212a.

Referring to FIG. 4K, FIG. 4K-1 and FIG. 4K-2, a gate structure 400, first and second source/drain regions 500 and 520 aside the gate structure 400 and insulating layers 510 between the first and second source/drain regions 500 and 520 are formed. In some embodiments, the first source/drain regions 500 are formed aside the first nanosheets 210a, and the second source/drain regions 520 are formed aside the second nanosheets 212a. In some embodiments, during the formation of the second source/drain regions 520, the gate dielectric layer 406, the barrier layer 402 and the conductive layer 404 are partially removed, to form the gate structure 400. In some embodiments, as shown in FIG. 4K-2, the conductive layer 404 is continuously disposed between the first nanosheets 210a and the second nanosheets 212a.

After the first source/drain regions 500 and the second source/drain regions 520 are formed, the formation of the second transistor T2 is substantially completed. In some embodiments, the second transistor T2 includes a first conductive type transistor T21 and a second conductive type transistor T22. The first conductive type transistor T21 may include the gate structure 400, the first nanosheets 210a arranged in the second direction D2 (e.g., horizontal direction), and the first source/drain regions 500 at opposite sides of the first nanosheets 210a, and the second conductive type transistor T22 may include the gate structure 400, the second nanosheets 212a arranged in the second direction D2 (e.g., horizontal direction) and the second source/drain regions 520 at opposite sides of the second nanosheets 212a. In some embodiments, the second nanosheets 212a are stacked over the first nanosheets 210a along the third direction (e.g., vertical direction). In some embodiments, the gate structure 400 serves as a common gate for the first conductive type transistor T21 and the second conductive type transistor T22.

Figure 5:
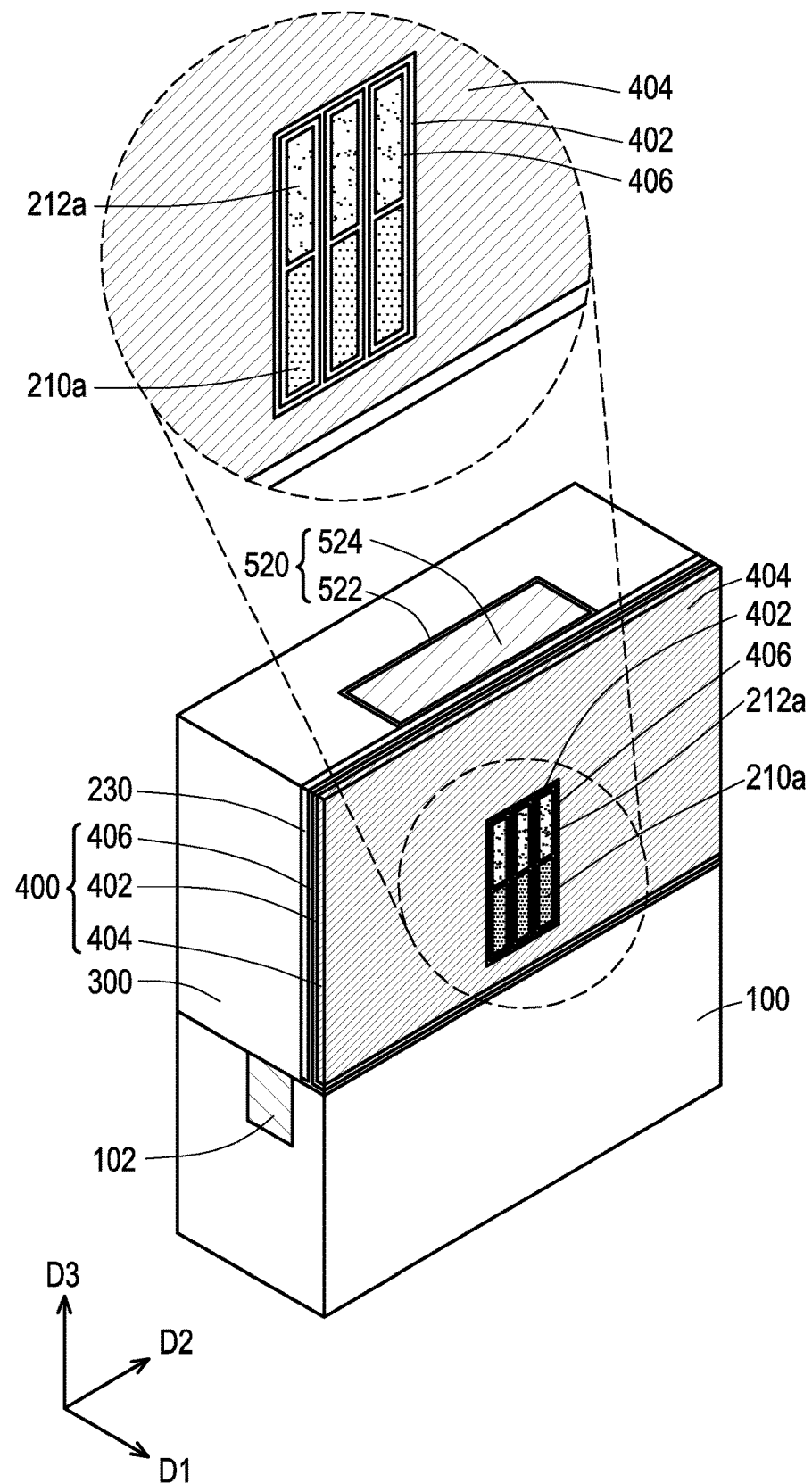
FIG. 5 is a cross-sectional view of a transistor in accordance with some alternative embodiments of the disclosure.

In some embodiments, the gaps between the adjacent first and second nanosheets 210a and 212a are not filled up by the gate dielectric layer 406, and thus the barrier layer 402 and the conductive layer 404 may be respectively disposed between the adjacent first and second nanosheets 210a and 212a. However, the disclosure is not limited thereto. In some alternative embodiments, as shown in FIG. 5, the gate dielectric layer 406 may fill up the gaps between the adjacent first and second nanosheets 210a and 212a. In such embodiments, a portion of the barrier layer 402 may continuously surround the first and second nanosheets 210a and 212a. Furthermore, in some alternative embodiments, the gate dielectric layer 406 may also fill up the gaps between the adjacent first nanosheets 210a and the gaps between the adjacent second nanosheets 212a. In such embodiments, the barrier layer 402 is not disposed between the adjacent first nanosheets 210a and between the adjacent second nanosheets 212a. In some alternative embodiments, the gaps between the adjacent first and second nanosheets 210a and 212a are filled up by the barrier layer 402 rather than the gate dielectric layer 406. In such embodiments, the conductive layer 404 is not disposed between the adjacent first and second nanosheets 210a and 212a.

Figure 6:
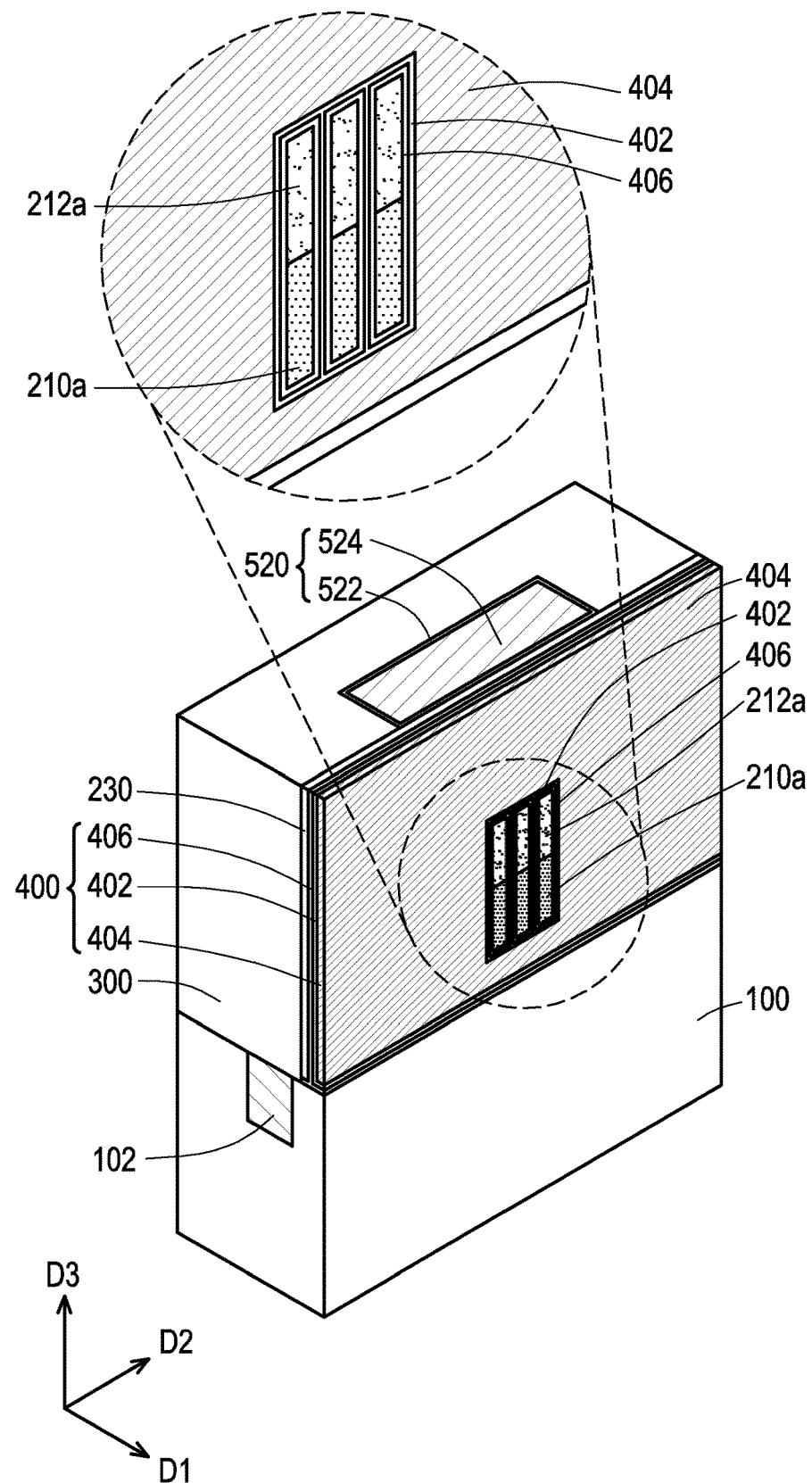
FIG. 6 is a cross-sectional view of a transistor in accordance with some alternative embodiments of the disclosure.

In some embodiments, the first nanosheet 210a is separated from the second nanosheet 212a. However, the disclosure is not limited thereto. In some alternative embodiments, as shown in FIG. 6, the first nanosheet 210a is physically contact with the second nanosheet 212a. In such embodiments, the gate dielectric layer 406 continuously surrounds the first nanosheet 210a and the second nanosheet 212a connected thereto, and the barrier layer 402 continuously surrounds the first nanosheets 210a and the second nanosheets 212a connected thereto.

Figure 7:
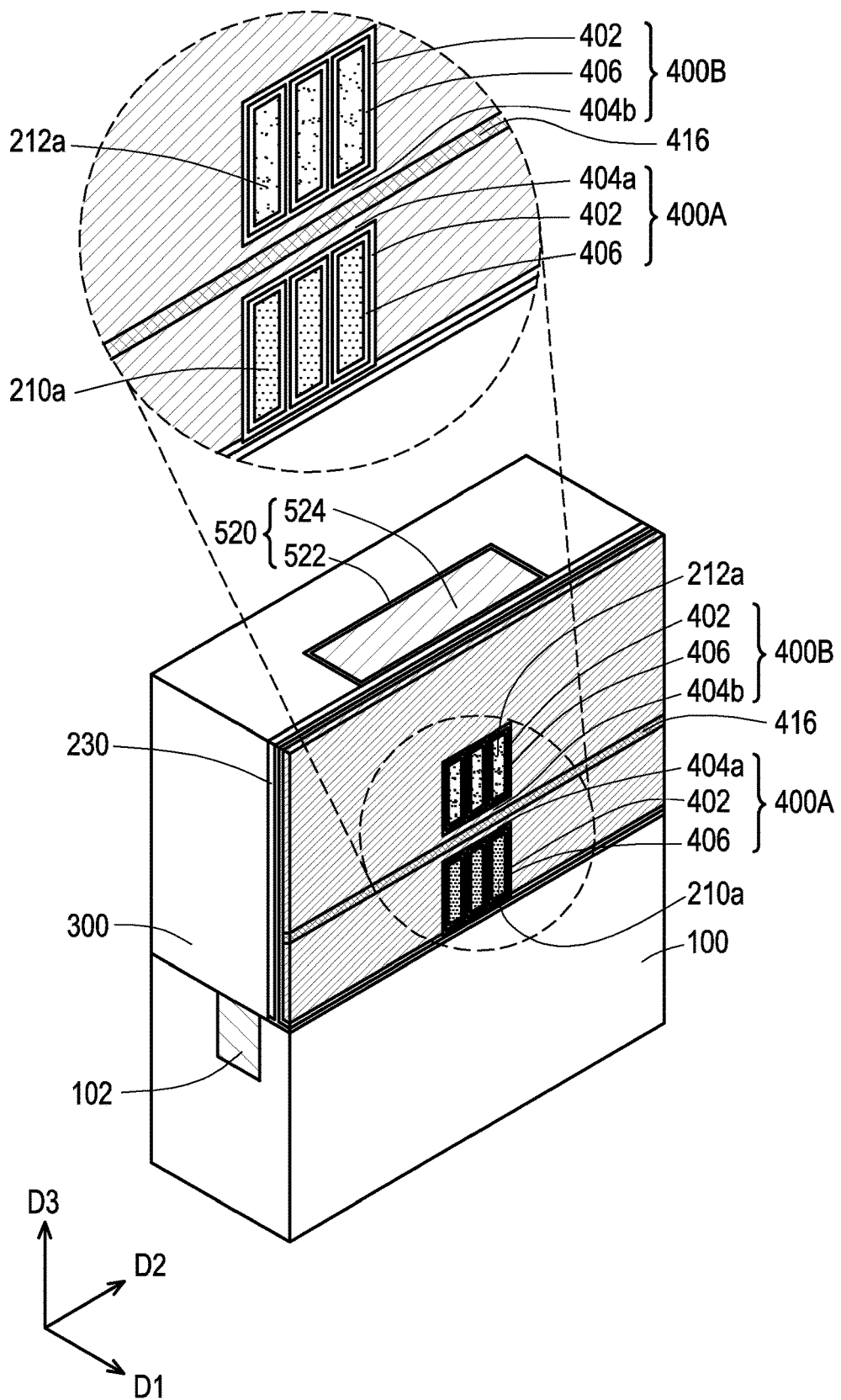
FIG. 7 is a cross-sectional view of a transistor in accordance with some alternative embodiments of the disclosure.

In some embodiments, the gate structure 400 serves as a common gate for the first conductive type transistor T21 and the second conductive type transistor T22. However, the disclosure is not limited thereto. For example, as shown in FIG. 7, the first gate structure 400A is formed to wrap around the first nanosheets 210a, and the second gate structure 400B electrically isolated from the first gate structure 400A is formed to wrap around the second nanosheets 212a. In some embodiments, the first gate structure 400A and the second nanosheets 212a are electrically isolated by an insulating layer 416 therebetween. The formation of the first gate structure 400A and the second gate structure 400B are similar to those in FIG. 3A to FIG. 3D-1.

Figure 8:
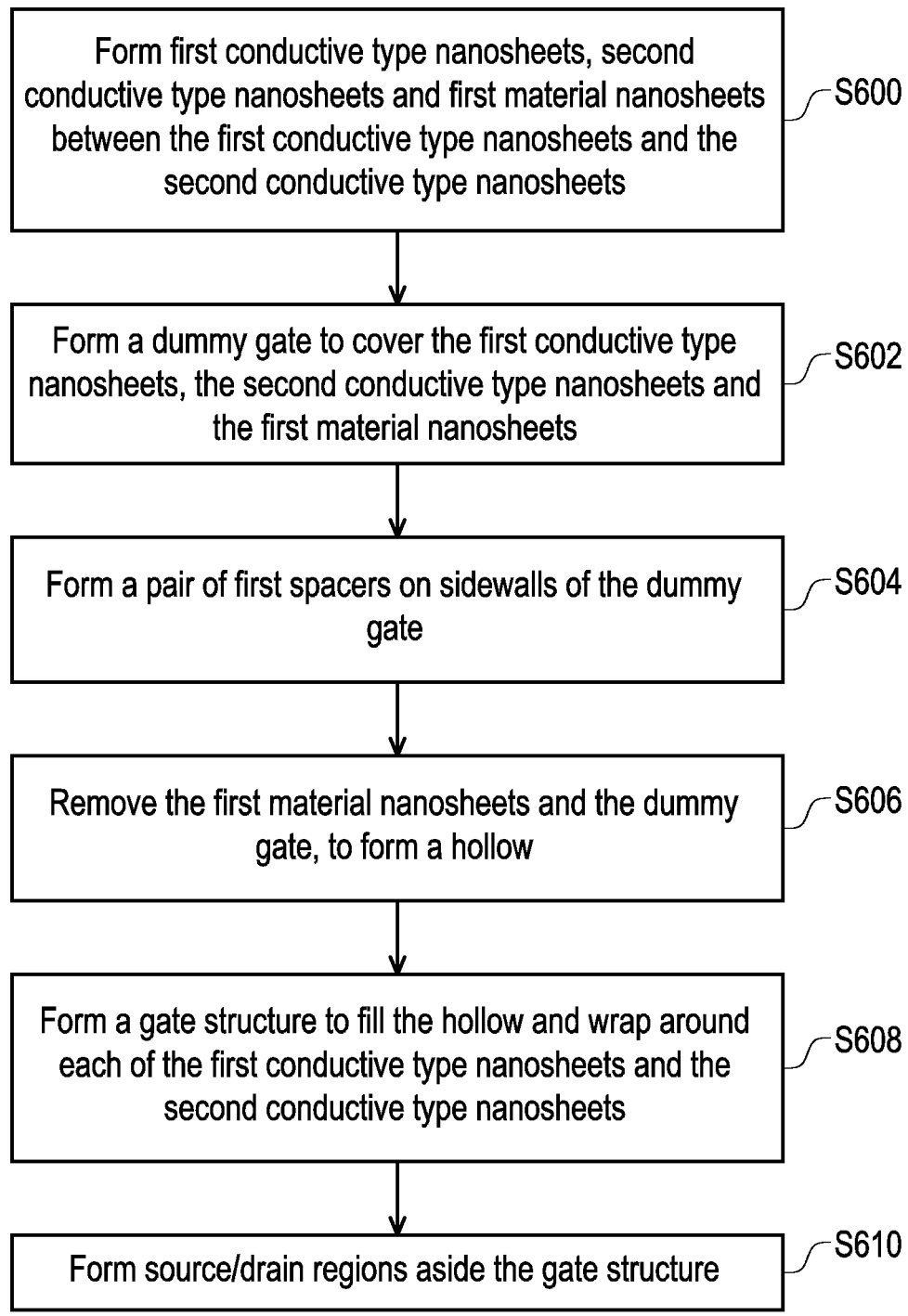
FIG. 8 illustrates a manufacturing method of a transistor in accordance with some embodiments.

FIG. 8 illustrates a manufacturing method of a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 5600, first conductive type nanosheets, second conductive type nanosheets and first material nanosheets between the first conductive type nanosheets and the second conductive type nanosheets are formed. FIG. 2A to FIG. 2C, FIG. 3A-1 and FIG. 4A to FIG. 4C-1 illustrate a view corresponding to some embodiments of act 5600.

At act 5602, a dummy gate is formed to cover the first conductive type nanosheets, the second conductive type nanosheets and the first material nanosheets. FIG. 2D to FIG. 2F-1, FIG. 4C and FIG. 4C-1 illustrate a view corresponding to some embodiments of act 5602.

At act 5604, a pair of first spacers on sidewalls of the dummy gate. FIG. 2G to FIG. 2H-1 and FIG. 4D to FIG. 4E-2 illustrate a view corresponding to some embodiments of act 5604.

At act 5606, the first material nanosheets and the dummy gate are removed, to form a hollow. FIG. 2I to FIG. 2I-2 and FIG. 4F to FIG. 4G-2 illustrate views corresponding to some embodiments of act 5606.

At act 5608, a gate structure is formed to fill the hollow and wrap around each of the first conductive type nanosheets and the second conductive type nanosheets. FIG. 2J to FIG.

2J-2, FIG. 3A to FIG. 3C-2 and FIG. 4H to FIG. 4J-2 illustrate views corresponding to some embodiments of act 5608.

At act 5610, source/drain regions are formed aside the gate structure. FIG. 2K to FIG. 2L-1, FIG. 3D, FIG. 3D-1 and FIG. 4K to FIG. 4K-2 illustrate views corresponding to some embodiments of act 5610.

In accordance with some embodiments of the disclosure, a transistor includes a first conductive type channel layer, a second conductive type channel layer, a gate structure, first source/drain regions and second source/drain regions. The first conductive type channel layer includes a plurality of first nanosheets. The second conductive type channel layer includes a plurality of second nanosheets stacked over the first nanosheets. The gate structure wraps around each of the first nanosheets and the second nanosheets. The first source/drain regions are disposed on opposite sides of the first nanosheets. The second source/drain regions are disposed on opposite sides of the second nanosheets and electrically isolated from the first source/drain regions.

In accordance with some embodiments of the disclosure, a transistor includes a plurality of first nanosheets, a plurality of second nanosheets, a gate structure, plural pairs of spacers and source/drain regions. The first nanosheets are stacked vertically and include a first conductive type oxide semiconductor. The second nanosheets are stacked vertically over the first nanosheets and include a second conductive type oxide semiconductor. The gate structure wraps around each of the first nanosheets and the second nanosheets. The spacers are disposed at opposite sidewalls of the gate structure, wherein outer sidewalls of the spacer are substantially flush with outer sidewalls of the first nanosheets and the second nanosheets. The first source/drain regions are disposed aside the first nanosheets. The second source/drain regions are disposed aside the second nanosheets and the gate structure and electrically isolated from the first source/drain regions.

In accordance with some embodiments of the disclosure, a manufacturing method of a transistor includes at least the following steps. First conductive type nanosheets, second conductive type nanosheets and first material nanosheets between the first conductive type nanosheets and the second conductive type nanosheets are formed. A dummy gate is formed to cover the first conductive type nanosheets, the second conductive type nanosheets and the first material nanosheets. A pair of first spacers is formed on sidewalls of the dummy gate. The first material nanosheets and the dummy gate are removed, to form a hollow. A gate structure is formed to fill the hollow and wrap around each of the first conductive type nanosheets and the second conductive type nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
   a first conductive type channel layer, comprising a plurality of first nanosheets;
   a second conductive type channel layer, comprising a plurality of second nanosheets stacked over the first nanosheets in a first direction, wherein the first nanosheets are arranged adjacent to each other in a second direction substantially perpendicular to the first direction, and the second nanosheets are arranged adjacent to each other in the second direction over the first nanosheets;
   a gate structure comprising a conductive layer, wrapping around each of the first nanosheets and the second nanosheets, wherein the conductive layer is continuously disposed within a space between the first nanosheets and the second nanosheets;
   first source/drain regions disposed on opposite sides of the first nanosheets; and
   second source/drain regions disposed on opposite sides of the second nanosheets and electrically isolated from the first source/drain regions.

2. The transistor of claim 1, wherein the first nanosheets are overlapping with the second nanosheets in the first direction.

3. The transistor of claim 1, wherein sidewalls of the first nanosheets are substantially flush with sidewalls of the second nanosheets in the first direction.

4. The transistor of claim 1, wherein the gate structure further comprises a gate dielectric layer, and the gate dielectric layer is disposed between the conductive layer and each of the first nanosheets and the second nanosheets.

5. The transistor of claim 4, further comprising a barrier layer between the gate dielectric layer and the conductive layer, wherein a first portion of the barrier layer continuously surrounds the first nanosheets and a second portion of the barrier layer continuously surrounds the second nanosheets.

6. The transistor of claim 1, wherein the conductive layer comprises a first conductive layer and a second conductive layer, the first conductive layer is continuously disposed within a first portion of the space between the first nanosheets and the second nanosheets and wraps around each of the first nanosheets, and the second conductive layer is continuously disposed within a second portion over the first portion of the space between the first nanosheets and the second nanosheets and wraps around each of the second nanosheets.

7. The transistor of claim 6, further comprising an insulating layer disposed within a third portion of the space between the first nanosheets and the second nanosheets, the third portion being between the first portion and the second portion, the insulating layer disposed between the first conductive layer and the second conductive layer.

8. The transistor of claim 1, wherein the conductive layer wraps around an entirety of a first perimeter defined by the first nanosheets and an entirety of a second perimeter defined by the second nanosheets.

9. The transistor of claim 1, wherein the conductive layer comprises a first conductive layer, a second conductive layer and an insulating layer between the first and second conductive layers, the first conductive layer wraps around an entirety of a first perimeter defined by the first nanosheets, and the second conductive layer wraps around an entirety of a second perimeter defined by the second nanosheets.

10. A transistor, comprising:
    a plurality of first nanosheets, stacked vertically and comprising a first conductive type oxide semiconductor;

a plurality of second nanosheets, stacked vertically over the first nanosheets and comprising a second conductive type oxide semiconductor;

first and second gate structures, wrapping around each of the first nanosheets and the second nanosheets respectively;

plural pairs of first and second spacers, at opposite sidewalls of the first and second gate structures;

a dielectric nanosheet between the first nanosheets and the second nanosheets, wherein the dielectric nanosheet directly contacts one pair of the first spacers and the first gate structure between the one pair of the first spacers, and the dielectric nanosheet comprises a dielectric material different from the first conductive type oxide semiconductor and the second conductive type oxide semiconductor;

first source/drain regions disposed aside the first nanosheets; and second source/drain regions disposed aside the second nanosheets and electrically isolated from the first source/drain regions.

11. The transistor of claim 10, wherein the first and second gate structures respectively comprise a conductive layer and a gate dielectric layer.

12. The transistor of claim 10, further comprising an insulating layer between the first source/drain regions and the second source/drain regions.

13. The transistor of claim 12, wherein a surface of the insulating layer is substantially coplanar with a surface of the dielectric nanosheet.

14. The transistor of claim 10, further comprising a substrate having a surface, wherein the first nanosheets and the second nanosheets are stacked on the surface of the substrate.

15. The transistor of claim 14, wherein the dielectric nanosheet is disposed between and overlapping with the first nanosheets and the second nanosheets in a direction substantially perpendicular to the surface of the substrate.

16. The transistor of claim 10, wherein a first surface of the dielectric nanosheet is substantially coplanar with surfaces of the first source/drain regions and a second surface opposite to the first surface of the dielectric nanosheet is substantially coplanar with surfaces of the second source/drain regions.

17. A transistor, comprising:

a first conductive type channel layer, comprising a plurality of first nanosheets;

a second conductive type channel layer, comprising a plurality of second nanosheets stacked over the first nanosheets in a first direction, wherein the first nanosheets are arranged adjacent to each other in a second direction substantially perpendicular to the first direction, and the second nanosheets are arranged adjacent to each other in the second direction over the first nanosheets;

a gate structure comprising a gate dielectric layer, a barrier layer and a conductive layer, wrapping around each of the first nanosheets and the second nanosheets, wherein the barrier layer is disposed between the gate dielectric layer and the conductive layer, and the barrier layer is continuously disposed within a space between the first nanosheets and the second nanosheets and surrounds the first nanosheets and the gate dielectric layer surrounding the first nanosheets;

first source/drain regions disposed on opposite sides of the first nanosheets; and second source/drain regions disposed on opposite sides of the second nanosheets and electrically isolated from the first source/drain regions.

18. The transistor of claim 17, wherein the barrier layer wraps around an entirety of a first perimeter defined by the first nanosheets and an entirety of a second perimeter defined by the second nanosheets.

19. The transistor of claim 17, wherein the barrier layer comprises a first barrier layer and a second barrier layer separated from each other, the first barrier layer wraps around an entirety of a first perimeter defined by the first nanosheets, and the second barrier layer wraps around an entirety of a second perimeter defined by the second nanosheets.

20. The transistor of claim 17, wherein the gate dielectric layer continuously wraps around each first nanosheet of the plurality of first nanosheets and each second nanosheet of the plurality of second nanosheets.

* * * * *